(12) United States Patent
Tsuruda et al.

(10) Patent No.: US 11,894,494 B2
(45) Date of Patent: Feb. 6, 2024

(54) TERAHERTZ DEVICE AND PRODUCTION METHOD FOR TERAHERTZ DEVICE

(71) Applicant: ROHM CO., LTD., Kyoto (JP)

(72) Inventors: Kazuisao Tsuruda, Kyoto (JP); Jaeyoung Kim, Kyoto (JP); Hideaki Yanagida, Kyoto (JP); Toshikazu Mukai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 528 days.

(21) Appl. No.: 17/266,008

(22) PCT Filed: Jul. 26, 2019

(86) PCT No.: PCT/JP2019/029473
§ 371 (c)(1),
(2) Date: Feb. 4, 2021

(87) PCT Pub. No.: WO2020/039848
PCT Pub. Date: Feb. 27, 2020

(65) Prior Publication Data
US 2021/0167254 A1    Jun. 3, 2021

(30) Foreign Application Priority Data

Aug. 23, 2018 (JP) ................. 2018-156037

(51) Int. Cl.
*H01L 33/48* (2010.01)
*H01L 33/52* (2010.01)
(Continued)

(52) U.S. Cl.
CPC ............ *H01L 33/483* (2013.01); *H01L 33/52* (2013.01); *H01L 33/60* (2013.01); *H01L 33/62* (2013.01);
(Continued)

(58) Field of Classification Search
CPC ........ H01L 33/483; H01L 33/52; H01L 33/60; H01L 33/62; H01L 2933/0016; H01L 2933/005
(Continued)

(56) References Cited

U.S. PATENT DOCUMENTS 6,909,104 B1 * 6/2005 Koops ................ H01J 3/021
250/493.1
2018/0066981 A1    3/2018 Mukai et al.

FOREIGN PATENT DOCUMENTS

CN     106024821 A     10/2016
JP     2009-80448 A     4/2009
(Continued)

OTHER PUBLICATIONS

International Search Report issued in PCT/JP2019/029473, dated Oct. 1, 2019 (1 page).

(Continued)

*Primary Examiner* — Quoc D Hoang
(74) *Attorney, Agent, or Firm* — Hamre, Schumann, Mueller & Larson, P.C.

(57) ABSTRACT

A terahertz device includes a terahertz element, a sealing resin, a wiring layer and a frame-shaped member. The terahertz element that performs conversion between terahertz waves and electric energy. The terahertz element has an element front surface and an element back surface spaced apart from each other in a first direction. The sealing resin covers the terahertz element. The wiring layer is electrically connected to the terahertz element. A frame-shaped member is made of a conductive material and arranged around the terahertz element as viewed in the first direction. The frame-shaped member has a reflective surface capable of reflecting the terahertz waves.

20 Claims, 68 Drawing Sheets

(51) Int. Cl.
*H01L 33/60* (2010.01)
*H01L 33/62* (2010.01)

(52) U.S. Cl.
CPC .............................. *H01L 2933/005* (2013.01);
*H01L 2933/0016* (2013.01)

(58) Field of Classification Search
USPC .......................................................... 257/98
See application file for complete search history.

(56) References Cited

FOREIGN PATENT DOCUMENTS

| | | |
|---|---|---|
| JP | 2015-187716 A | 10/2015 |
| JP | 2016-111542 A | 6/2016 |
| WO | 2018/116974 A1 | 6/2018 |

OTHER PUBLICATIONS

Office Action received in the corresponding Chinese Patent application, dated Jun. 7, 2023, and machine translation (14 pages).

* cited by examiner

TERAHERTZ DEVICE AND PRODUCTION METHOD FOR TERAHERTZ DEVICE

TECHNICAL FIELD

The present disclosure relates to a terahertz device and a method for manufacturing a terahertz device.

BACKGROUND ART

With recent miniaturization of electronic devices such as transistors to reduce their sizes to nano-scale, a phenomenon called quantum effect has become often observed. Ultra-high-speed devices or new-function devices that use such quantum effect are being developed. Under such circumstances, attempts are being made in particular to use the frequency range of 0.1 to 10 THz, called a terahertz band, to perform high-capacity communication, information processing, imaging or measurement, for example. This frequency range has the characteristics of both light and radio waves, and devices that operate in this frequency range, if realized, can be utilized for various applications including imaging, high-capacity communication or information processing described above as well as measurement in various fields such as physical properties, astronomy or biology.

As an element that radiates high-frequency electromagnetic waves with frequencies in the terahertz band, an element is known that has a resonant tunneling diode (RTD) and a fine slot antenna integrated therein.

Patent Document 1: JP-A-2009-80448

SUMMARY

Problems to be Solved by the Present Disclosure

An object of the present disclosure is to provide a terahertz device with a packaging structure suitable for modularization of a terahertz element.

Means for Solving the Problems

According to a first aspect of the present disclosure, there is provided a terahertz device comprising: a terahertz element configured to perform conversion between terahertz waves and electric energy and having an element front surface and an element back surface spaced apart from each other in a first direction; a sealing resin covering the terahertz element; a wiring layer electrically connected to the terahertz element; and a frame-shaped member made of a conductive material and arranged around the terahertz element as viewed in the first direction, where the frame-shaped member has a reflective surface capable of reflecting the terahertz waves.

Advantages of the Present Disclosure

According to a second aspect of the present disclosure, there is provided a method for manufacturing a terahertz device that comprises a terahertz element configured to perform conversion between terahertz waves and electric energy and having an element front surface and an element back surface spaced apart from each other in a first direction. The method comprises: a support board preparation step for preparing a support board having a support-board front surface and a support-board back surface facing away from each other in the first direction; a frame-shaped member forming step for forming a frame-shaped member from a conductive material on the support board; a wiring layer forming step for forming a wiring layer electrically connected to the terahertz element; an element mounting step for mounting the terahertz element on the support board such that the frame-shaped member is positioned around the terahertz element as viewed in the first direction; a sealing resin forming step for forming a sealing resin covering the terahertz element; and a grinding step for grinding the support board, where the frame-shaped member has a reflective surface capable of reflecting the terahertz waves.

Effects of the Invention

The terahertz device according to the present disclosure has a packaging structure that allows for modularization of a terahertz element. Also the method for manufacturing a terahertz device according to the present disclosure makes it possible to manufacture a terahertz element with a packaging structure that allows for modularization of a terahertz element.

EMBODIMENTS

Preferred embodiments of a terahertz device and a method for manufacturing a terahertz device according to the present disclosure are described below with reference to the accompanying drawings.

Figure 1:
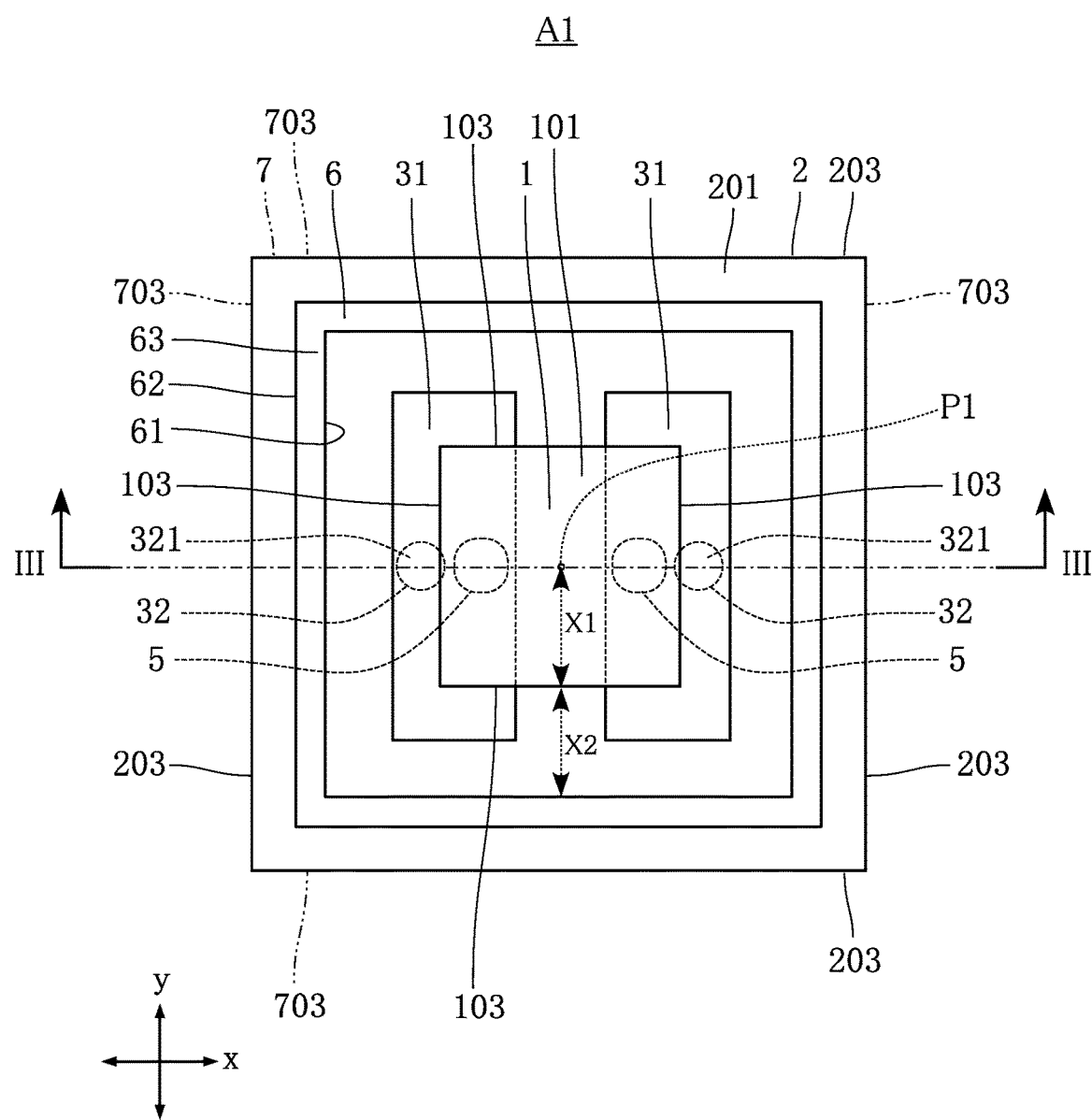
FIG. 1 is a plan view of a terahertz device according to a first embodiment.
Figure 2:
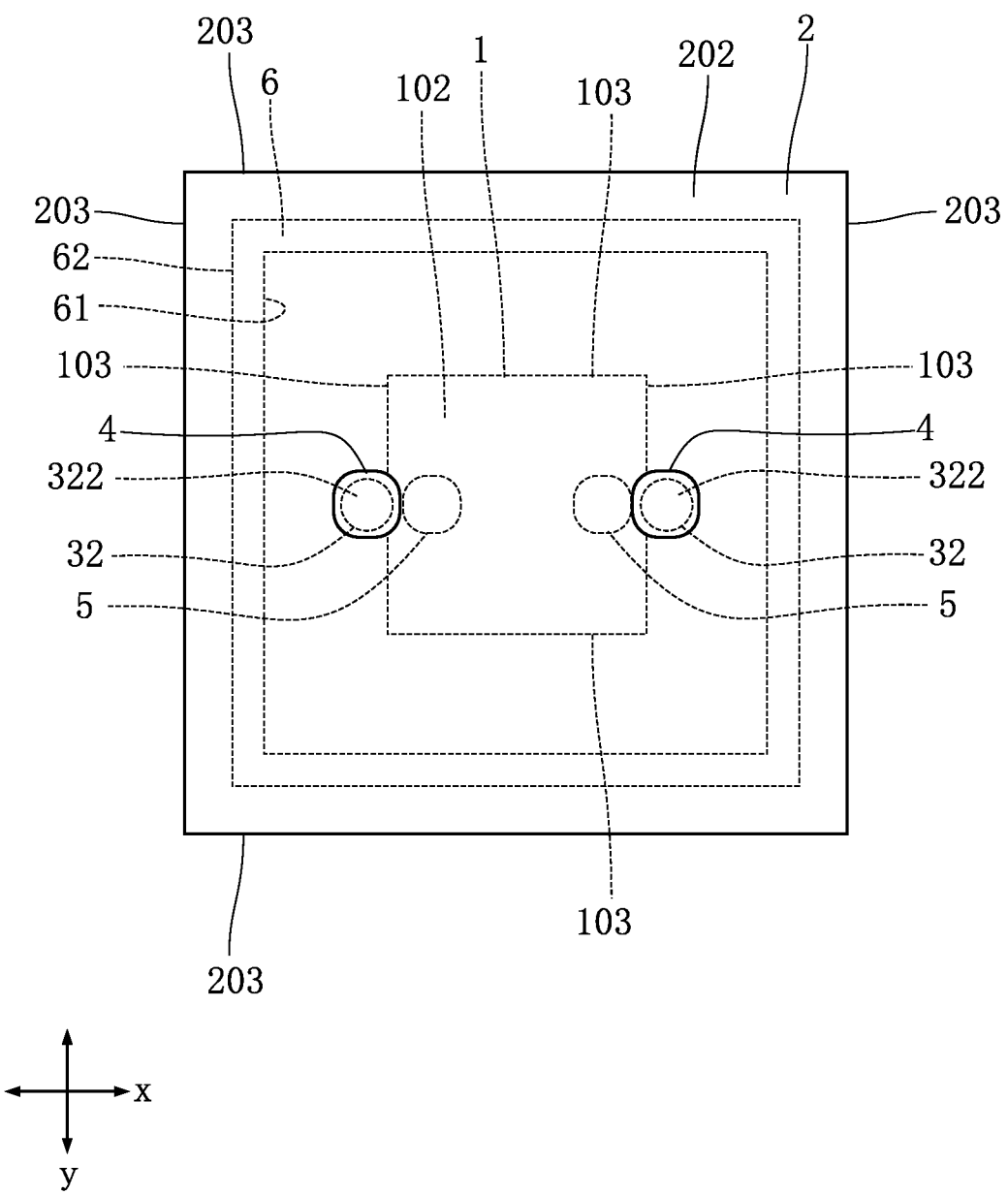
FIG. 2 is a bottom view of the terahertz device according to the first embodiment.
Figure 3:
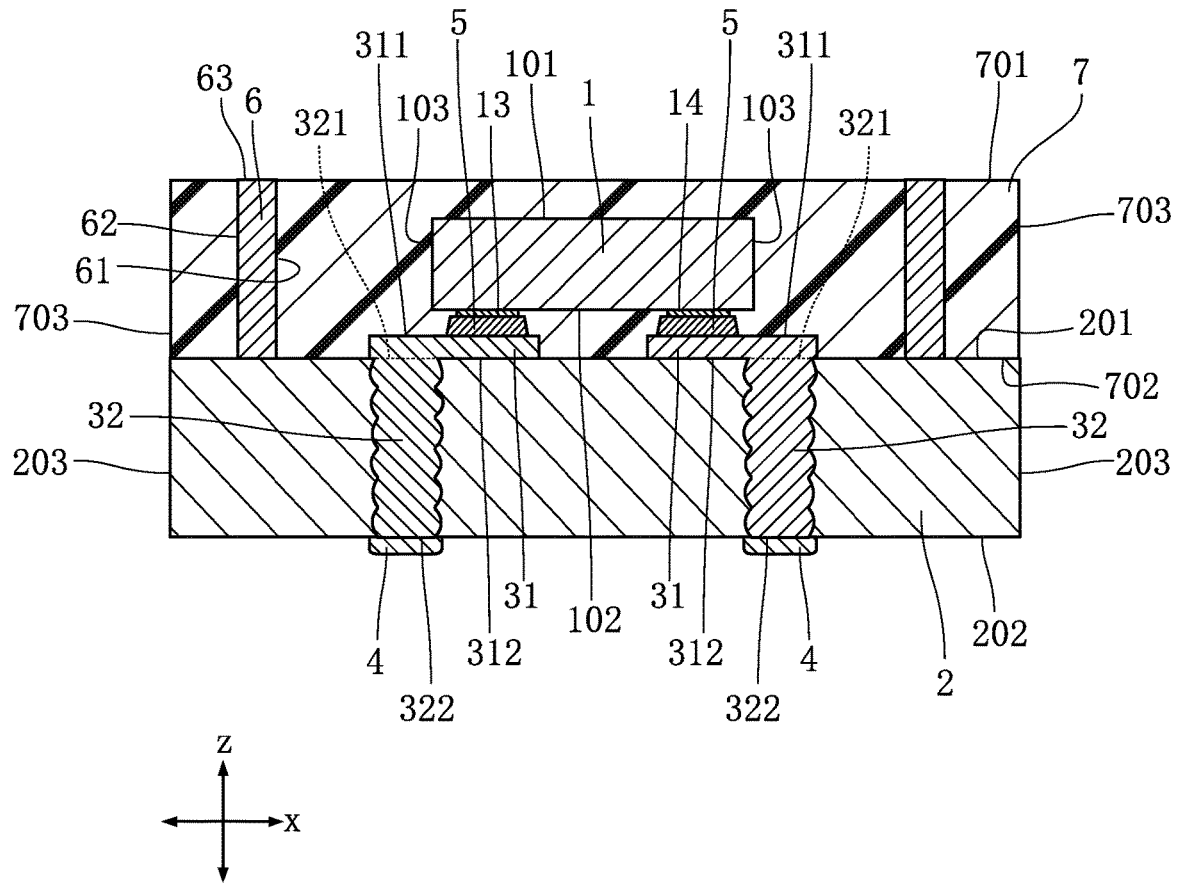
FIG. 3 is a sectional view taken along line III-III in FIG. 1.

FIGS. 1-3 show a terahertz device A1 according to a first embodiment of the present disclosure. As shown in these figures, the terahertz device A1 of the first embodiment includes a terahertz element 1, a support board 2, internal electrodes 3, external electrodes 4, bonding layers 5, a frame-shaped member 6 and a sealing resin 7. Each internal electrode 3 includes a wiring layer 31 and a through electrode 32.

FIG. 1 is a plan view of the terahertz device A1. In FIG. 1, the sealing resin 7 is indicated by imaginary lines (dash-double-dot lines). FIG. 2 is a bottom view of the terahertz device A1. FIG. 3 is a sectional view taken along line III-III in FIG. 1. For the convenience of understanding, the three directions that are orthogonal to each other are defined as x direction, y direction and z direction, respectively. The z direction is the thickness direction of the terahertz device A1. The x direction is the horizontal direction in plan view (see FIG. 1) of the terahertz device A1. The y direction is the vertical direction in plan view (see FIG. 1) of the terahertz device A1. For the convenience of understanding, one sense of the z direction (e.g. the upper side in FIG. 3) may be referred to as "upper", while the other sense of the z direction (e.g. the lower side in FIG. 3) may be referred to as "lower", but such description is not meant to limit the posture of the terahertz device A1 in use or in other conditions.

The terahertz element 1 is an element that performs conversion between electromagnetic waves in the terahertz band and electric energy. Herein, the electromagnetic wave includes either or both of light and radio waves. The terahertz element 1 converts the inputted electric energy into electromagnetic waves in the terahertz band to radiate terahertz waves. Or conversely, the terahertz element 1 may receive terahertz waves and convert the received terahertz waves into electric energy. The terahertz element 1 may both radiate and receive terahertz waves. The terahertz element 1 is rectangular as viewed in the z direction (hereinafter also referred to as "as viewed in plan"). The shape of the terahertz element 1 as viewed in plan is not limited to a rectangle and may be a circle, an oval or a polygon. The terahertz element 1 is of a type for mounting by flip-chip bonding. The dimension of the terahertz element 1 in the z direction is determined in accordance with the frequency of the terahertz waves to be radiated. Specifically, the dimension of the terahertz element 1 in the z direction is an integral multiple of one half the wavelength λ of the terahertz waves (i.e., λ/2). At the interface between an element substrate 11 and air, free-end reflection of terahertz waves occurs. Accordingly, setting the dimension of the terahertz element 1 in the z direction as described above can cause standing waves with a constant phase to be excited within the terahertz element 1. Note that the dimension of the terahertz element 1 in the z direction is made smaller for providing terahertz waves with higher frequencies and made larger for providing terahertz waves with lower frequencies.

The terahertz element 1 has an element front surface 101, an element back surface 102 and a plurality of element side surfaces 103. The element front surface 101 and the element back surface 102 are spaced apart and face away from each other in the z direction. The electrodes of the terahertz element 1 (portions of the first conductive layer 13 and second conductive layer 14 described later) are exposed from the element back surface 102. Each of the element side surfaces 103 is located between and connected to the element front surface 101 and the element back surface 102. Each element side surface 103 is connected to the element front surface 101 at one edge in the z direction (upper edge in FIG. 3) and connected to the element back surface 102 at the other edge in the z direction (lower edge in FIG. 3). Since the terahertz element 1 is rectangular as viewed in plan, it has four element side surfaces 103, i.e. a pair of element side surfaces 103 spaced apart and facing away from each other in the x direction and a pair of element side surfaces 103 spaced apart and facing away from each other in the y direction. The element front surface 101 of the terahertz element 1 is an active surface, and radiation (and/or reception) of terahertz waves is performed in proximity to the active surface.

In the present embodiment, the radiation point of the terahertz waves in the terahertz element 1 is the center position P1 (see FIG. 1) of the terahertz element 1 as viewed in plan. Herein, the vertical distance x1 between each element side surface 103 and the radiation point (the center position P1) is represented as $x1=(\lambda'_{InP}/2)+((\lambda'_{InP}/2)\times N)$ (where N is an integer greater than or equal to 0: N=0, 1, 2, 3, . . . ). Here, $\lambda'_{InP}$ is the effective wavelength of the terahertz waves propagating within the terahertz element 1. $\lambda'_{InP}$ is obtained by $\lambda'_{InP}=(1/n1)\times(c/f_c)$ where n1 is the index of refraction of the terahertz element 1 (the element substrate 11 described later), c is the speed of light, and $f_c$ is the center frequency of terahertz waves. By setting the vertical distance x1 as described above, free-end reflection of the terahertz waves radiated from the terahertz element 1 occurs at each element side surface 103. In this way, the terahertz element 1 itself is designed as a resonator (primary resonator) of the terahertz device A1. The vertical distances x1 from the respective element side surfaces 103 to the radiation point of the terahertz waves may differ from each other, supposing that each vertical distance x1 has a value obtained by the above-described formula. Accordingly, the radiation point of the terahertz waves is not limited to the center position P1 as viewed in plan.

Figure 4:
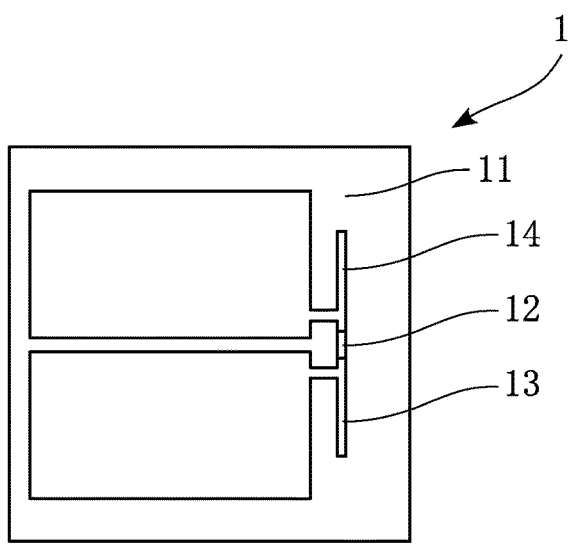
FIG. 4 is a schematic view showing an example of a pattern of the terahertz element as viewed in plan.
Figure 5:
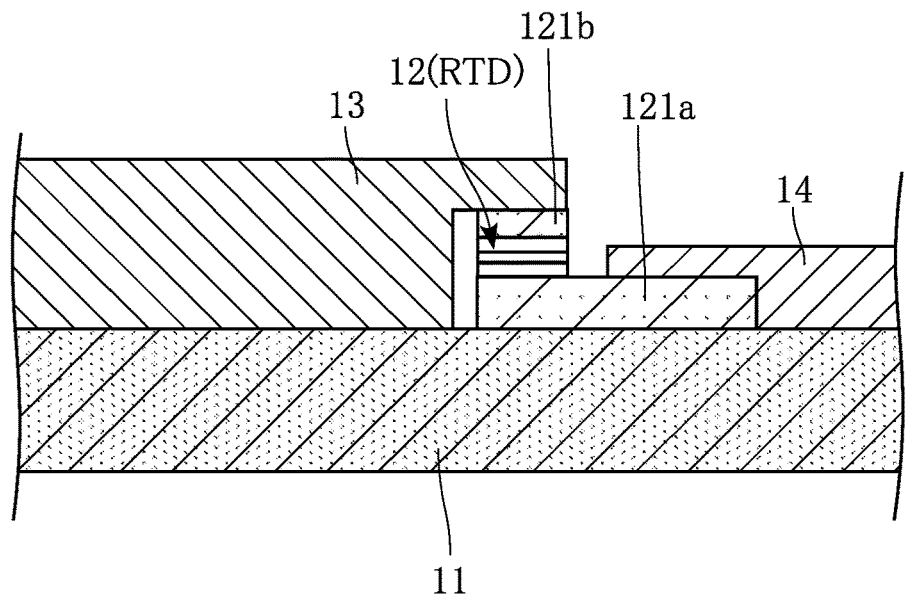
FIG. 5 is a schematic view showing a section of the terahertz element.
Figure 6:
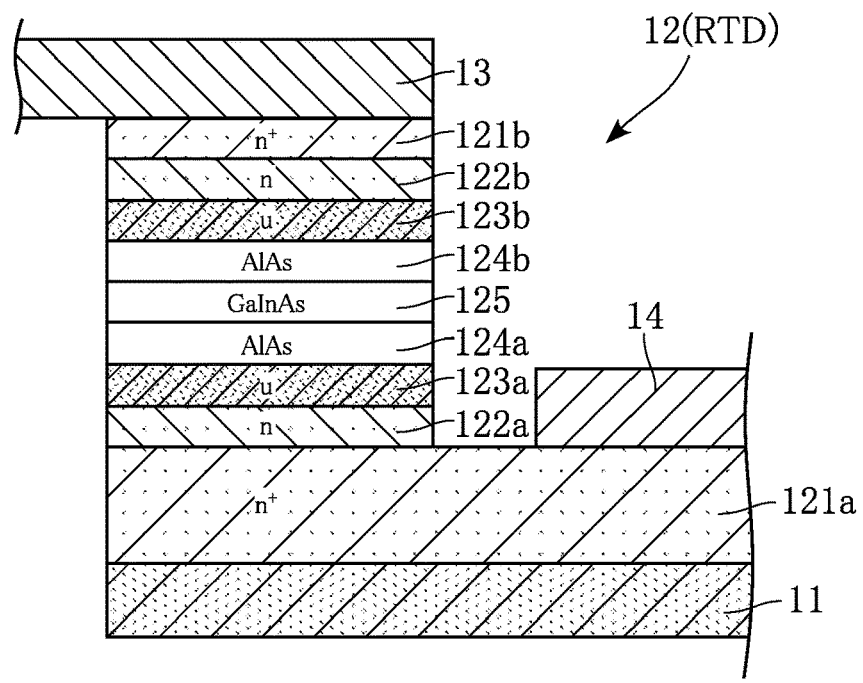
FIG. 6 is an enlarged view showing a part of FIG. 5.

FIGS. 4-6 show an example of detailed configuration of the terahertz element 1. FIG. 4 is a schematic view showing an example of a pattern of the terahertz element 1 as viewed in plan. FIG. 5 is a schematic view showing a section of the terahertz element 1. FIG. 6 is an enlarged view showing a part of FIG. 5. The terahertz element 1 includes an element substrate 11, an active element 12, a first conductive layer 13 and a second conductive layer 14.

The element substrate 11 is made of a semiconductor and is semi-insulating. For example, the element substrate 11 may be made of InP (indium phosphide) but may be made of other semiconductors. The element substrate 11, when made of InP, has an index of refraction (absolute index of refraction) of about 3.4.

The active element 12 performs conversion between electromagnetic waves in the terahertz band and electric energy. The active element 12 is typically an RTD. The active element 12 may be a diode other than an RTD or a transistor. Examples of the active element 12 include a tunnel transit time (TUNNETT) diode, an impact ionization avalanche transit time (IMPATT) diode, a GaAs-based field effect transistor (FET), a GaN-based FET, a high electron mobility transistor (HEMT), and a heterojunction bipolar transistor (HBT). The active element 12 is formed on the element substrate 11. The active element 12 is electrically connected to the first conductive layer 13 and the second conductive layer 14.

One implementation of the active element 12 is described below with reference to FIG. 6. As shown in the figure, a GaInAs layer 122a is disposed on a semiconductor layer 121a (made of e.g., GaInAs) and doped with an n-type impurity. A GaInAs layer 123a is disposed on the GaInAs layer 122a and undoped. An AlAs layer 124a is disposed on a GaInAs layer 123a, an InGaAs layer 125 is disposed on the AlAs layer 124a, and an AlAs layer 124b is on the InGaAs layer 125. The AlAs layer 124a, the InGaAs layer 125 and the AlAs layer 124b provide an RTD unit. A GaInAs layer 123b is disposed on the AlAs layer 124b and undoped. A GaInAs layer 122b is disposed on the GaInAs layer 123b and doped with an n-type impurity. A GaInAs layer 121b is disposed on the GaInAs layer 122b and doped with an n-type impurity at a high concentration. The first conductive layer 13 is on the GaInAs layer 121b.

Though not illustrated, unlike the configuration shown in FIG. 6, a GaInAs layer doped with an n-type impurity at a high concentration may be interposed between the GaInAs layer 121b and the first conductive layer 13. Such a configuration can enhance the contact between the first conductive layer 13 and the GaInAs layer 121b. Note that the active element 12 may have any other configuration as long as it allows for radiation (and/or reception) of terahertz waves.

The first conductive layer 13 and the second conductive layer 14 are formed on the element substrate 11. The first conductive layer 13 and the second conductive layer 14 are insulated from each other. Each of the first conductive layer 13 and the second conductive layer 14 is a laminate of metal layers. For example, each of the first conductive layer 13 and the second conductive layer 14 may be a laminate of Au (gold), Pd (palladium) and Ti (titanium). Alternatively, each of the first conductive layer 13 and the second conductive layer 14 may be a laminate of Au and Ti. The first conductive layer 13 and the second conductive layer 14 may be formed by vacuum deposition or sputtering, for example. The first conductive layer 13 and the second conductive layer 14 are exposed from the element back surface 102. In the terahertz element 1, portions of the first conductive layer 13 and the second conductive layer 14 provide an antenna integrated on the element front surface 101. In the present embodiment, portions of the first conductive layer 13 and the second conductive layer 14 form a dipole antenna, as shown in FIG. 4. Note that the antenna is not limited to a dipole antenna and may be other types of antenna such as a slot antenna, a bow tie antenna or a ring antenna.

The configuration of the terahertz element 1 is not limited to that described above. For example, a back-surface reflective metal layer may be disposed on the opposite side of the element substrate 11 from the active element 12. In this case, the electromagnetic waves (terahertz waves) radiated from the active element 12 are reflected by the back-surface reflective metal layer to form a surface-emission radiation pattern perpendicular to the element substrate 11 (the z direction). When such a back-surface reflective metal layer is present, fixed-end reflection of terahertz waves occurs at the interface between the element substrate 11 and the back-surface reflective metal layer, producing a phase shift of π. Thus, with such a configuration, the dimension of the terahertz element 1 in the z direction may be set to $(\lambda/4)+($an integral multiple of $\lambda/2)$, where $\lambda$ is the wavelength of the terahertz waves.

The support board 2 is a support member on which the terahertz element 1 is mounted to thereby form the base of the terahertz device A1. The support board 2 is made of an insulating material. The support board 2 may be made of an intrinsic semiconductor such as single-crystal silicon (Si). The support board 2 may be rectangular as viewed in plan. The dimension of the support board 2 in the z direction may be about 50 to 200 µm, for example.

The support board 2 has a support-board front surface 201, a support-board back surface 202 and a plurality of support-board side surfaces. The support-board front surface 201 and the support-board back surface 202 are spaced apart and face away from each other in the z direction. Each of the support-board side surfaces 203 is located between and connected to the support-board front surface 201 and the support-board back surface 202. Each support-board side surface 203 is connected to the support-board front surface 201 at one edge in the z direction (upper edge in FIG. 3) and connected to the support-board back surface 202 at the other edge in the z direction (lower edge in FIG. 3). The support board 2 has four support-board side surfaces 203, i.e. a pair of support-board side surfaces 203 spaced apart and facing away from each other in the x direction and a pair of support-board side surfaces 203 spaced apart and facing away from each other in the y direction.

The support board 2 is formed with through-holes 21. The through-holes 21 penetrate from the support-board front surface 201 to the support-board back surface 202 in the z direction. The through-holes 21 are filled with through electrodes 32. The through-holes 21 may be formed by reactive ion etching (RIE) and particularly by a technique called Bosch process. Thus, the inner wall of each through-hole 21 has a stepped profile with so-called scallop.

The internal electrodes 3 are disposed inside the terahertz device A1 and electrically connect the terahertz element 1 and the external electrodes 4. Each internal electrode 3 includes a wiring layer 31 and a through electrode 32.

As shown in FIG. 3, the wiring layers 31 are formed on the support board 2 and electrically connected to the terahertz element 1. As shown in FIG. 3, the wiring layers 31 are formed on the support-board front surface 201. Each of the wiring layers 31 may be rectangular, as shown in FIG. 3. The configuration and arrangement of the wiring layers 31 are not limited to those illustrated in the figures, and may be varied as appropriate in accordance with the arrangement of the terahertz element 1, the arrangement of the through electrodes 32 and the arrangement of the external electrodes 4.

Each of the wiring layers 31 has a wiring-layer front surface 311 and a wiring-layer back surface 312. The wiring-layer front surface 311 and the wiring-layer back surface 312 are spaced apart and face away from each other in the z direction. The wiring-layer front surface 311 faces in the direction in which the element front surface 101 faces, whereas the wiring-layer back surface 312 faces in the direction in which the element back surface 102 faces.

The through electrodes 32 are formed so as to penetrate the support board 2. The through electrode 32 are formed in the respective through-holes 21 so as to fill the through-holes 21. Since the inner wall of each through-hole 21 has a stepped profile with so-called scallop as described above, the side surface of each through electrode 32 also has a stepped profile. Each through electrode 32 is exposed from the support-board front surface 201 and the support-board back surface 202. Each through electrode 32 is connected to a wiring layer 31 at one end exposed from the support-board front surface 201 and connected to an external electrode 4 at the other end exposed from the support-board back surface 202. In this way, the through electrodes 32 electrically connect the wiring layers 31 and the external electrodes 4.

Each of the through electrodes 32 has a wiring-layer contact surface 321 and an external-electrode contact surface 322. The wiring-layer contact surface 321 is exposed from the support-board front surface 201 and in contact with the wiring layer 31. The wiring-layer contact surface corresponds to the above-described one end exposed from the support-board front surface 201. The external-electrode contact surface 322 is exposed from the support-board back surface 202 and in contact with the external electrode 4. The external-electrode contact surface 322 corresponds to the above-described other end exposed from the support-board back surface 202. Both of the wiring-layer contact surface 321 and the external-electrode contact surface 322 may be generally circular as viewed in plan.

The external electrodes 4 are exposed outside the terahertz device A1 and electrically connected to the internal electrode 3. The external electrodes 4 serve as terminals when the terahertz device A1 is mounted to a circuit board of an electronic device, for example. The external electrodes 4 are formed on the support-board back surface 202 and cover the external-electrode contact surfaces 322 of the through electrodes 32. The external electrodes 4 may be formed by electroless plating. Each external electrode 4 is a laminate of a Ni layer, a Pd layer and a Au layer. The Ni layer is in contact with the external-electrode contact surface 322, and the Au layer is exposed to the outside. The Pd layer is interposed between the Ni layer and the Au layer. The dimension of each external electrode 4 in the z direction may be about 2 to 6 μm, for example. As shown in FIGS. 1 and 3, each external electrode 4 projects outward relative to the external-electrode contact surface 322 by an amount of about 1 to 5 μm, for example, in all directions perpendicular to the z direction. The thickness, material and forming method of the external electrodes 4 are not limited. For example, the above-described laminate may not include a Pd layer. Also, instead of electroless plating, the external electrodes may be formed by pattern formation through photolithography and electrolytic plating or by rewiring process. These techniques make it possible to freely design the size and arrangement of the external electrodes 4 as viewed in plan. Also, in the terahertz device A1, a solder bump may be formed so as to cover each external electrode 4 or may be formed instead of each external electrode 4.

Bonding layers 5 bond and electrically connect the terahertz element 1 to the internal electrode 3 (wiring layer 31). The material for the bonding layers 5 may be solder, for example. The bonding layers are not limited to solder and may be any other bonding material that is electrically conductive. Examples of solder used in the present embodiment include Sn—Pb alloy and lead-free solders such as Sn—Sb alloy or Sn—Ag alloy. Ag paste may be used instead of solder. The bonding layers 5 are interposed between the first conductive layer 13 or the second conductive layer 14 of the terahertz element 1 and the wiring layers 31. The bonding layers 5 are in contact with the first conductive layer 13 or the second conductive layer 14 of the terahertz element 1 and the wiring layers 31 to electrically connect these. Thus, with the bonding layers 5, the terahertz element 1 is fixedly mounted to each wiring layer 31, and electrical connection between the terahertz element 1 and the wiring layers 31 is secured.

The frame-shaped member 6 is arranged around the terahertz element 1 as viewed in plan. The frame-shaped member 6 is arranged on the outer side of the terahertz element 1 and surrounds the terahertz element 1, as viewed in plan. The frame-shaped member 6 may have the shape of a rectangular ring as viewed in plan. Part of the sealing resin 7 is interposed between the frame-shaped member 6 and the terahertz element 1. The frame-shaped member 6 is covered with the sealing resin 7. The frame-shaped member 6 is made of an electrically conductive material. The material for the frame-shaped member 6 may be Cu, for example, but is not limited to this, and any material capable of reflecting terahertz waves may be used. The frame-shaped member 6 is formed on the support board 2 and stands on the support-board front surface 201. The frame-shaped member 6 is spaced apart from the internal electrodes 3. Parts of the frame-shaped member 6 overlap with the wiring layers 31 as viewed in the x direction, while other parts of the frame-shaped member 6 overlap with the wiring layers 31 as viewed in the y direction. As viewed in plan, the frame-shaped member 6 does not overlap the wiring layers 31. The frame-shaped member 6 may be formed by electrolytic plating.

The frame-shaped member 6 has an inner peripheral surface 61, an outer peripheral surface 62 and a top surface 63. The inner peripheral surface 61 is defined by the inner periphery of the frame-shaped member 6 as viewed in plan. The outer peripheral surface 62 is defined by the outer periphery of the frame-shaped member 6 as viewed in plan. The inner peripheral surface 61 faces the element side surfaces 103 of the terahertz element 1. The inner peripheral surface 61 is generally in parallel with each of the element side surfaces 103 of the terahertz element 1. The top surface 63 faces upward in FIG. 3. The top surface 63 is exposed from the sealing resin 7. The frame-shaped member 6 may be formed with a through-hole penetrating from the inner peripheral surface 61 to the outer peripheral surface 62.

In the present embodiment, the distance x2 between each of the element side surfaces 103 and a corresponding part of the inner peripheral surface 61 facing that element side surface is: $x2 = (\lambda'_{Resin}/4) + ((\lambda'_{Resin}/2) \times N)$ (where N is an integer greater than or equal to 0: N=0, 1, 2, 3, . . . ). Here, $\lambda'_{Resin}$ is the effective wavelength of the terahertz waves propagating within the sealing resin 7. $\lambda'_{Resin}$ is obtained by $\lambda'_{Resin} = (1/n2) \times (c/f_c)$ where n2 is the index of refraction of the sealing resin 7, c is the speed of light, and $f_c$ is the center frequency of the terahertz waves. By setting the distance x2 as described above, fixed-end reflection of the terahertz waves radiated from the terahertz element 1 occurs at the inner peripheral surface 61. Thus, the inner peripheral surface 61 of the frame-shaped member 6 serves as a reflective surface that reflects the terahertz waves radiated from the terahertz element 1. In particular, the inner peripheral surface 61 reflects the terahertz waves to produce resonance. In this way, the frame-shaped member 6 serves as a resonator (secondary resonator) that produces resonance of terahertz waves. In the present embodiment, the dimension of the frame-shaped member 6 in the z direction is not particularly limited, but it is desired that the dimension is set so as to make the inner peripheral surface 61 function as a reflective surface. The distance x2 between each element side surface 103 and a corresponding part of the inner peripheral surface 61 facing that element side surface may differ among the pairs of an element side surface and a corresponding part of the inner peripheral surface, supposing that each distance x2 is obtained by the formula described above.

The sealing resin 7 is formed on the support-board front surface 201 and covers the terahertz element 1, the wiring layers 31, the bonding layers 5 and the frame-shaped member 6. The sealing resin 7 is made of an electrically insulating resin material. The resin material is, for example, a black epoxy resin. The index of refraction (absolute index of refraction) of the sealing resin 7 is about 1.55, for example. The index of refraction depends on the material for the sealing resin 7.

The sealing resin 7 has a resin front surface 701, a resin back surface 702 and a plurality of resin side surfaces 703. The resin front surface 701 and the resin back surface 702 are spaced apart and face away from each other in the z direction. The resin front surface 701 faces in the direction in which the element front surface 101 faces, whereas the resin back surface 702 faces in the direction in which the element back surface 102 faces. The resin front surface 701 may be flat or made rougher than the resin back surface 702 by etching, for example. When the resin front surface 701 is a rough surface, the reflectivity at the interface between the resin front surface 701 and the outside air is reduced, which leads to an improved radiation efficiency of terahertz waves. However, since a large surface roughness of the resin front surface 701 influences the radiation pattern of the terahertz waves, it is desirable that the roughness is not larger than ¼ times the wavelength λ of terahertz waves (i.e., not larger than λ/4). The resin back surface 702 is in contact with the support board 2 (support-board front surface 201). Each of the resin side surfaces 703 is located between and connected to the resin front surface 701 and the resin back surface 702. The sealing resin 7 has four resin side surfaces 703, i.e. a pair of resin side surfaces 703 spaced apart and facing away from each other in the x direction and a pair of resin side surfaces 703 spaced apart and facing away from each other in the y direction. The resin side surfaces 703 facing away from each other in the x direction are flush with the support-board side surfaces 203 facing away from each other in the x direction, respectively. The resin side surfaces 703 facing away from each other in the y direction are flush with the support-board side surfaces 203 facing away from each other in the y direction, respectively.

The sealing resin 7 covers the element front surface 101. Part of the sealing resin 7 is interposed between each element side surface 103 and the inner peripheral surface 61 of the frame-shaped member 6.

An example of a method for manufacturing the terahertz device A1 is described below with reference to FIGS. 7-19. Of FIGS. 7-19, FIGS. 12 and 15 are plan views showing steps of a method for manufacturing the terahertz device A1. Of FIGS. 7-19, the figures other than FIGS. 12 and 15 are sectional views showing steps of the method for manufacturing the terahertz device A1. These sectional views correspond to the section shown in FIG. 3.

Figure 7:
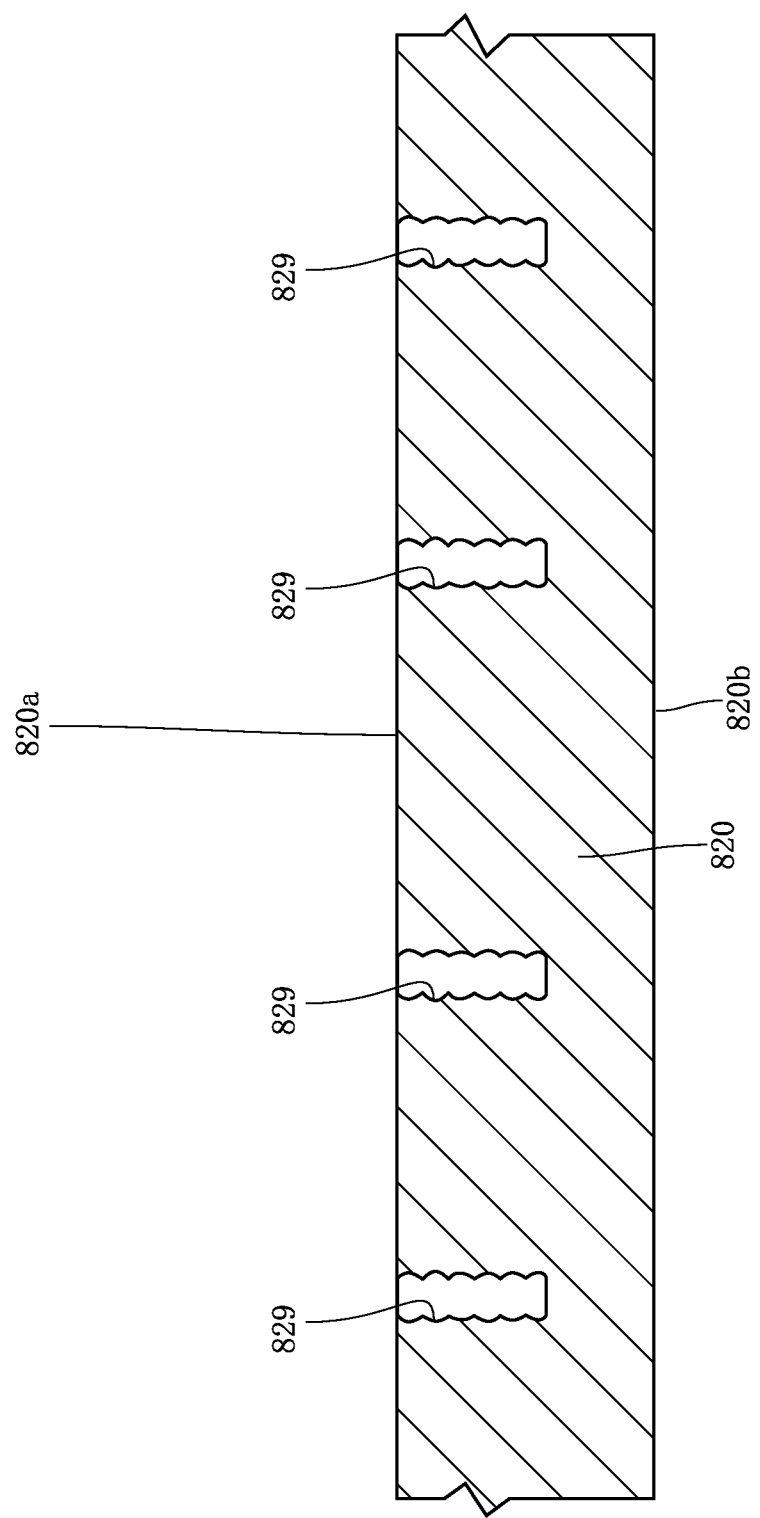
FIG. 7 is a sectional view showing a step of a method for manufacturing the terahertz device according to the first embodiment.

First, a support board 820 is prepared, and grooves 829 are formed in the prepared support board 820, as shown in FIG. 7. The support board 820 will later become the support board 2 of the terahertz device A1, and the grooves 829 will later become the through-holes 21 of the terahertz device A1. In the step of preparing the support board 820 (the support board preparation step), a support board 820 made of single-crystal silicon (Si) as an intrinsic semiconductor is prepared. The support board 820 has a size capable of producing a plurality of support boards 2 of terahertz devices A1. Thus, the manufacturing method in the present disclosure uses a technique to collectively manufacture a plurality of terahertz devices A1. As shown in FIG. 7, the support board 820 has a support-board front surface 820a and a support-board back surface 820b facing away from each other in the z direction. The support-board front surface 820a will later become the support-board front surface 201. In the subsequent step of forming grooves 829 (groove forming step), the grooves are formed by reactive ion etching, particularly by a technique called Bosch process. By forming the grooves 829 by Bosch process, the inner walls of the groove 829 have a stepped profile with so-called scallop. In the present embodiment, the grooves 829 with a depth of 50 μm or more from the support-board front surface 820a of the support board 820 are formed. The depth of the grooves 829 may be set as appropriate in accordance with the thickness of the support board 2 of the terahertz device A1 to be manufactured.

Figure 8:
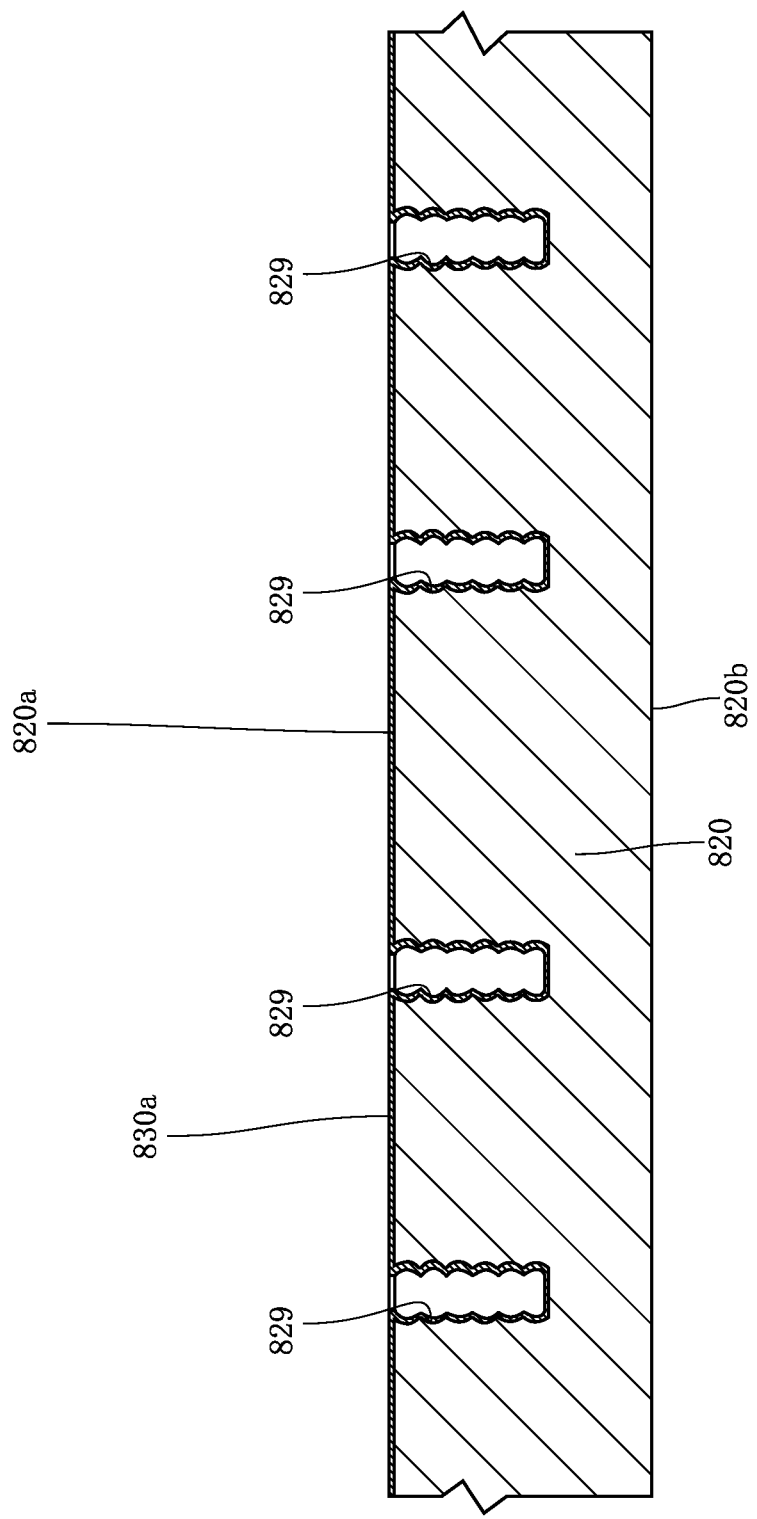
FIG. 8 is a sectional view showing a step of the method for manufacturing the terahertz device according to the first embodiment.

Next, a base layer 830a is formed, as shown in FIG. 8. Parts of the base layer 830a that are formed on the support board front surface 820a will later become parts of the wiring layers 31 of the terahertz device A1, and parts of the base layer 830a that are formed on the support board front surface 820a will later become parts of the frame-shaped member 6 of the terahertz device A1. Also, parts of the base layer 830a that are formed on the inner walls of the grooves 829 will later become parts of the through electrodes 32 of the terahertz device A1. The step of forming the base layer 830a (base layer forming step) may be performed by sputtering. The base layer 830a of the present embodiment is a laminate of a Ti layer and a Cu layer and about 200 to 800 nm in thickness. In the base layer forming step, a Ti layer is formed to cover the support board front surface 820a and all of the inner walls of the grooves 829, and then a Cu layer is formed in contact with the Ti layer.

Figure 9:
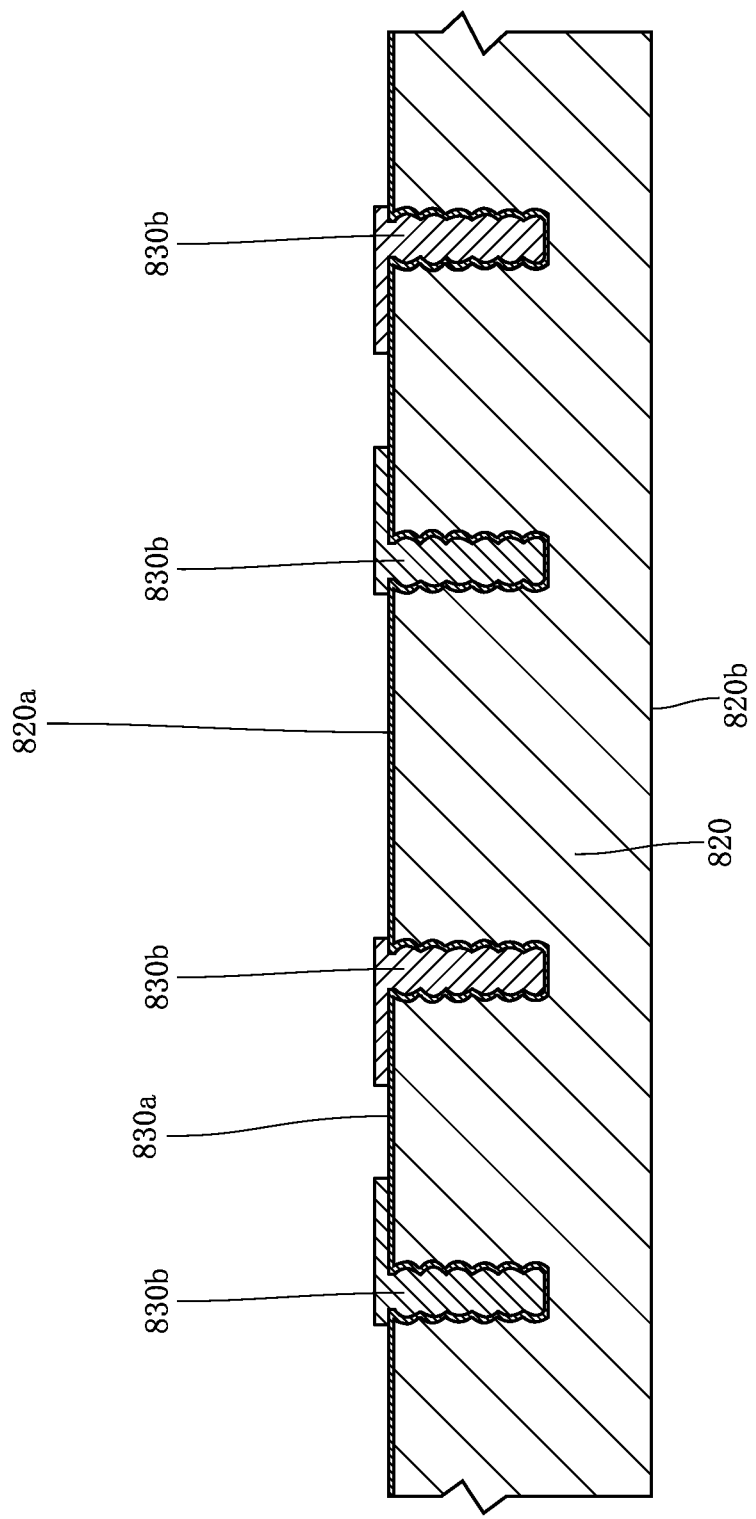
FIG. 9 is a sectional view showing a step of the method for manufacturing the terahertz device according to the first embodiment.

Next, a first plating layer 830b is formed, as shown in FIG. 9. Parts of the first plating layer 830b will later become parts of the wiring layer 31 of the terahertz device A1, and other parts of the first plating layer 830b will later become parts of the through electrode 32 of the terahertz device A1. The formation of the first plating layer 830b may be performed by pattern formation through photolithography and electrolytic plating. Specifically, in the step of forming the first plating layer 830b (first plating layer forming step), a resist (not shown) with a predetermined pattern for forming the first plating layer 830 is formed by photolithography. In this resist patterning process, a photoresist is first applied by spin coating to cover the entirety of the base layer 830a. Next, the photoresist is formed into a predetermined pattern by exposure to light and development. In this way, a resist having a pattern is obtained. In this state, part of the base layer 830a is exposed from the resist. The part exposed from the resist is the region on which the first plating layer 830b is to be formed. Next, electrolytic plating is performed using the base layer 830a as a conduction path to form the first plating layer 830b. The first plating layer 830b is deposited on the part of the base layer 830a that is exposed from the resist. The first plating layer 830b is made of Cu, for example. Thereafter, the unnecessary resist is removed, whereby the first plating layer 830b shown in FIG. 9 is obtained. As shown in FIG. 9, the first plating layer 830b includes parts covering parts of the support board front surface 820a and parts filling the grooves 829.

Figure 10:
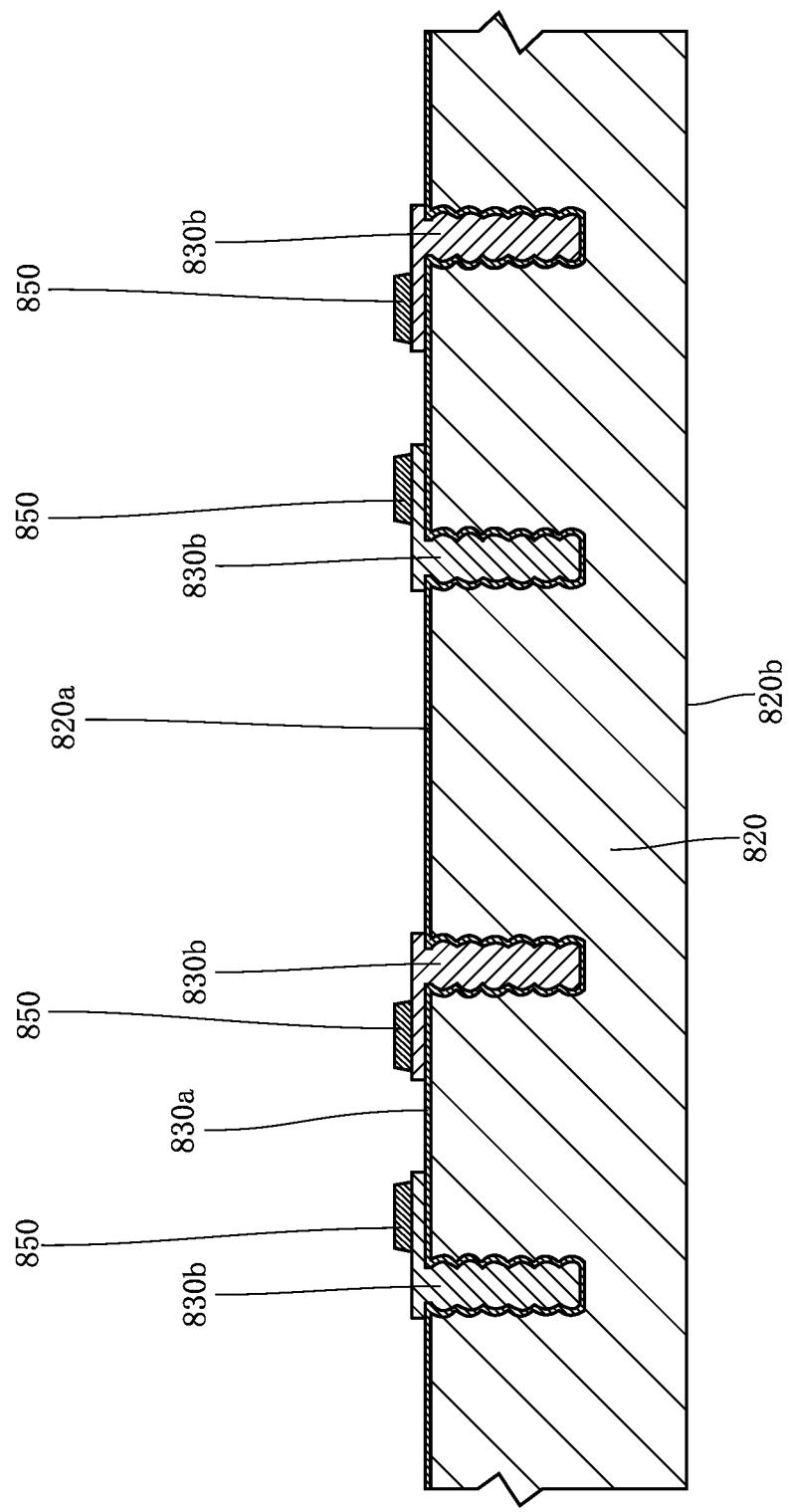
FIG. 10 is a sectional view showing a step of the method for manufacturing the terahertz device according to the first embodiment.

Next, a bonding layer 850 is formed, as shown in FIG. 10. The bonding layer 850 corresponds to the bonding layers 5 of the terahertz device A1. The formation of the bonding layer 850 may be performed by pattern formation by photolithography and electrolytic plating. Specifically, in the step of forming the bonding layer 850 (bonding layer forming step), a resist (not shown) for forming the bonding layer 850 is formed to have a predetermined pattern by photolithography. When a resist having a pattern is formed in this way, part of the first plating layer 830*b* is exposed from the resist. The part exposed from the resist is the region on which the bonding layer 850 is to be formed. Next, electrolytic plating is performed using the base layer 830*a* and the first plating layer 830*b* as a conduction path to form the bonding layer 850. The bonding layer 850 is deposited on the first plating layer 830*b* exposed from the resist. The bonding layer 850 may be solder, for example. Thereafter, the unnecessary resist is removed, whereby the bonding layer 850 shown in FIG. 10 is obtained.

Figure 11:
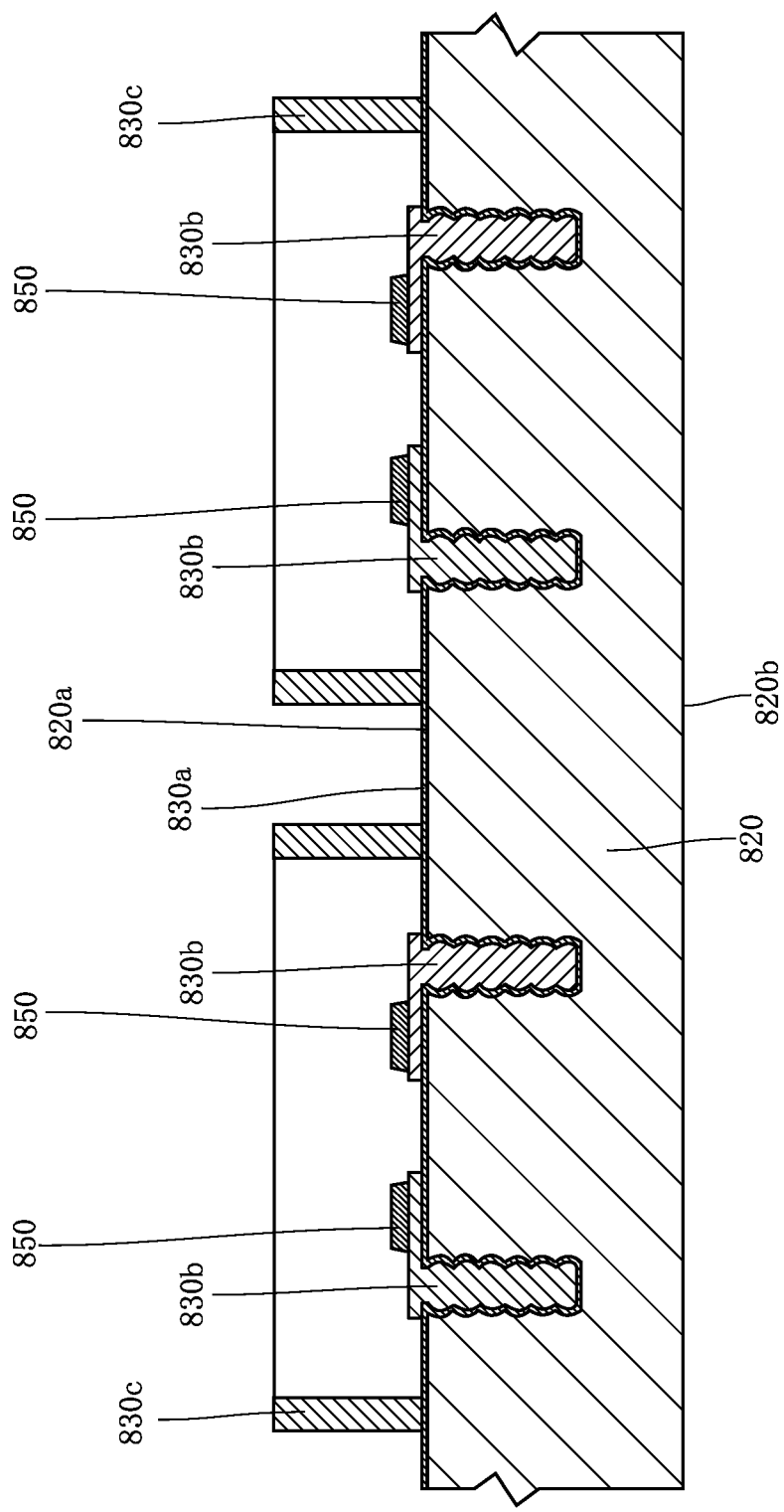
FIG. 11 is a plan view showing a step of the method for manufacturing the terahertz device according to the first embodiment.
Figure 12:
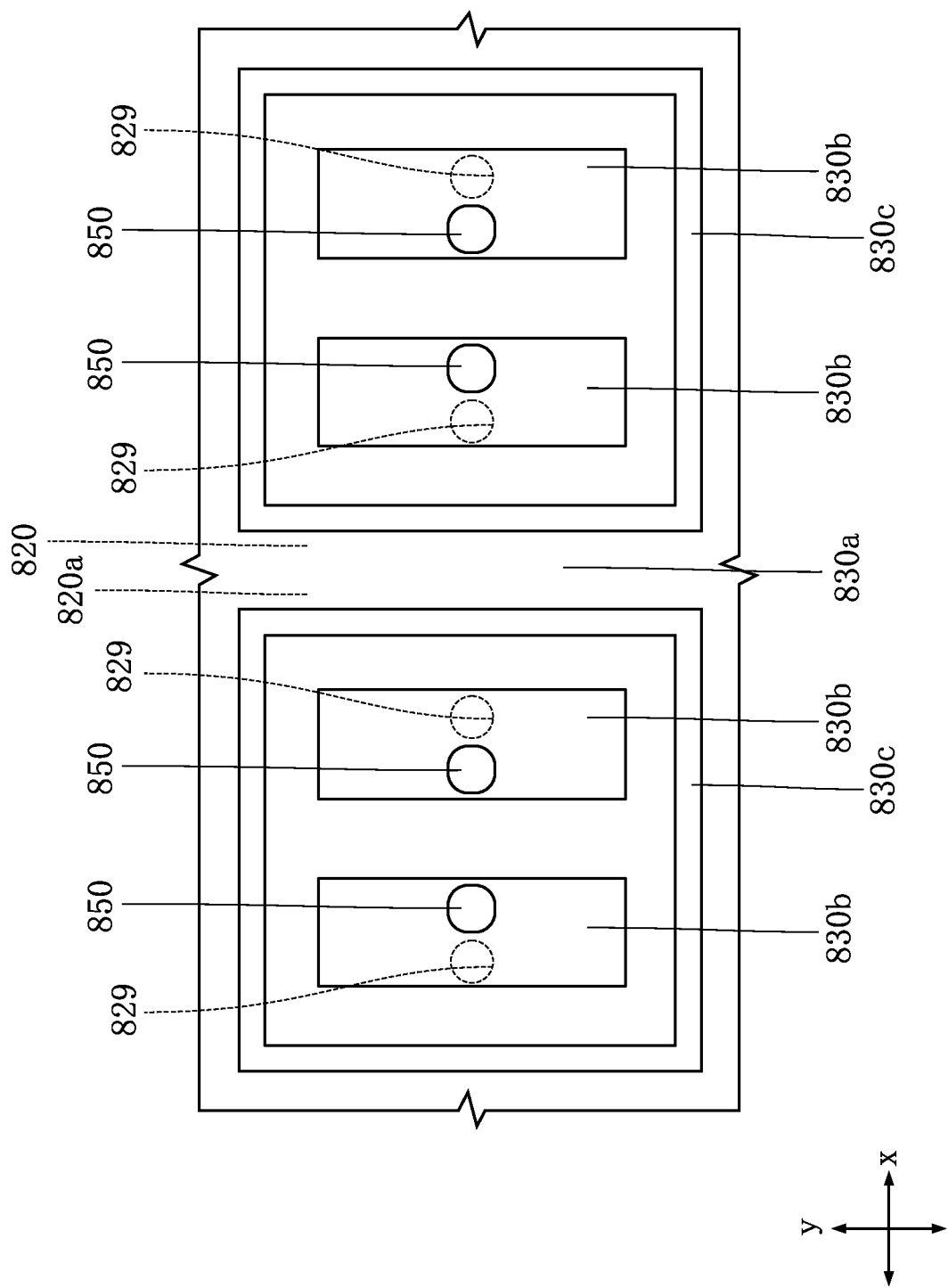
FIG. 12 is a sectional view showing a step of the method for manufacturing the terahertz device according to the first embodiment.

Next, a second plating layer 830*c* is formed, as shown in FIGS. 11 and 12. Part of the second plating layer 830*c* will later become the frame-shaped member 6 of the terahertz device A1. The formation of the second plating layer 830*c* may be performed by pattern formation by photolithography and electrolytic plating. Specifically, in the step of forming the second plating layer 830*c* (second plating layer forming step), a resist (not shown) for forming the second plating layer 830*c* is formed to have a predetermined pattern by photolithography. When a resist having a pattern is formed in this way, part of the base layer 830*a* is exposed from the resist. The part exposed from the resist is the region on which the second plating layer 830*c* is to be formed. Next, electrolytic plating is performed using the base layer 830*a* as a conduction path to form the second plating layer 830*c*. The second plating layer 830*c* is deposited on the part of the base layer 830*a* that is exposed from the resist. The second plating layer 830*c* is made of Cu, for example. Thereafter, the unnecessary resist is removed, whereby the second plating layer 830*c* shown in FIGS. 11 and 12 is obtained. As shown in FIG. 12, the second plating layer 830*c* formed in this way has the shape of a rectangular ring as viewed in plan. In this state, the first plating layer 830*b* and the bonding layer 850 are surrounded by the second plating layer 830*c*, as viewed in plan.

Figure 13:
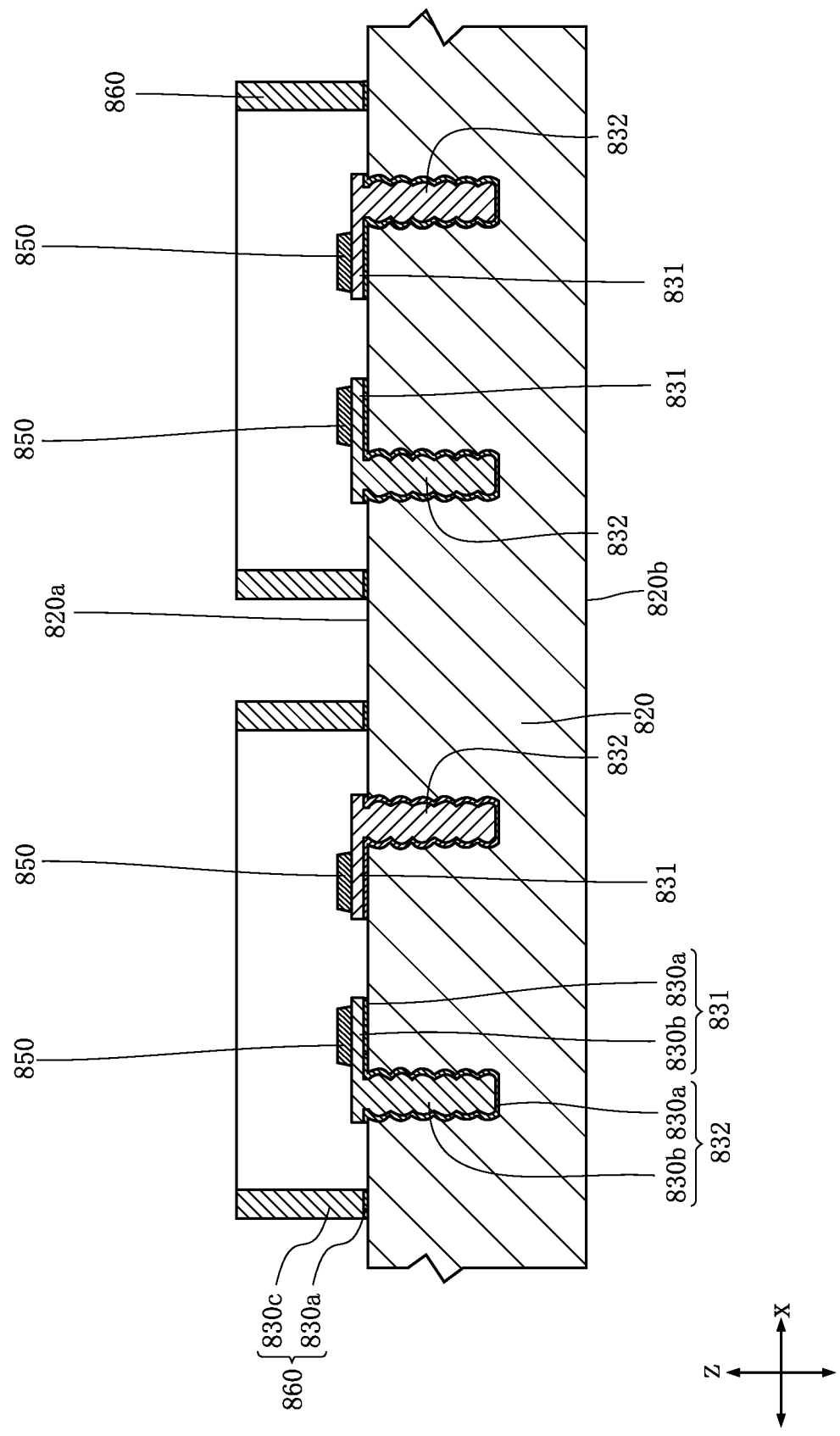
FIG. 13 is a sectional view showing a step of the method for manufacturing the terahertz device according to the first embodiment.

Next, as shown in FIG. 13, unnecessary parts of the base layer 830*a* on the support-board front surface 820*a* that are not covered with the first plating layer 830*b* or the second plating layer 830*c* are removed. The removal of the unnecessary parts of the base layer 830*a* may be performed by wet etching. The wet etching may use a mixed solution of $H_2SO_4$ (sulfuric acid) and $H_2O_2$ (hydrogen peroxide), for example. By the step of removing parts of the base layer 830*a* (base layer removal step), the support-board front surface 820*a* is exposed at the region where the base layer 830*a* has been removed. In this way, the base layer 830*a* is separated into the parts covered with the first plating layer 830*b* and the parts covered with the second plating layer 830*c*. Through these steps, wiring layers 831 are obtained that are made up of the base layer 830*a* covering parts of the support-board front surface 820*a* and the first plating layer 830*b* formed on the base layer 830*a*. Also, through electrodes 832 are formed that are made up of the base layer 830*a* covering the inner walls of the grooves 829 and the first plating layer 830*b* formed on the base layer 830*a*. The frame-shaped member 860 is also formed that is made up of the base layer 830*a* covering parts of the support-board front surface 820*a* and the second plating layer 830*c* formed on the base layer 830*a*. The frame-shaped member 860 formed in this way has the shape of a rectangular ring as viewed in plan. Note that, in each of the wiring layers 831 and the through electrodes 832, the base layer 830*a* and the first plating layer 830*b* are integral with each other. Thus, FIGS. 14-19 do not individually illustrate the base layer 830*a* and the first plating layer 830*b* but illustrate collectively as the wiring layer 831 or the through electrode 832. Likewise, in the frame-shaped member 860, the base layer 830*a* and the second plating layer 830*c* are integral with each other. Thus, FIGS. 14-19 do not individually illustrate the base layer 830*a* and the second plating layer 830*c* but illustrate collectively as the frame-shaped member 860.

Figure 14:
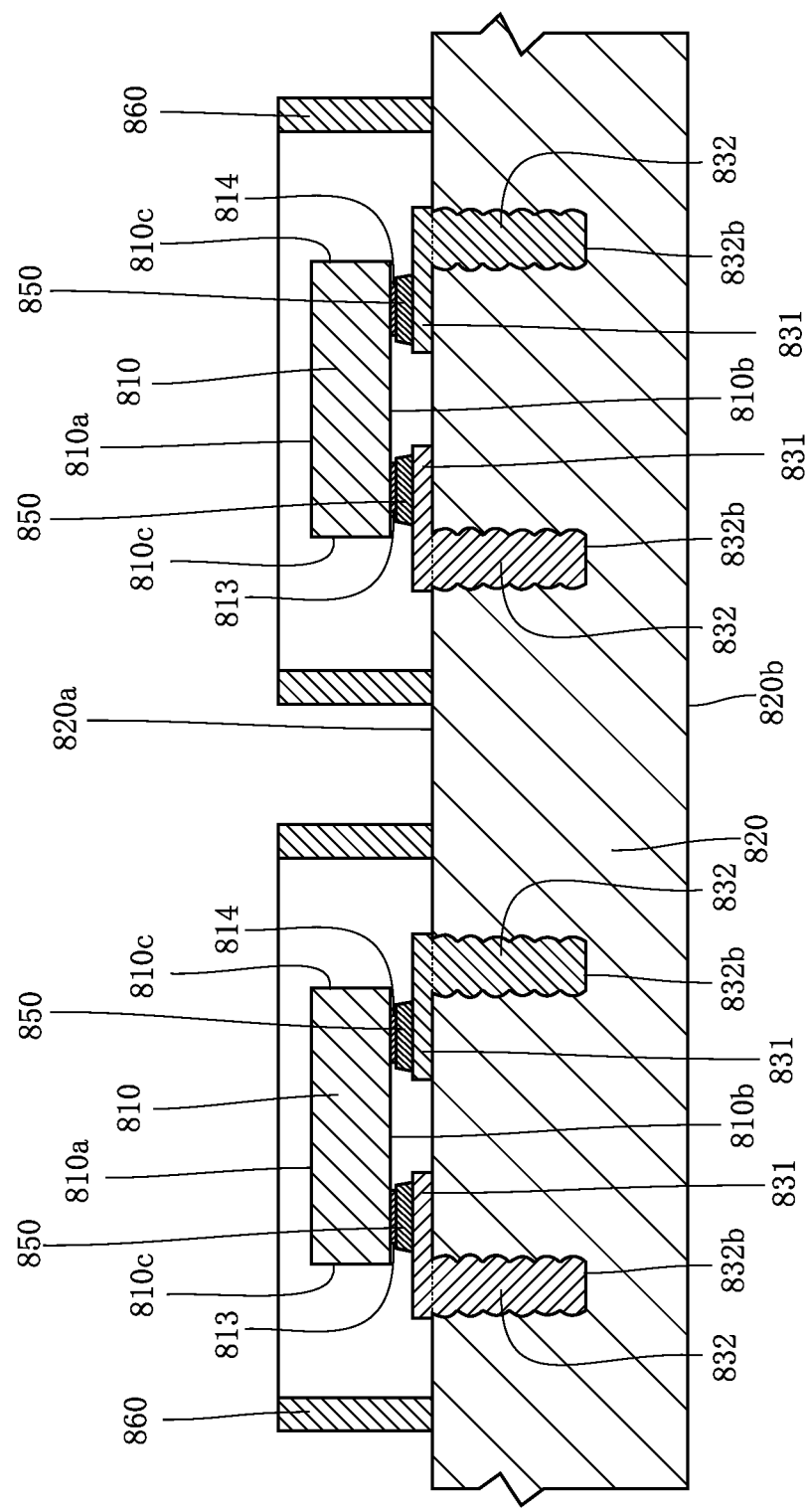
FIG. 14 is a plan view showing a step of the method for manufacturing the terahertz device according to the first embodiment.
Figure 15:
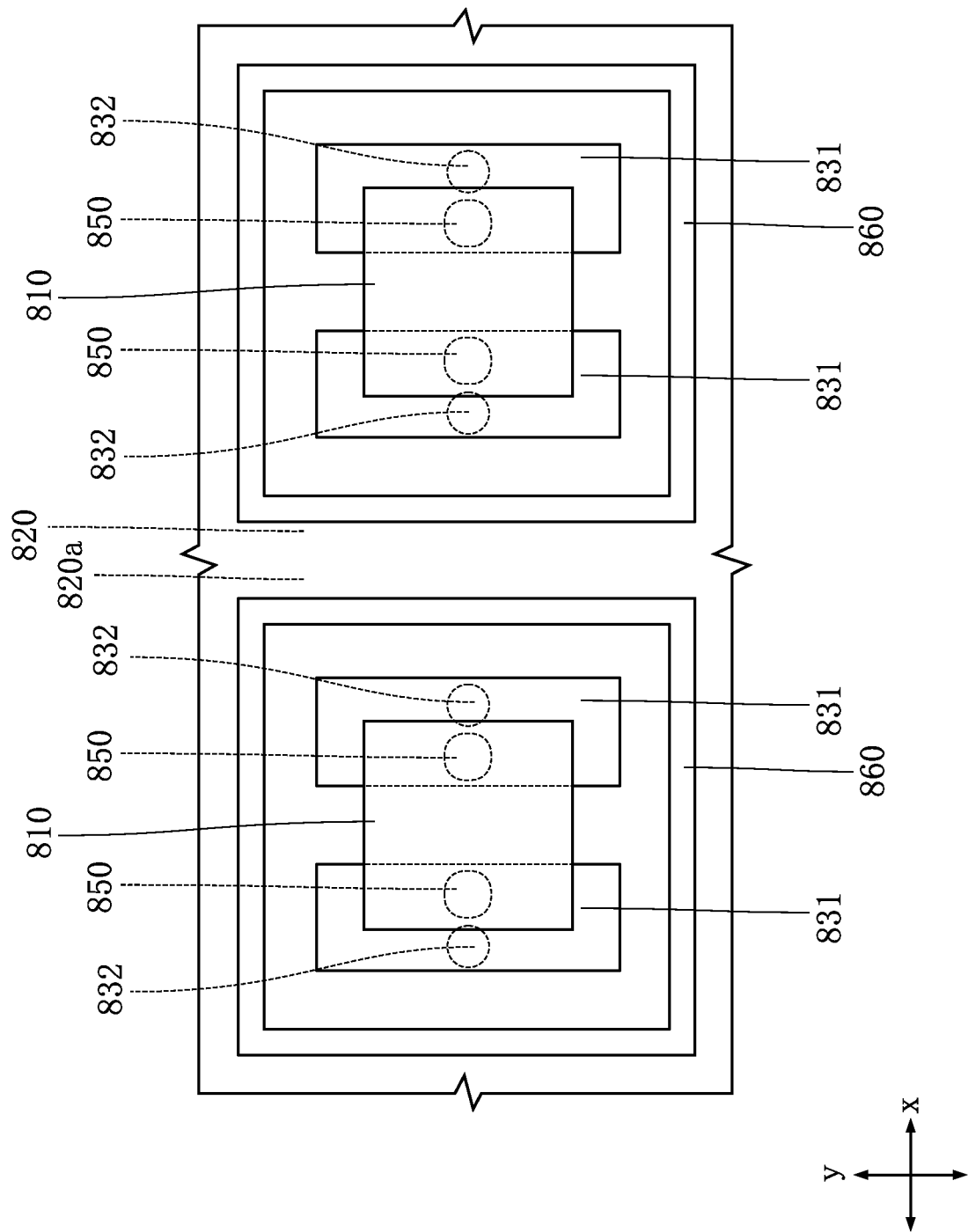
FIG. 15 is a sectional view showing a step of the method for manufacturing the terahertz device according to the first embodiment.

Next, as shown in FIGS. 14 and 15, a terahertz element 810 is mounted on the wiring layers 831. The terahertz element 810 corresponds to the terahertz element 1 of the terahertz device A1. The step of mounting the terahertz element 810 (element mounting step) is performed by FCB (flip chip bonding). Specifically, flux is applied to the first conductive layer 813 and the second conductive layer 814 exposed from the element back surface 810*b* of the terahertz element 810. Thereafter, with the element back surface 810*b* facing the support-board front surface 820*a*, the terahertz element 810 is temporarily attached to the bonding layers 850 using a flip chip bonder. In this state, the bonding layers 850 are sandwiched between the wiring layers 831 and the terahertz element 810. Next, the bonding layers 850 are melted by reflowing and then solidified by cooling, whereby mounting of the terahertz element 810 is completed. In the state after the element mounting step, the terahertz element 810 is surrounded by the frame-shaped member 860, as shown in FIG. 15. The inner peripheral surface of the frame-shaped member 860 faces the element side surfaces 810*c* of the terahertz element 810.

Figure 16:
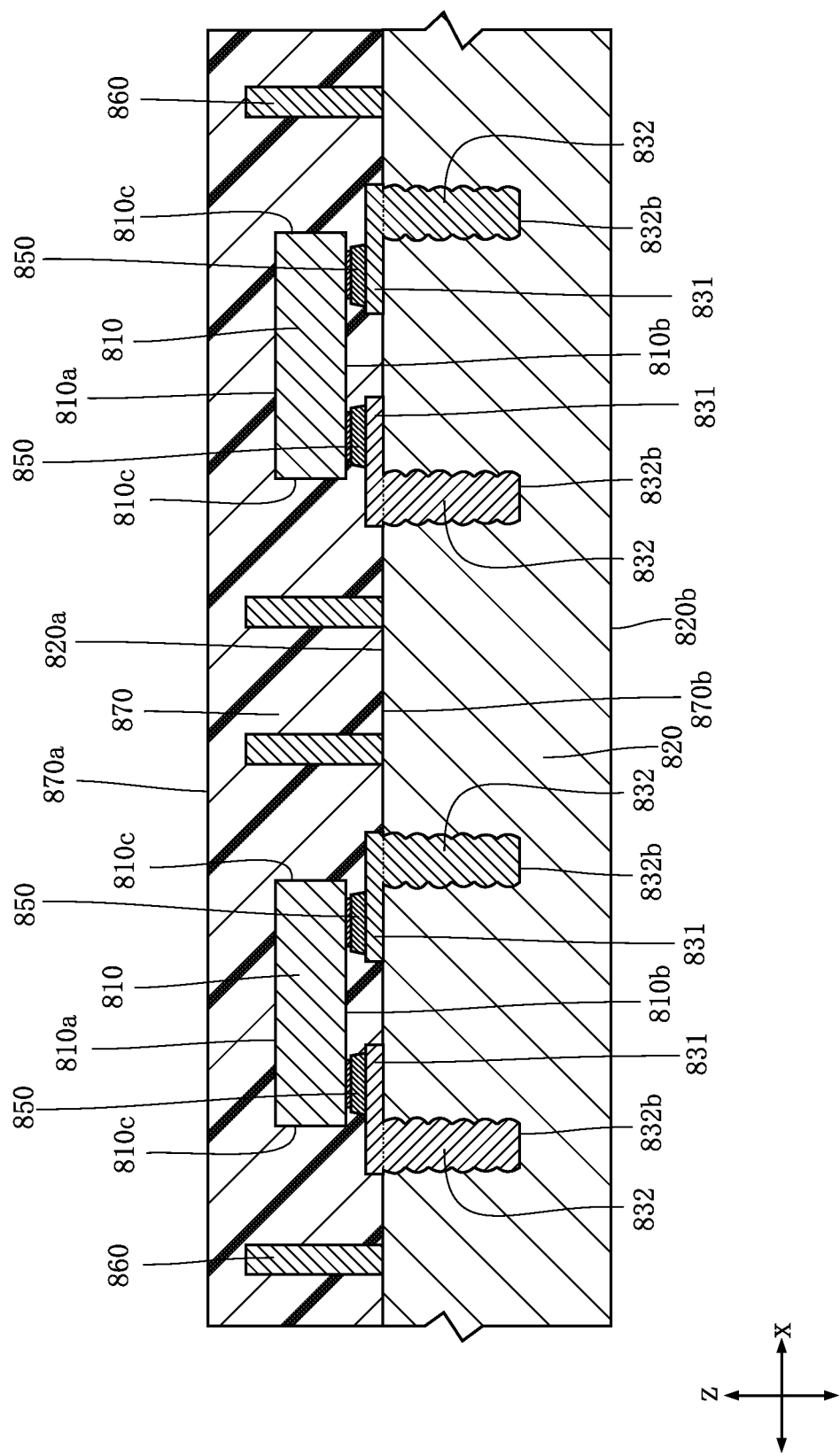
FIG. 16 is a sectional view showing a step of the method for manufacturing the terahertz device according to the first embodiment.
Figure 17:
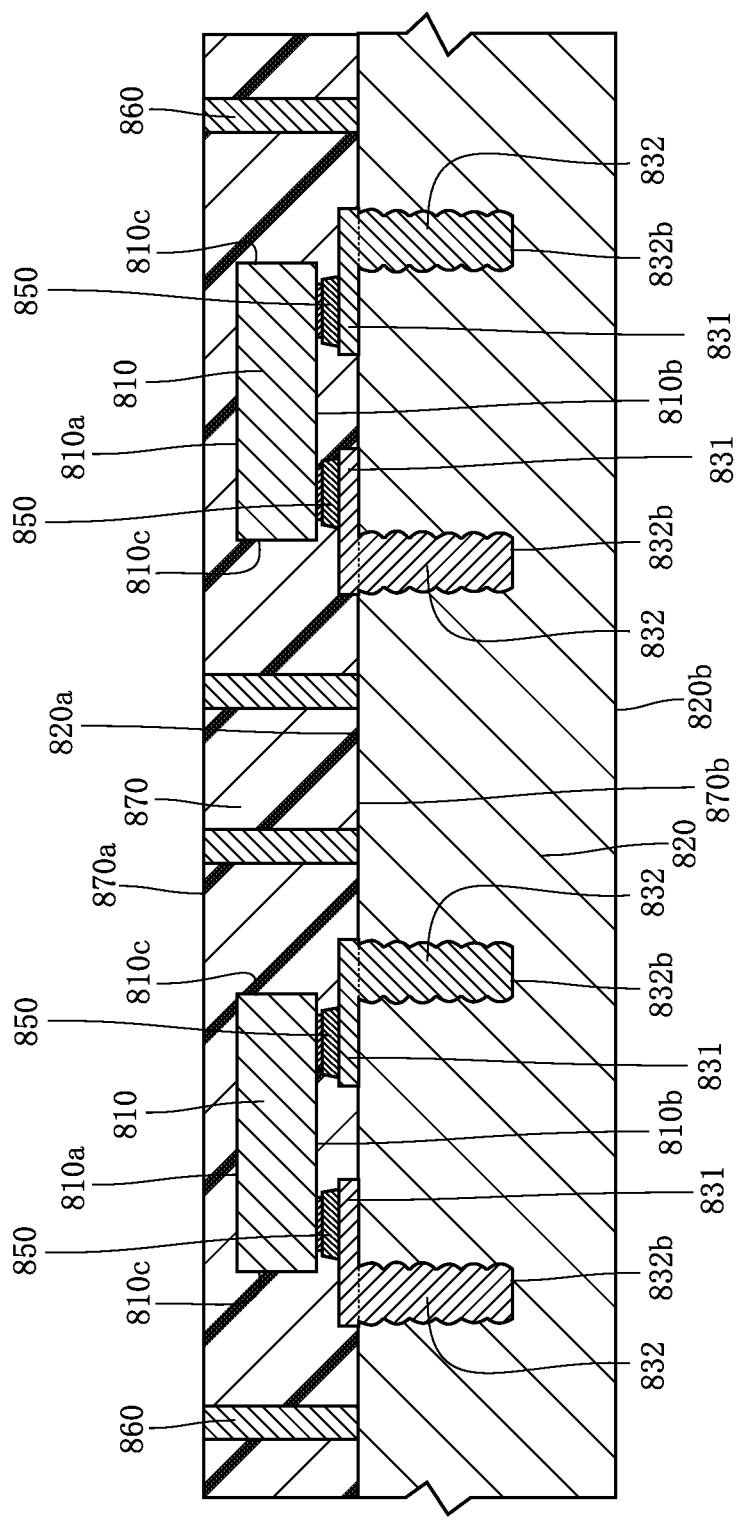
FIG. 17 is a sectional view showing a step of the method for manufacturing the terahertz device according to the first embodiment.

Next, as shown in FIGS. 16 and 17, a sealing resin 870 is formed to cover the terahertz element 810, the wiring layers 831, the bonding layers 850 and the frame-shaped member 860. The sealing resin 870 will later become the sealing resin 7 of the terahertz device A1. The sealing resin 870 is a synthetic resin containing, for example, black epoxy resin as the main ingredient. In the step of forming the sealing resin 870 (sealing resin forming step), the sealing resin 870 is formed on the support-board front surface 820*a* of the support board 820 so as to cover all of the terahertz element 810, the wiring layers 831, the bonding layers 850 and the frame-shaped member 860, as shown in FIG. 16. In this state, as shown in FIG. 16, the resin front surface 870*a* of the sealing resin 870 is located above the upper surface of the frame-shaped member 860. Next, as shown in FIG. 17, the sealing resin 870 is ground from the resin front surface 870*a* toward the resin back surface 870*b*. In this process, the grinding is performed until the frame-shaped member 860 is exposed. The grinding of the sealing resin 870 may be permed by machine grinding. This process makes the top surface of the frame-shaped member 860 and the resin front surface 870*a* flush with each other, with the top surface of the frame-shaped member 860 exposed from the sealing resin 870. After the sealing resin 870 is ground, the resin front surface 870*a* may be roughened by etching.

Figure 18:
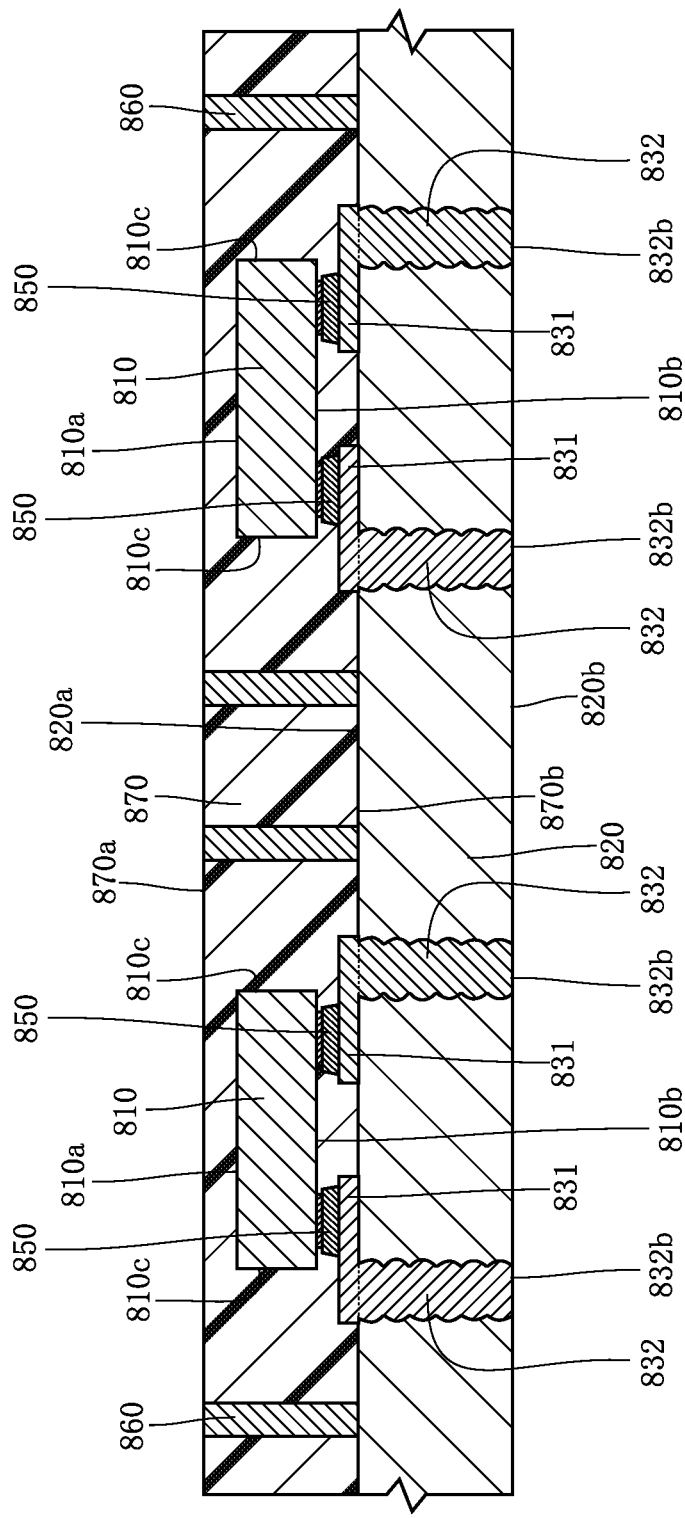
FIG. 18 is a sectional view showing a step of the method for manufacturing the terahertz device according to the first embodiment.

Next, as shown in FIG. 18, the support board 820 is ground from the support board back surface 820*b*. The grinding of the support board 820 may be performed by machine grinding, as with the grinding of the sealing resin 870. In the step of grinding the support board 820 (support board grinding step), the support board 820 is ground from the support-board back surface 820*b* so that the through electrodes 832 are exposed from the support-board back surface 820*b*. By the support board grinding step, the grooves 829 become the through-holes 821 penetrating the support board 820 in the z direction. The through-holes 821 correspond to the through-holes 21 of the terahertz device A1.

Figure 19:
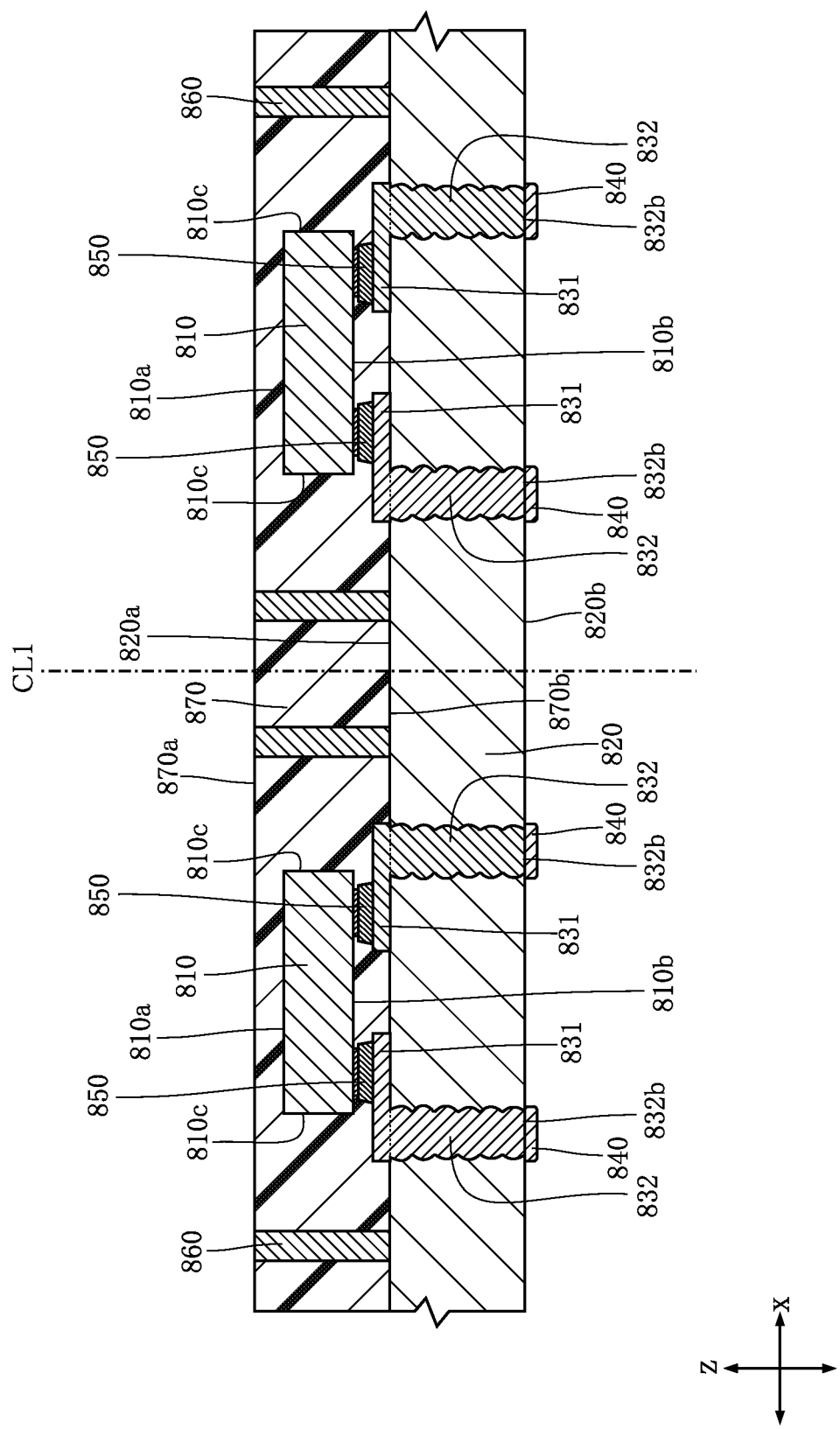
FIG. 19 is a sectional view showing a step of the method for manufacturing the terahertz device according to the first embodiment.

Next, external electrodes 840 are formed, as shown in FIG. 19. The external electrodes 840 will later become the external electrodes 4 of the terahertz device A1. The formation of the external electrodes 840 is performed by electroless plating. In the process of forming the external electrodes 84 (external electrode forming step), a Ni layer, a Pd layer and a Au layer are successively deposited by electroless plating. Specifically, by electroless plating, a Ni layer is formed to be into contact with and cover the exposed surfaces 832*b* of the through electrodes 832, a Pd layer is then formed on the Ni layer, and an Au layer is then formed on the Pd layer, whereby the external electrodes 840 are formed. The external electrodes 840 may be about 2 to 6 μm in thickness. The external electrode forming step is not limited to the above and may be varied as appropriate in accordance with the composition of the external electrodes 4. For example, when the external electrodes 4 are a laminate of a Ni layer and a Au layer, depositing a Pd layer is not required in the electrode forming step.

Next, the sealing resin 870 and the support board 820 are cut into individual pieces for terahertz elements 810. The cutting may be performed by blade dicing, for example. Specifically, in the step of cutting the sealing resin 870 and the support board 820 (cutting step), blade dicing is performed to cut the sealing resin 870 and the support board 820 along the x direction and along the y direction as well. The cutting line CL1 shown in FIG. 19 is an example of a cut position along the y direction.

By going through the above-described steps, the terahertz device A1 shown in FIGS. 1-3 is obtained.

The advantages of the terahertz device A1 according to the first embodiment are described below.

In the terahertz device A1, the terahertz element 1 is covered with the sealing resin 7. Thus, the terahertz element 1 is not exposed to the outside. When the terahertz element in a terahertz device is exposed to the outside or the outside air unlike the terahertz device A1, malfunctions may occur. Such malfunctions may be caused by the influence of moisture or dust in the air, or the influence of vibration or impact, for example. Covering the terahertz element 1 with the sealing resin 7 protects the terahertz element 1 from such influences from the outside. In this way, the terahertz device A1 has a packaging structure that allows for modularization of the terahertz element 1 with improved reliability.

In the terahertz device A1, the frame-shaped member 6 is arranged so as to surround the terahertz element 1. The frame-shaped member 6 is made of an electrically conductive material. With such an arrangement, the frame-shaped member 6 functions as an electromagnetic shield, so that the terahertz device A1 can reduce problems such as disturbance noise or crosstalk. In this way, the terahertz device A1 has a packaging structure that allows for modularization of the terahertz element 1 with improved emission or reception quality of terahertz waves.

In the terahertz device A1, the terahertz waves radiated from the terahertz element 1 are reflected by the frame-shaped member 6 (inner peripheral surface 61) to produce resonance and thereby radiated in the z direction. With such an arrangement, the terahertz device A1 can radiate terahertz waves with reduced noise components. Also, the terahertz device A1 can radiate terahertz waves with an increased gain due to resonant reflection. In this way, the terahertz device A1 has a packaging structure that allows for modularization of the terahertz element 1 with improved emission or reception quality of terahertz waves.

In the terahertz device A1, the frame-shaped member 6 has the shape of a rectangular ring as viewed in plan. Thus, the inner peripheral surface 61 (reflective surface) can be made generally parallel with each of the element side surfaces 103 of the terahertz element 1. Thus, when the antenna structure integrated in the terahertz element 1 is an antenna with a fixed polarization direction such as a dipole antenna, a slot antenna or a bow tie antenna, the inner peripheral surface 61 reflects the terahertz waves from the terahertz element 1 in the vertical direction. In this way, the terahertz device A1 has a packaging structure that allows for modularization of the terahertz element 1 with improved emission or reception quality of terahertz waves.

In the terahertz device A1, the terahertz element 1 is flip-chip mounted with the bonding layers 5 on the support board 2 on which the wiring layers 31 are formed. In this way, electrical connection of the terahertz element 1 with the wiring layers 31 does not use wires. This shortens the length of the wiring path in the terahertz device A1, so that the impedance and the inductance are reduced. In this way, the terahertz device A1 has a packaging structure that allows for modularization of the terahertz element 1 in a manner suitable for driving at high frequencies. Moreover, flip-chip mounting uses a smaller mount area than wire bonding. Thus, the terahertz device A1 has a packaging structure that allows for modularization of the terahertz element 1 while achieving size reduction.

In the process of manufacturing the terahertz device A1, the sealing resin 870 is ground from the resin front surface 870*a*, as shown in FIGS. 16 and 17. This reduces the thickness of the sealing resin 7 in the terahertz device A1. Thus, the distance between the element front surface 101 of the terahertz element 1 and the resin front surface 701 of the sealing resin 7 is reduced, which reduces absorption loss of terahertz waves due to the sealing resin 7. The terahertz device A1 having such a packaging structure allows for modularization of the terahertz element 1 while securing efficient emission of the terahertz waves from the terahertz element 1.

In the terahertz device A1, the dimension of the support board 2 in the z direction is about 50 to 200 μm. This reduces problems such as cracking or distortion of the support board 2. In this way, the terahertz device A1 has a packaging structure that allows for modularization of the terahertz element 1 while securing robustness of the support board 2.

Figure 20:
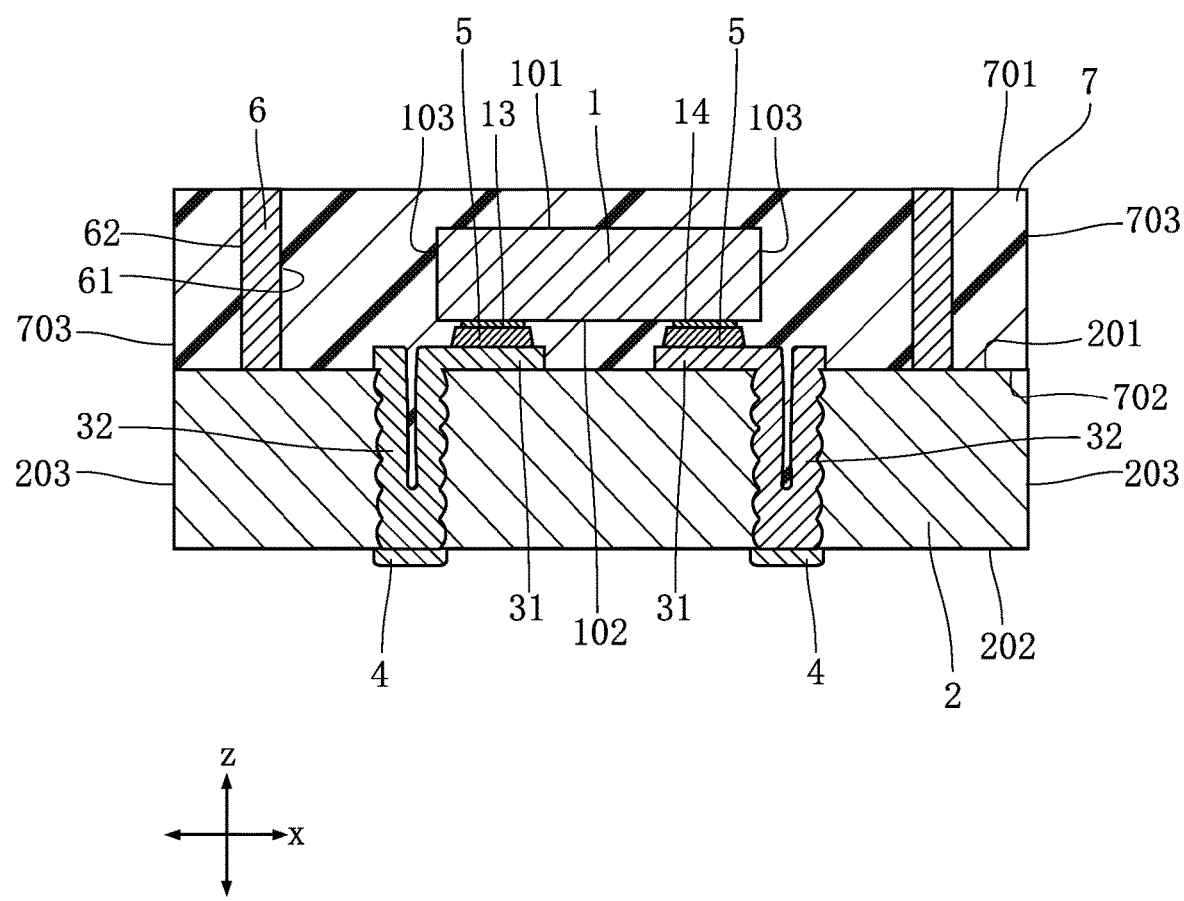
FIG. 20 is a sectional view showing through electrodes according to a variation.

Though the through electrodes 32 are formed to fill the through-holes 21 in the first embodiment, the present disclosure is not limited to this. For example, depending on the deposition amount of the first plating layer 830 in the first plating layer forming step (see FIG. 9), the through electrodes 32 may be formed to such a degree as to cover the inner walls of the through-holes 21. FIG. 20 shows an example in which the through electrodes 32 do not completely fill the through-holes 21. Each of the through electrodes 32 is formed to have the shape of a bottomed cylinder, and the hollow portion of each through electrode 32 is filled with the sealing resin 7. Such an arrangement also provides the same advantages as the first embodiment.

In the first embodiment, the above-described cutting step performs division into individual pieces for terahertz elements. However, the present disclosure is not limited to this, and division into blocks each including a plurality of terahertz elements 1 may be performed. In this case, the division may be performed such that each block includes a plurality of terahertz elements 1 arranged in a straight line or arranged in a matrix.

Though the first embodiment shows an example in which the frame-shaped member 6 has the shape of a rectangular ring as viewed in plan, the shape of the frame-shaped member 6 as viewed in plan is not particularly limited and may be any shape as long as the inner peripheral surface 61 of the frame-shaped member 6 functions as a resonant surface. FIGS. 21-32 show other shapes of the frame-shaped member 6 that can be employed in the terahertz device of the present disclosure. Note that the shapes of the frame-shaped member 6 shown in these figures are merely examples and the present disclosure is not limited to these.

Figure 21:
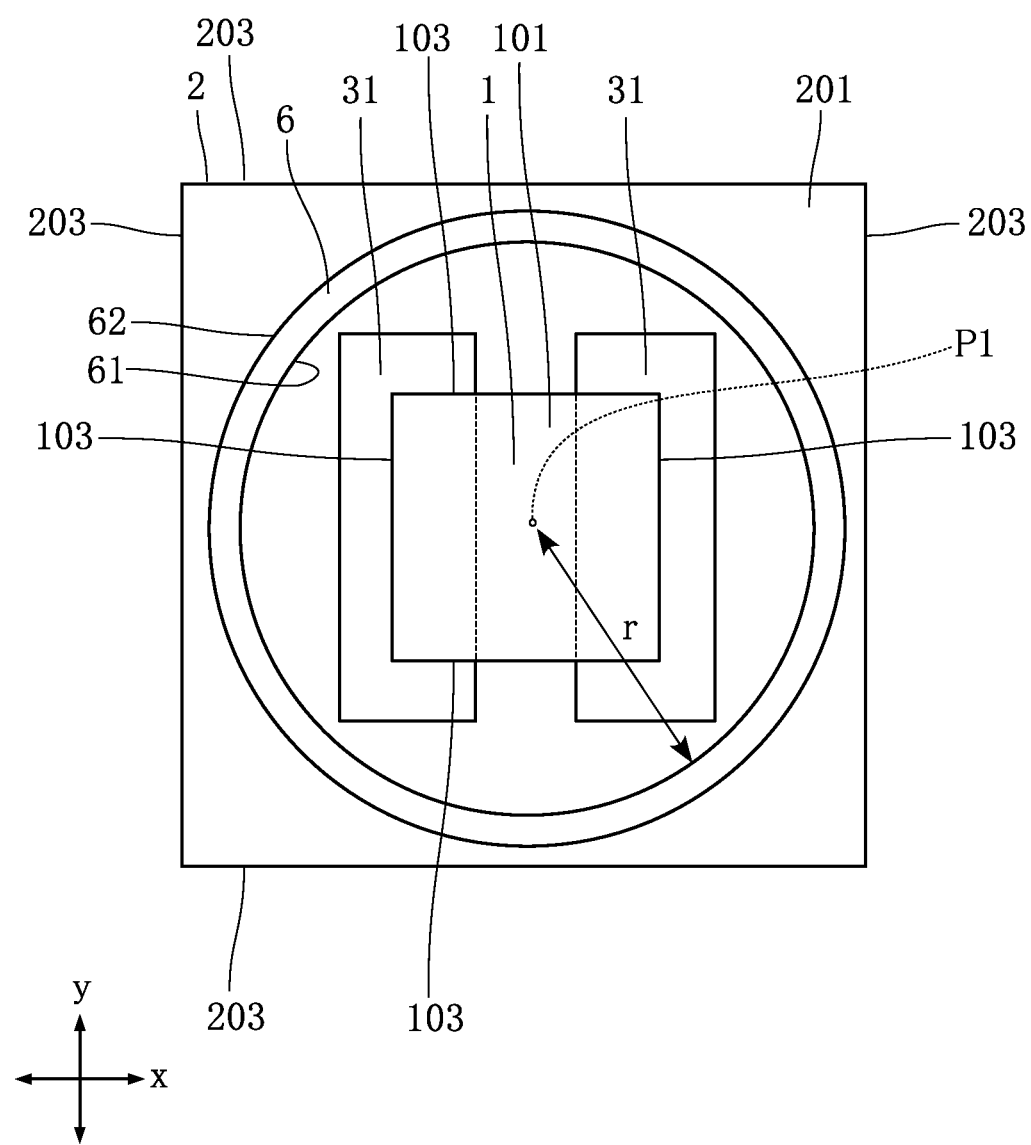
FIG. 21 is a plan view showing another example of the configuration of a frame-shaped member.

FIG. 21 shows an example in which the frame-shaped member 6 has the shape of a circular ring as viewed in plan. In this variation, the radius r of the inner peripheral surface 61 of the frame-shaped member 6 as viewed in plan is an integral multiple of ¼ times the wavelength λ of the terahertz waves, i.e. λ/4. Such a fame-shaped member 6 having the shape of a circular ring as viewed in plan also functions as an electromagnetic shield, and hence, improves resistance to disturbance noise and reduces crosstalk. Moreover, when the antenna structure integrated in the terahertz element 1 is an antenna that does not rely on waves polarized in a particular direction, configuring the frame-shaped member 6 into the shape of a circular ring as viewed in plan assures that electromagnetic waves are efficiently received from every direction. Note that the frame-shaped member 6 may not have the shape of a circular ring as shown in FIG. 21 but may have the shape of an oval ring.

Figure 22:
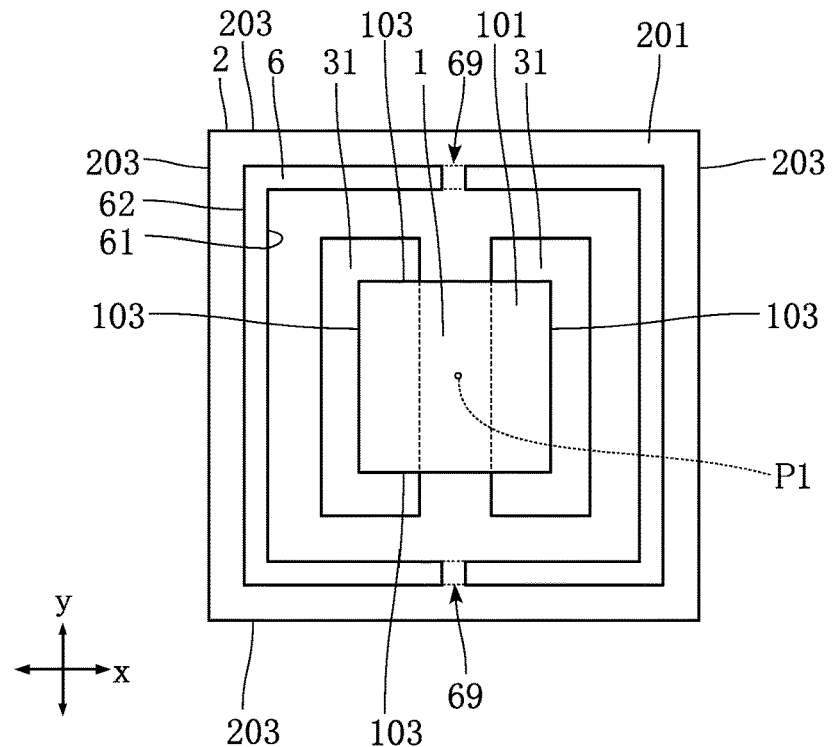
FIG. 22 is a plan view showing another example of the configuration of the frame-shaped member.
Figure 23:
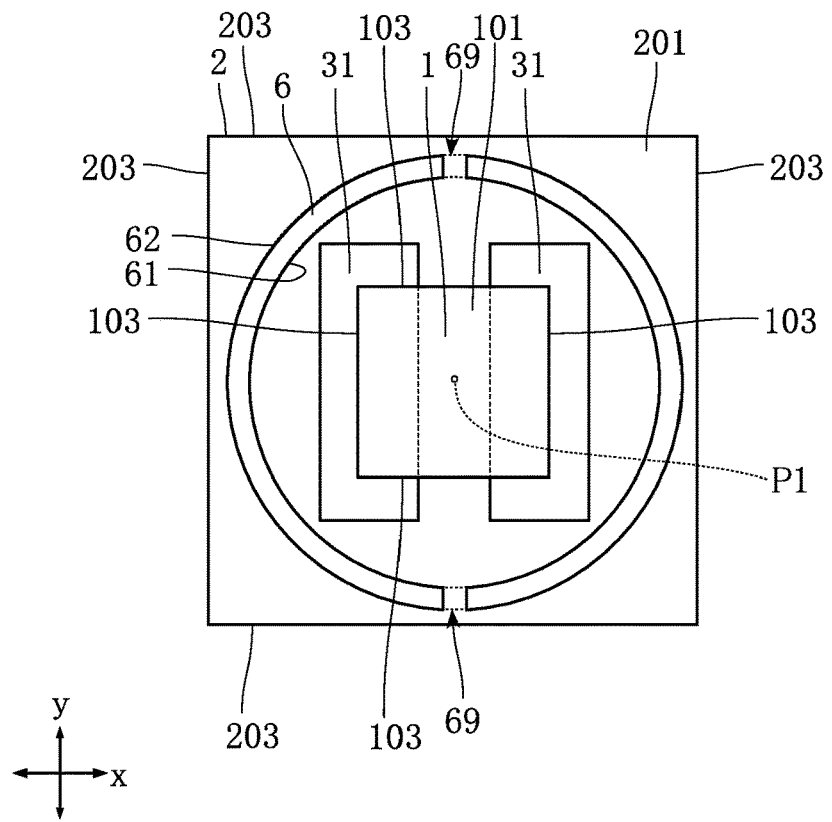
FIG. 23 is a plan view showing another example of the configuration of the frame-shaped member.
Figure 24:
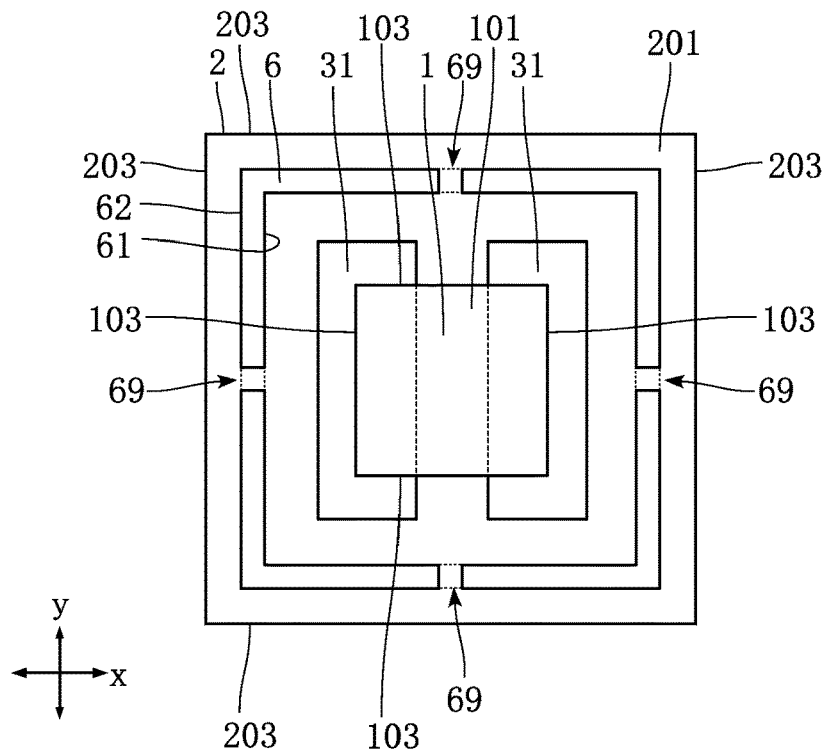
FIG. 24 is a plan view showing another example of the configuration of the frame-shaped member.
Figure 25:
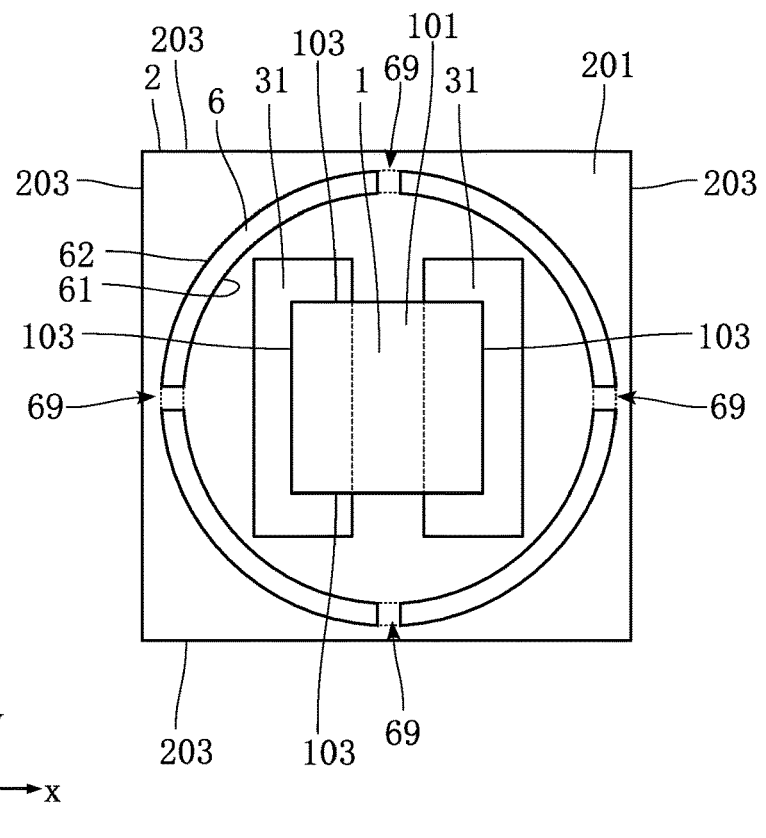
FIG. 25 is a plan view showing another example of the configuration of the frame-shaped member.
Figure 26:
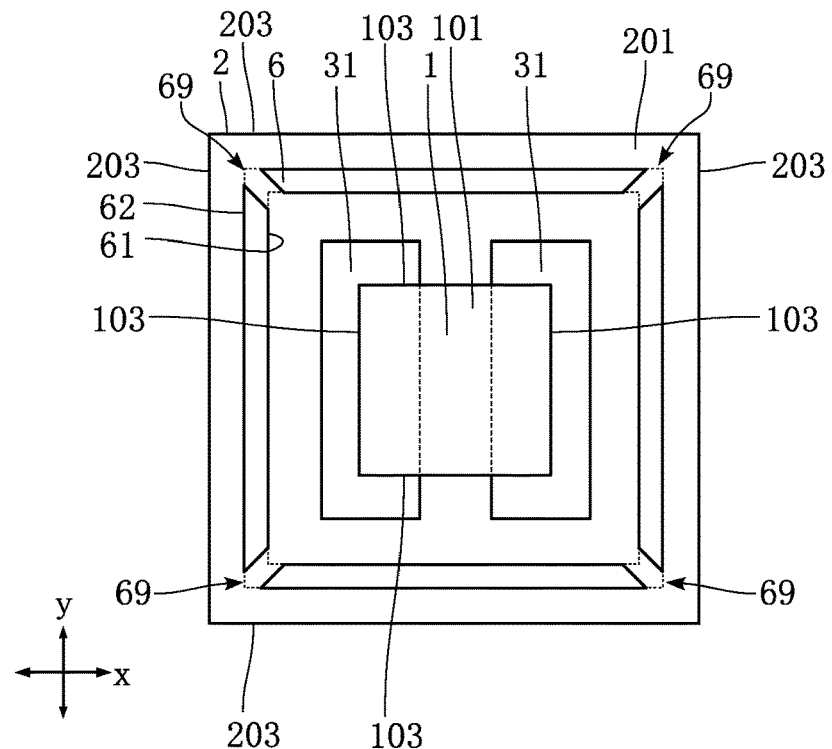
FIG. 26 is a plan view showing another example of the configuration of the frame-shaped member.
Figure 27:
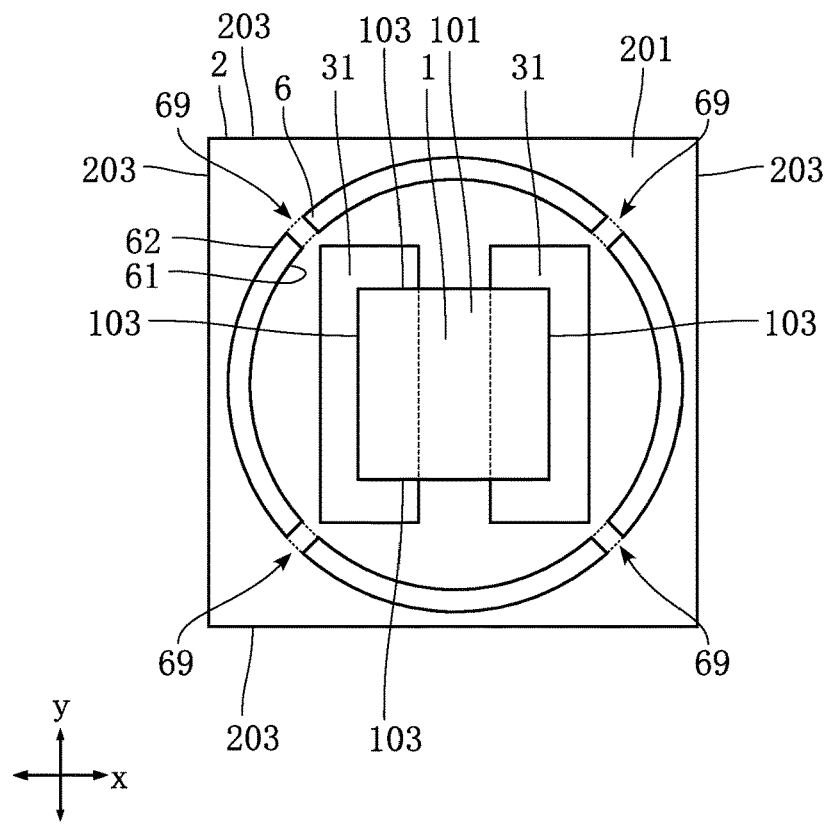
FIG. 27 is a plan view showing another example of the configuration of the frame-shaped member.
Figure 28:
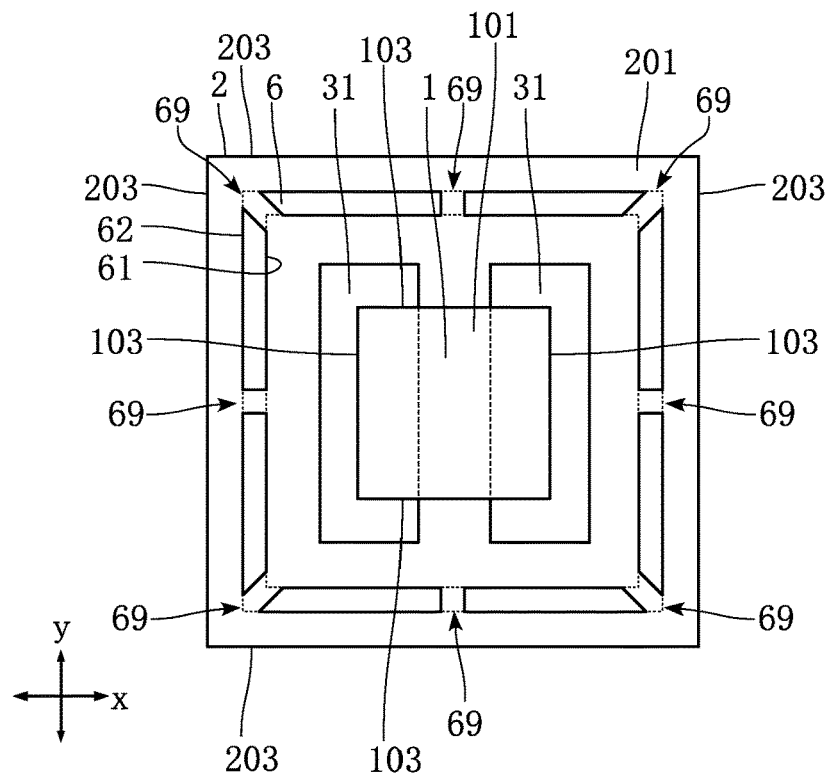
FIG. 28 is a plan view showing another example of the configuration of the frame-shaped member.
Figure 29:
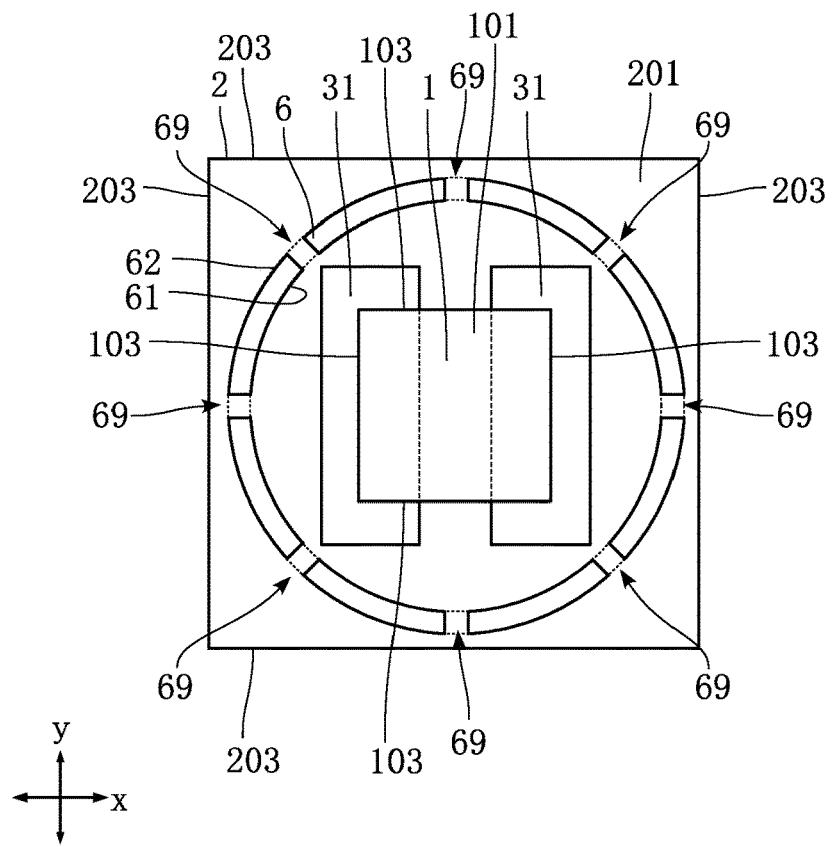
FIG. 29 is a plan view showing another example of the configuration of the frame-shaped member.

FIGS. 22-29 show examples in which the frame-shaped member 6 is not continuous as viewed in plan but formed with one or more slits 69, and in particular, the one or more slits are arranged symmetrically with respect to the radiation point of the terahertz waves, i.e. the center position P1 of the terahertz element. FIGS. 22, 24, 26 and 28 show examples in which one or more slits 69 are formed in the frame-shaped member 6 having the shape of a rectangular ring as viewed in plan, whereas FIGS. 23, 25, 27 and 29 show examples in which one or more slits 69 are formed in the frame-shaped member 6 having the shape of a circular ring as viewed in plan. FIGS. 22 and 23 show examples in which two slits 69 are formed. In FIGS. 22 and 23, two slits 69 are aligned in the y direction. However, the present disclosure is not limited to this, and the two slits 69 may be aligned in the x direction. FIGS. 24 and 25 show examples in which four slits 69 are formed at locations facing the respective element side surfaces 103 of the terahertz element 1. FIGS. 26 and 27 show examples in which four slits 69 are formed on diagonal lines of the terahertz element 1 as viewed plan. FIGS. 28 and 29 show examples in which eight slits 69 are formed.

In these cases again, the terahertz waves radiated from the terahertz element 1 are reflected by the inner peripheral surface 61 of the frame-shaped member 6 to produce resonance, which leads to noise reduction and gain improvement of the terahertz waves emitted from the terahertz device A1 according to the present variation.

Figure 30:
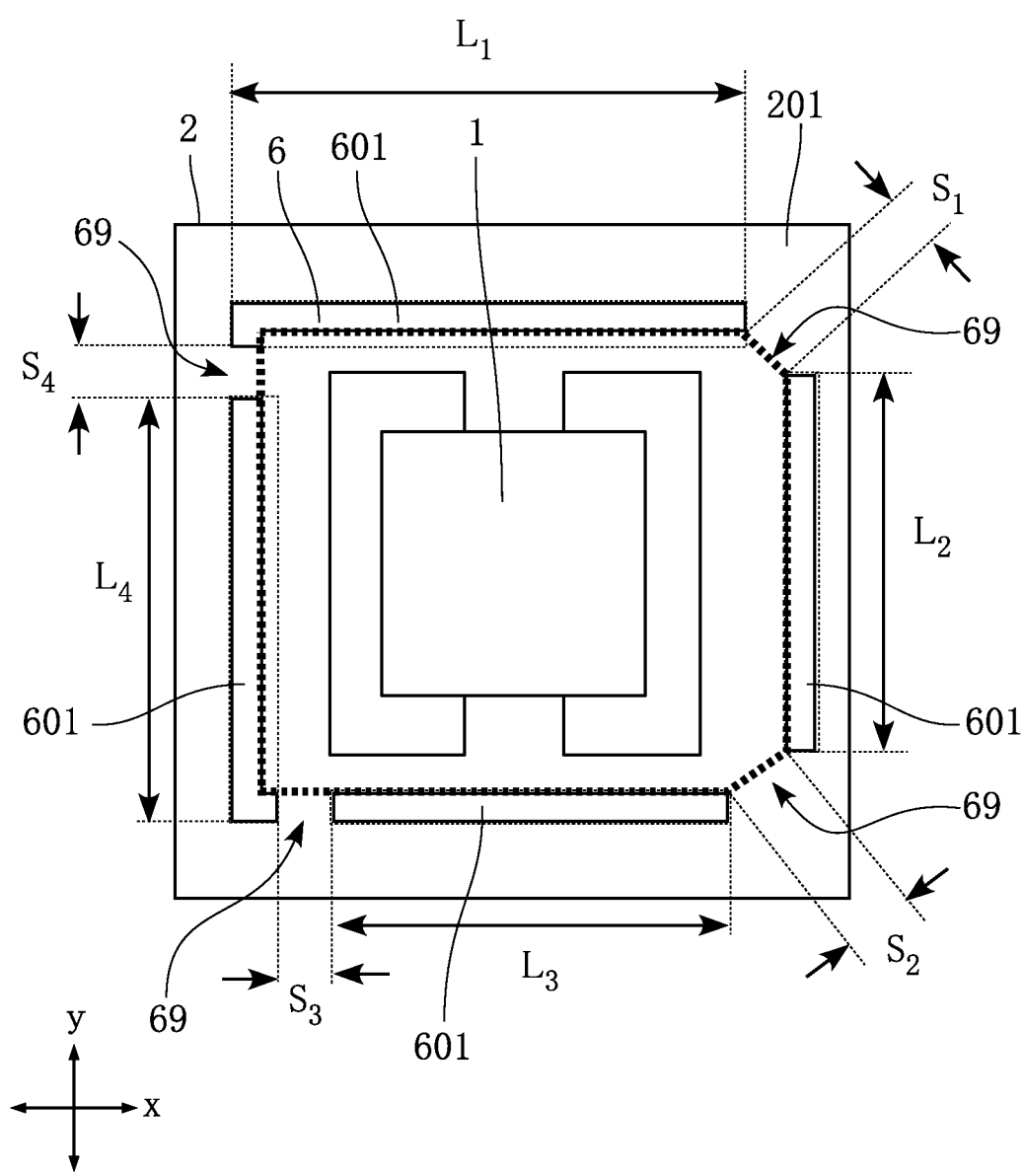
FIG. 30 is a plan view showing another example of the configuration of the frame-shaped member.
Figure 31:
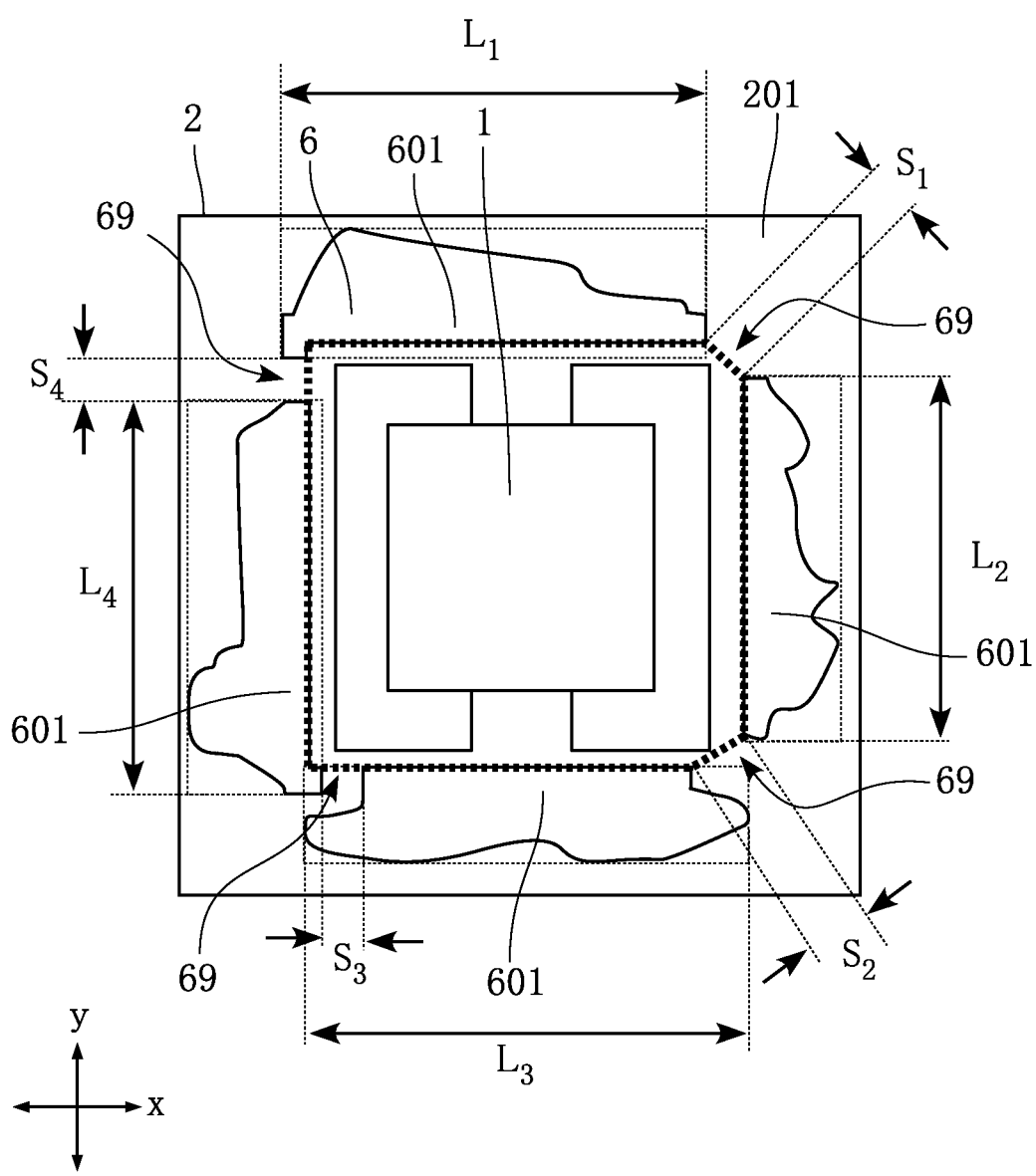
FIG. 31 is a plan view showing another example of the configuration of the frame-shaped member.

FIG. 30 shows an example in which the frame-shaped member 6 is formed with one or more slits 69 as with the examples shown in FIGS. 22-29, but unlike the examples shown in FIGS. 22-29, the slits in this example are not arranged symmetrically with respect to the radiation point of the terahertz waves. In this variation shown in FIG. 30, the frame-shaped member 6 includes a plurality of metal pieces 601 separated from each other by the slits 69. The metal pieces 601 are not limited to those of a particular configuration, but may be configured such that the terahertz waves from the terahertz element 1 are stationarily reflected by the inner peripheral surface 61 of the frame-shaped member 6. That is, it is only required that the metal pieces 601 are arranged such that the frame-shaped member 6 stationarily functions as a resonator that produces resonance of terahertz waves from the terahertz element 1. In the present variation, to make the frame-shaped member 6 function as a resonator, the metal pieces 601 may be configured as follows.

First, for each of the metal pieces 601, assume that there is a rectangle that surrounds the metal piece 601 as viewed in the z direction with the smallest area, as shown in FIG. 30 (see the thinner dot lines in the figure). The length of the longer side of each imaginary rectangle is defined as length $L_i$ of the relevant metal piece 601. Herein, i is a positive integer (i=1, 2, . . . n), and n is the number of the metal pieces 601. Since there are four metal pieces 601 in FIG. 30, i=1, 2, 3, 4. The minimum distance between two metal pieces 601 on opposite sides of a slit 69 is defined as distance $S_i$. To determine the distance $S_i$, consider an imaginary closed loop surrounding the terahertz element 1 and extending along the metal pieces 601 to connect the metal pieces 601 to each other. Specifically, consider a closed loop with the shortest length that does not traverse the terahertz element 1. In the example shown in FIG. 30, the closed loop takes the route indicated by thicker dot lines. The above-described distance $S_i$ between two metal pieces 601 is the distance measured along the closed loop. With the length $L_i$ of each metal piece 601 and the distance $S_i$ between metal pieces 601 are defined as described above, the metal pieces 601 are arranged so as to satisfy $S_0/L_0<1$, where $L_0=\Sigma L_i=L_1+L_2+\ldots+L_i+\ldots+L_n$ and $S_0=\Sigma S_i=S_1+S_2+\ldots+S_i+\ldots+S_n$. That is, the metal pieces 601 are configured such that the sum of the respective lengths $L_i$ of the metal pieces 601 is greater than the sum of the respective distances $S_i$. This arrangement allows the terahertz waves radiated from the terahertz element 1 to be reflected by the inner peripheral surface 61 of the frame-shaped member 6 to produce resonance, which leads to noise reduction and gain improvement of the terahertz waves emitted from the terahertz device A1 according to the present variation. Thus, even when the frame-shaped member 6 has the shape shown in FIG. 31 as viewed in plan, for example, as long as the metal pieces 601 are configured to satisfy the above-described condition, noise reduction and gain improvement of the terahertz waves from the terahertz device A1 is achieved as with the case where no slits 69 are formed.

Figure 32:
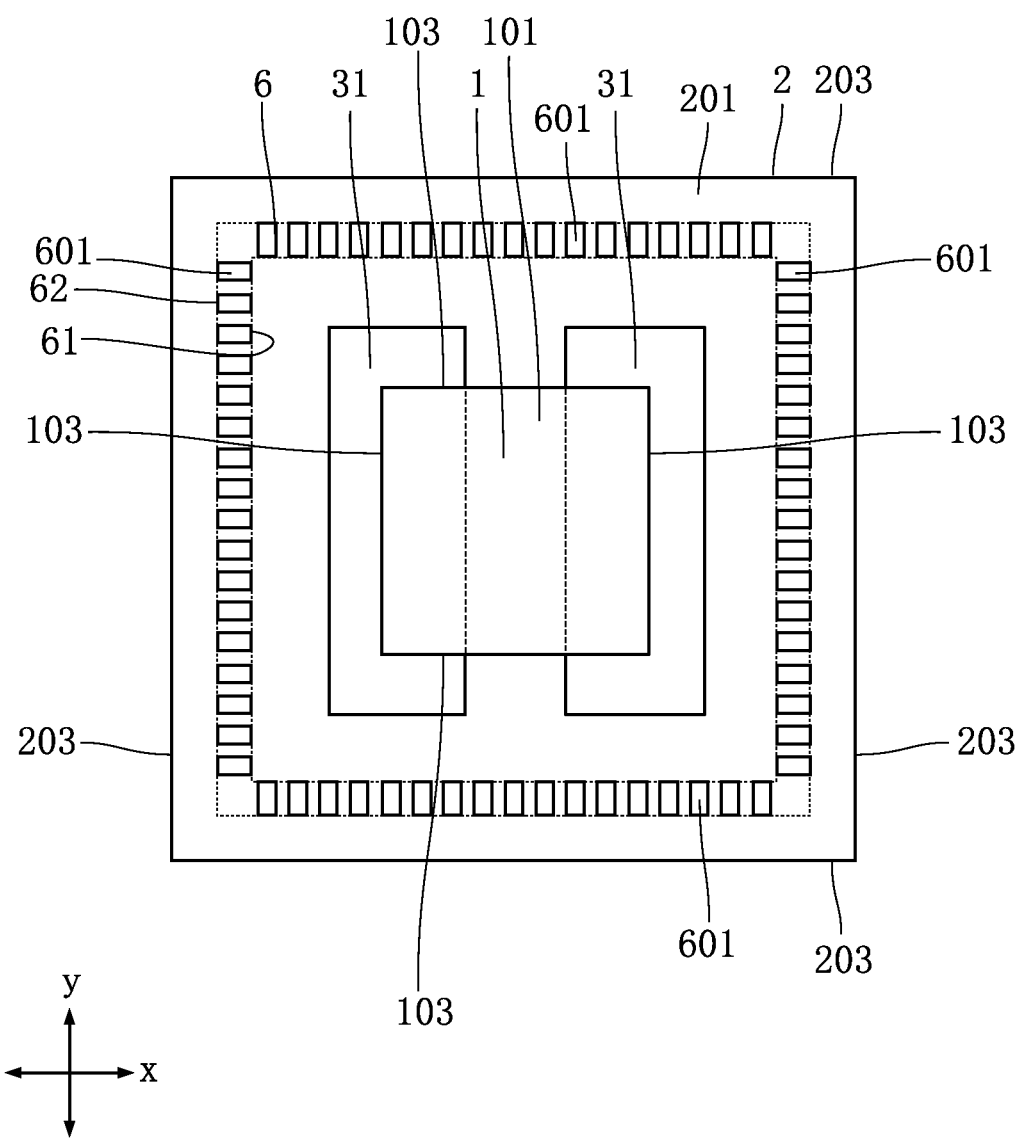
FIG. 32 is a plan view showing another example of the configuration of the frame-shaped member.

FIG. 32 shows an example in which a plurality of small metal pieces 601 having generally the same shape are arranged to form a rectangular ring as a frame-shaped member 6. Note that the metal pieces may be arranged to form a circular ring rather than a rectangular ring. In the example shown in FIG. 32, the metal pieces 601 are arranged such that the length $L_i$ of each metal piece 601 satisfies $L_i<\lambda/8$ (where λ is the wavelength of the terahertz waves) and the distance $S_i$ between metal pieces 601 satisfies $S_i \leq 2L_i$. Such a configuration of the metal pieces 601 allows the terahertz waves to be reflected by the inner peripheral surface 61 of the frame-shaped member 6 to produce resonance, i.e. allows the frame-shaped member 6 to stationarily function as a resonator. This leads to noise reduction and gain improvement of the terahertz waves emitted from the terahertz device A1 according to the present variation. Though the metal pieces 601 form a rectangular shape as viewed in plan in FIG. 32, the shape as viewed in plan may be any shape as long as it satisfies the condition described above.

FIGS. 33-38 show variations of the terahertz device A1 according to the first embodiment. In the variations described below, the elements that are identical or similar to those of the terahertz device A1 described above are denoted by the same reference signs as those used for the terahertz device A1, and the description thereof is omitted.

Figure 33:
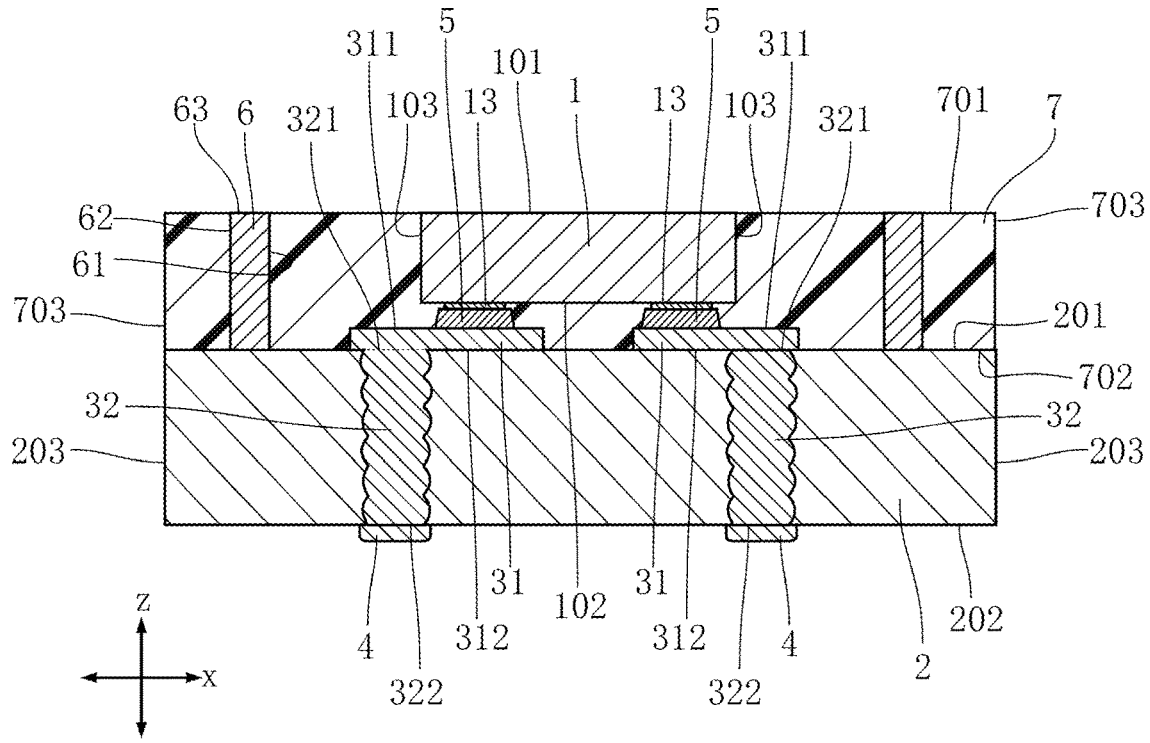
FIG. 33 is a sectional view of a terahertz device according to a first variation of the first embodiment.

FIG. 33 shows a terahertz device A2 according to a first variation of the first embodiment. FIG. 33 is a sectional view of the terahertz device A2 and corresponds to the section of the terahertz device A1 shown in FIG. 3. The terahertz device A2 of the first variation differs from the terahertz device A1 in that the element front surface 101 of the terahertz element 1 is exposed from the sealing resin 7.

In the terahertz device A2, the element front surface 101 of the terahertz element 1, which is exposed from the sealing resin 7 as described above, is flush with the resin front surface 701 and the top surface 63 of the frame-shaped member 6. The terahertz device A2 having such a configuration may be obtained by, after forming the sealing resin 870 in the sealing resin forming step (see FIGS. 16 and 17), grinding the sealing resin 870 from the resin front surface 870a until the element front surface 101 is exposed.

In the terahertz device A2, the element front surface 101 of the terahertz element 1 is exposed. That is, the element front surface 101 is not covered with the sealing resin 7. With such an arrangement, the absorption loss of terahertz waves due to the sealing resin 7 is reduced.

Figure 34:
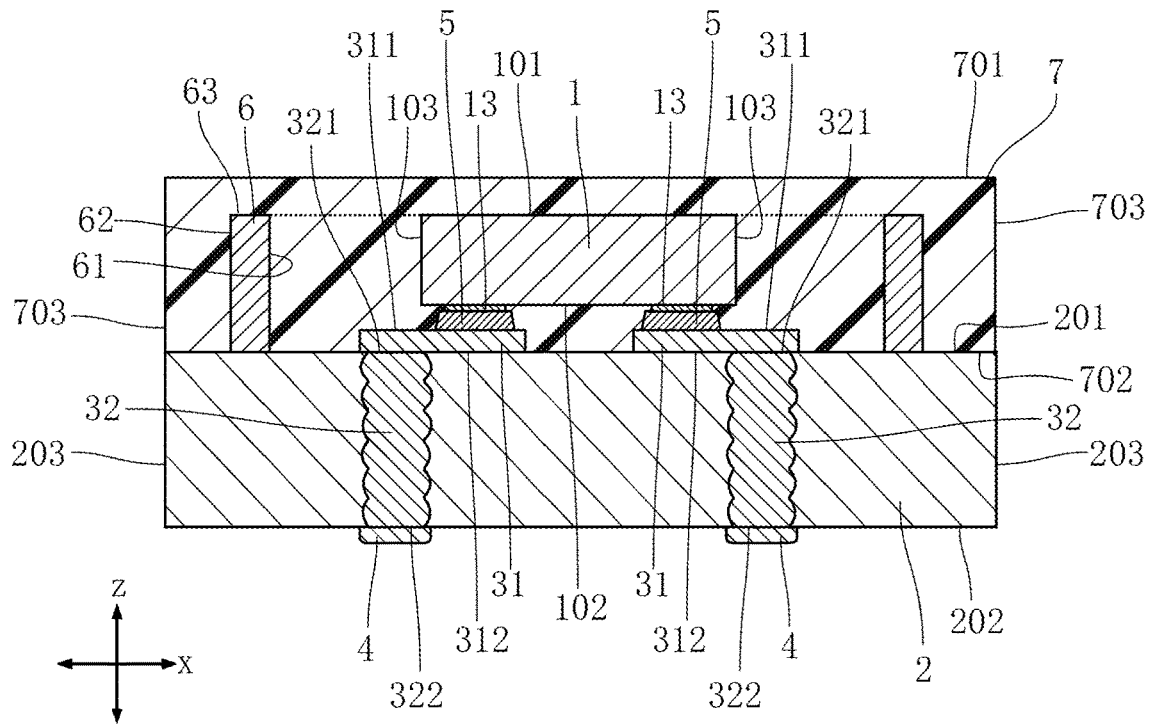
FIG. 34 is a sectional view of a terahertz device according to a second variation of the first embodiment.

FIG. 34 shows a terahertz device A3 according to a second variation of the first embodiment. FIG. 34 is a sectional view of the terahertz device A3 and corresponds to the section of the terahertz device A1 shown in FIG. 3. The terahertz device A3 of the second variation differs from the terahertz device A1 in that the upper surface (top surface 63) of the frame-shaped member 6 is covered with the sealing resin 7.

In the terahertz device A3, the top surface 63 of the frame-shaped member 6 is covered with the sealing resin 7, as described above. The terahertz device A2 having such a configuration may be obtained by, after forming the sealing resin 870 in the sealing resin forming step (see FIGS. 16 and 17), not grinding the sealing resin 870 at all or grinding the sealing resin from the resin front surface 870a to such a degree that the top surface of the frame-shaped member 860 is not exposed.

Figure 35:
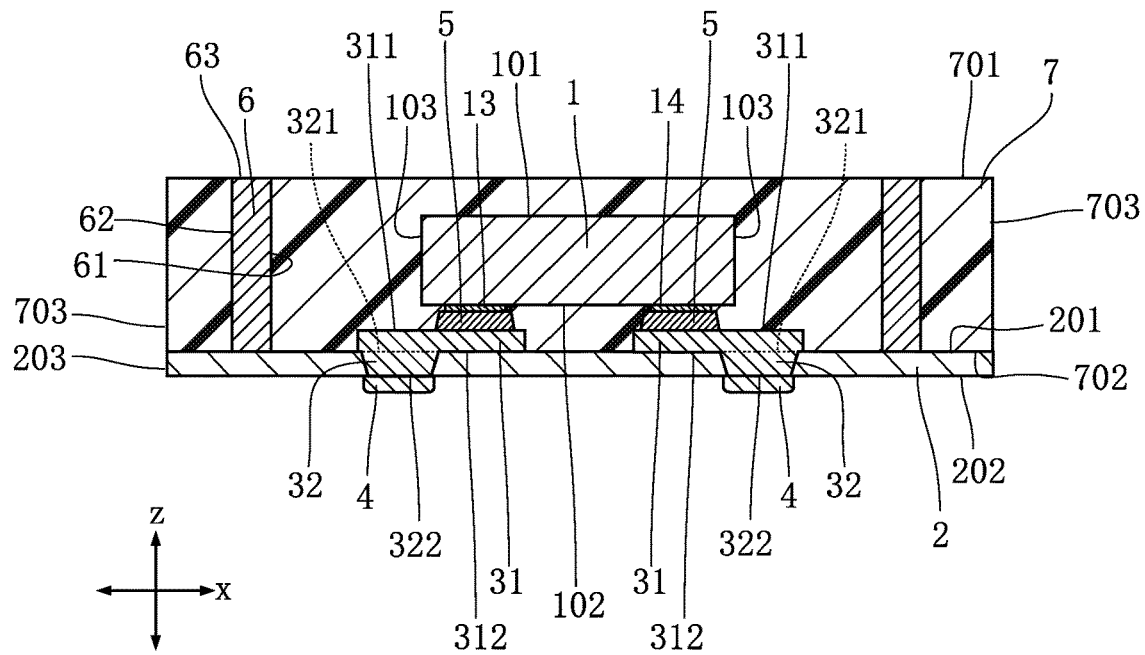
FIG. 35 is a sectional view of a terahertz device according to a third variation of the first embodiment.

FIG. 35 shows a terahertz device A4 according to a third variation of the first embodiment. FIG. 35 is a sectional view of the terahertz device A4 and corresponds to the section of the terahertz device A1 shown in FIG. 3. The terahertz device A4 of the third variation differs from the terahertz device A1 in shape of the through-holes 21.

In the terahertz device A4, the inner wall of each through-hole 21 is inclined such that the cross section of the through-hole orthogonal to the z direction becomes smaller as progressing from the support-board front surface 201 toward the support-board back surface 202 of the support board 2. The through-holes 21 may be formed by e.g. anisotropic etching, and the inclination angle of the inner walls with respect to the support-board back surface 202 is about 54.7°. Since the through electrodes 32 are formed so as to fill the through-holes 21, the shape of the through electrodes 32 of the terahertz device A4 also differs from the shape of the through electrodes 32 of the terahertz device A1.

Figure 36:
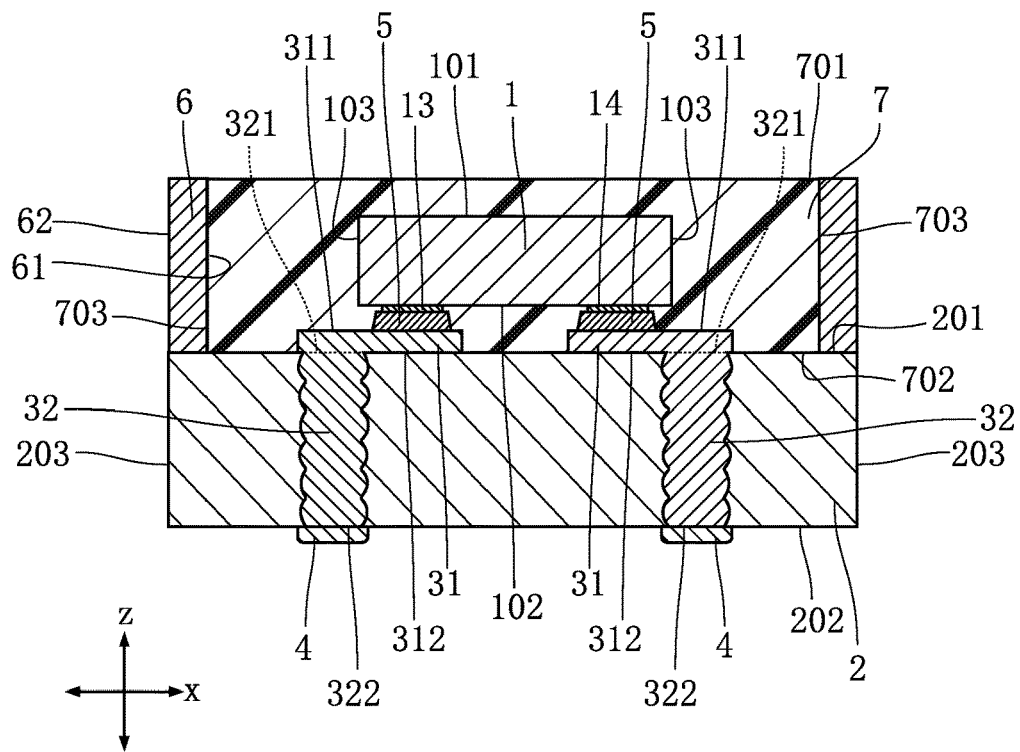
FIG. 36 is a sectional view of a terahertz device according to a fourth variation of the first embodiment.

FIG. 36 shows a terahertz device A5 according to a fourth variation of the first embodiment. FIG. 36 is a sectional view of the terahertz device A5 and corresponds to the section of the terahertz device A1 shown in FIG. 3. The terahertz device A6 of the fourth variation differs from the terahertz device A1 in that the outer peripheral surface 62 of the frame-shaped member 6 is exposed from the sealing resin 7. In the terahertz device A5, the sealing resin 7 is formed on the inner side of the frame-shaped member 6 and is not formed on the outer side of the frame-shaped member. With such an arrangement, the size of the terahertz device A5 in plan view is reduced. That is, the terahertz device A5 can be made compact.

Figure 37:
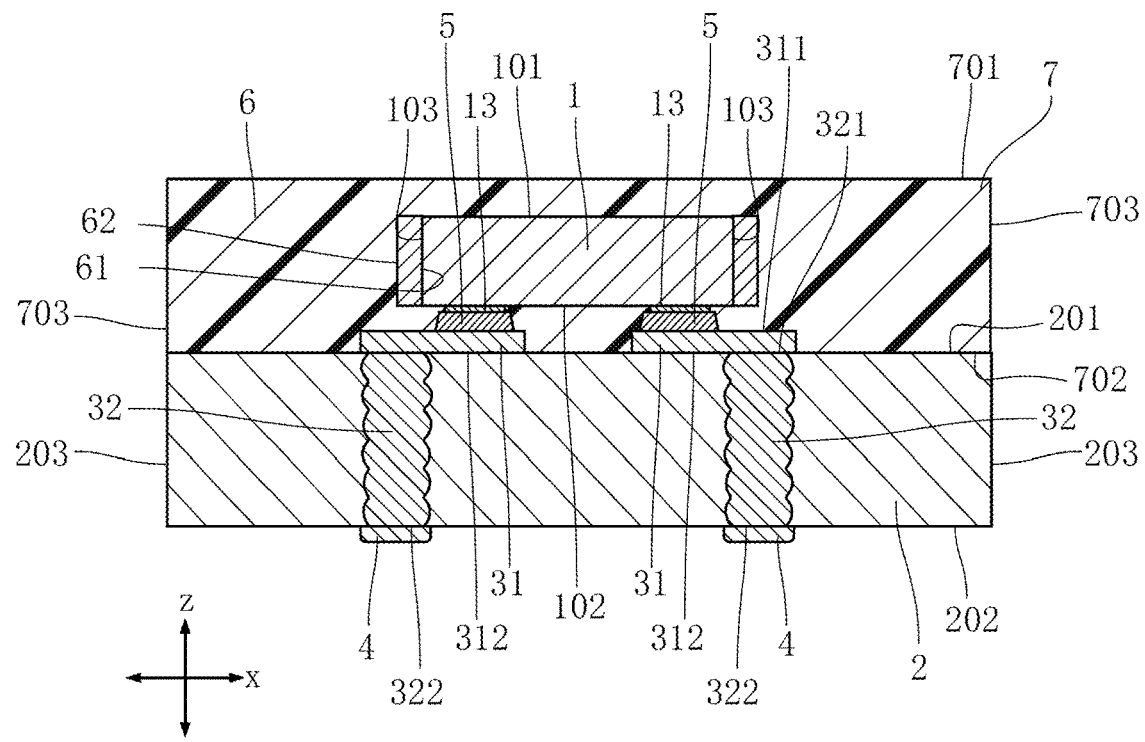
FIG. 37 is a sectional view of a terahertz device according to a fifth variation of the first embodiment.

FIG. 37 shows a terahertz device A6 according to a fifth variation of the first embodiment. FIG. 37 is a sectional view of the terahertz device A6 and corresponds to the section of the terahertz device A1 shown in FIG. 3. The terahertz device A6 of the fifth variation differs from the terahertz device A1 in that the frame-shaped member 6 is formed in contact with the element side surfaces 103. In the terahertz device A6, the frame-shaped member 6 is in contact with the element side surfaces 103 of the terahertz element 1. Thus, as viewed in plan, the inner periphery of the frame-shaped member 6 and the outer periphery of the terahertz element 1 generally correspond to each other.

Figure 38:
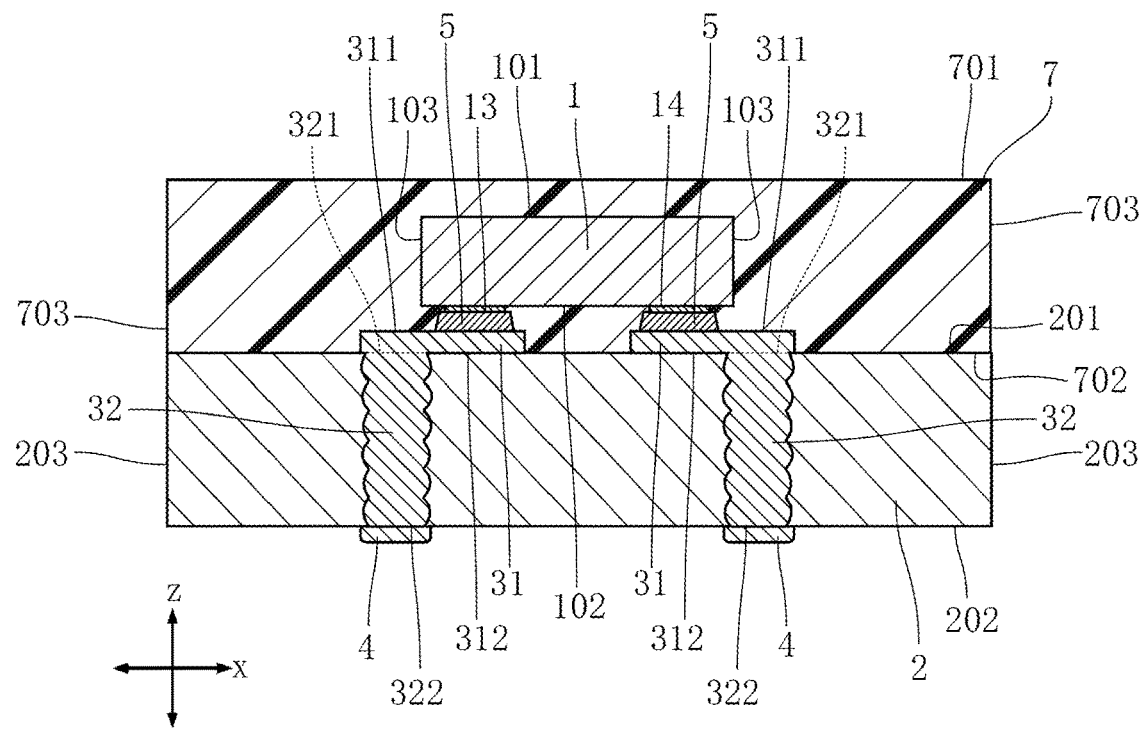
FIG. 38 is a sectional view of a terahertz device according to a sixth variation of the first embodiment.

FIG. 38 shows a terahertz device A7 according to a sixth variation of the first embodiment. FIG. 38 is a sectional view of the terahertz device A7 and corresponds to the section of the terahertz device A1 shown in FIG. 3. The terahertz device A7 of the sixth variation differs from the terahertz device A1 in that terahertz device A7 does not include the frame-shaped member 6.

In all terahertz devices A2-A7 of the first through the sixth variations of the first embodiment, at least part of the terahertz element 1 is covered with the sealing resin 7. Thus, as with the first embodiment, malfunctions due to influences from the outside are reduced. Also, since the terahertz devices A2-A6 of the first through the fifth variations are provided with frame-shaped members, disturbance noise and crosstalk are reduced. Moreover, in the terahertz devices A2-A5 according to the first through the fourth variations, terahertz waves are reflected by the inner peripheral surface 61 of the frame-shaped member 6 to produce resonance, which leads to noise reduction and gain improvement of the terahertz waves emitted from the terahertz devices A2-A5.

Figure 39:
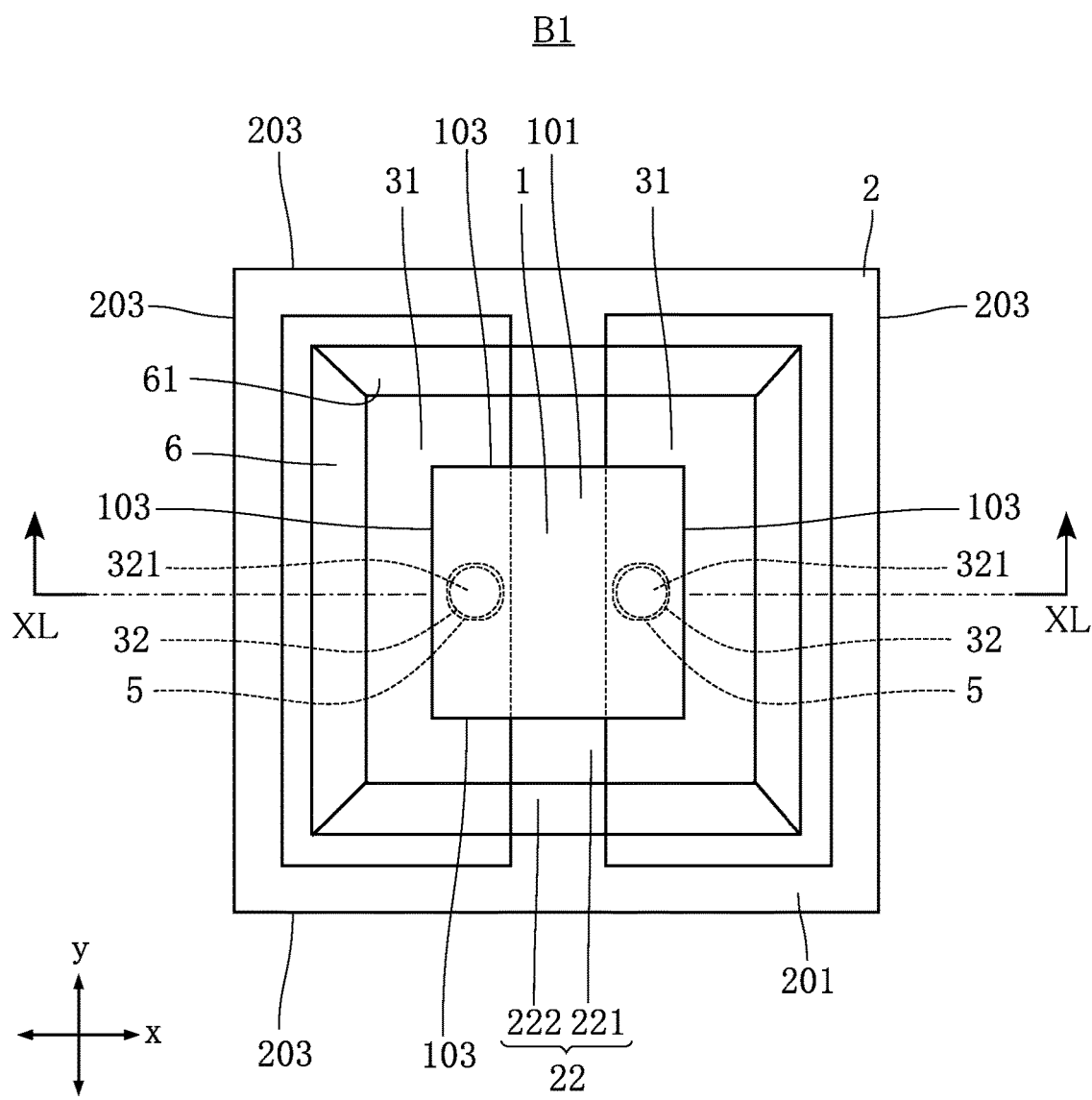
FIG. 39 is a plan view of a terahertz device according to a second embodiment.
Figure 40:
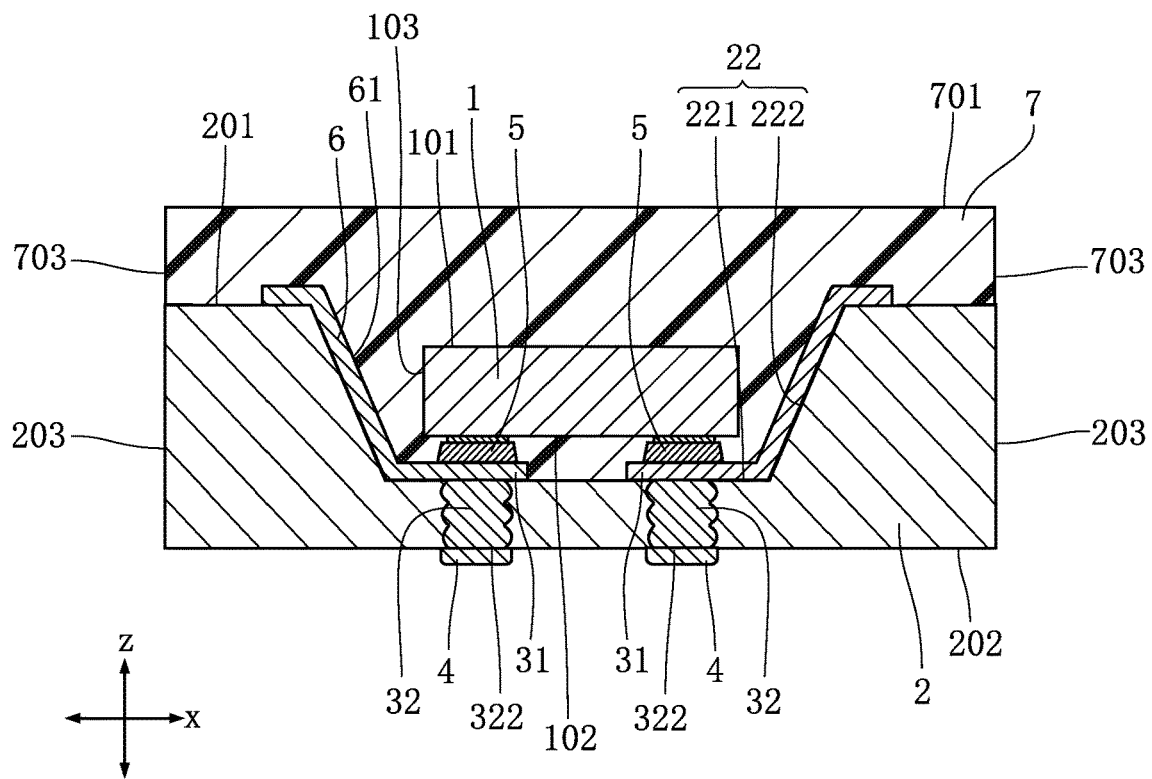
FIG. 40 is a sectional view taken along line XL-XL in FIG. 39.

FIGS. 39 and 40 show a terahertz device B1 according to a second embodiment. In the embodiments described below, the elements that are identical or similar to those of the terahertz device A1 described above are denoted by the same reference signs as those used for the terahertz device A1, and the description thereof is omitted. As the difference from the terahertz device A1, the support board 2 of the terahertz device B1 of the second embodiment is formed with a depression, in which the terahertz element 1 is housed. The depression corresponds to a recess 22 described later.

FIG. 39 is a plan view of the terahertz element B1. Note that the illustration of the sealing resin 7 is omitted in FIG. 39. FIG. 40 is a sectional view taken along line XL-XL in FIG. 39.

As shown in FIG. 40, the support board 2 has a recess 22. The recess 22 is formed so as to dent from the support-board front surface 201 toward the support-board back surface 202. The recess 22 does not penetrate the support board 2 in the z direction. The recess 22 may be formed by e.g. anisotropic etching. The recess 22 houses at least part of the terahertz element 1. In the present embodiment, the recess 22 houses the entirety of the terahertz element 1, as shown in FIGS. 39 and 40. That is, the depth of the recess 22 (dimension in the z direction) is larger than the dimension of the terahertz element 1 in the z direction. The shape of the recess 22 as viewed in plan is rectangular in the example shown in FIG. 39, but is not limited to this and may be circular, for example. The recess 22 has a bottom surface 221 and a connecting surface 222.

The bottom surface 221 is the surface on which the terahertz element 1 is mounted. The bottom surface 221 is orthogonal to the z direction. The bottom surface 221 is flat. The bottom surface 221 faces the element back surface 102. In the present embodiment, the wiring layers 31 are formed on the bottom surface 221.

The connecting surface 222 is connected to the support-board front surface 201 and the bottom surface 221, as shown in FIG. 40. The connecting surface 222 is connected to the support-board front surface 201 at one edge in the z direction (upper edge in FIG. 40) and connected to the bottom surface 221 at the other edge in the z direction (lower edge in FIG. 40). The connecting surface 222 is inclined with respect to the bottom surface 221. The support-board front surface 201 is a (100) surface, so that the connecting surface 222 is a (111) surface. Accordingly, the connecting surface 222 has an inclination angle of about 54.7° with respect to the bottom surface 221.

As shown in FIG. 40, the frame-shaped member 6 is formed so as to cover the connecting surface 222. The frame-shaped member 6 is inclined with respect to the z direction. The inner peripheral surface 61 of the frame-shaped member 6 is also inclined with respect to the z direction. The frame-shaped member 6 is connected to and formed integrally with the wiring layers 31. In an example, in the first plating layer forming step described above, the wiring layers 31 are formed, and the frame-shaped member 6 is also formed at the same time.

Since the terahertz element 1 of the terahertz device B1 is covered with the sealing resin 7 as with the first embodiment, the terahertz element 1 is protected from influences from the outside. In this way, the terahertz device B1 has a packaging structure that allows for modularization of the terahertz element 1 with improved reliability.

In the terahertz device B1, the frame-shaped member 6 is arranged so as to surround the terahertz element 1, as with the first embodiment. With such an arrangement, the frame-shaped member 6 functions as an electromagnetic shield, so that the terahertz device B1 can reduce problems such as disturbance noise or crosstalk. In this way, the terahertz device B1 has a packaging structure that allows for modularization of the terahertz element 1 with improved emission or reception quality of terahertz waves.

In the terahertz device B1, the inner peripheral surface 61 of the frame-shaped member 6 is inclined with respect to the z direction. Thus, the frame-shaped member 6 cannot cause resonance of the terahertz waves from the terahertz element 1. That is, the frame-shaped member 6 cannot function as a resonator. However, the frame-shaped member 6 can function as a horn antenna by using the inclination of the inner peripheral surface 61.

Figure 41:
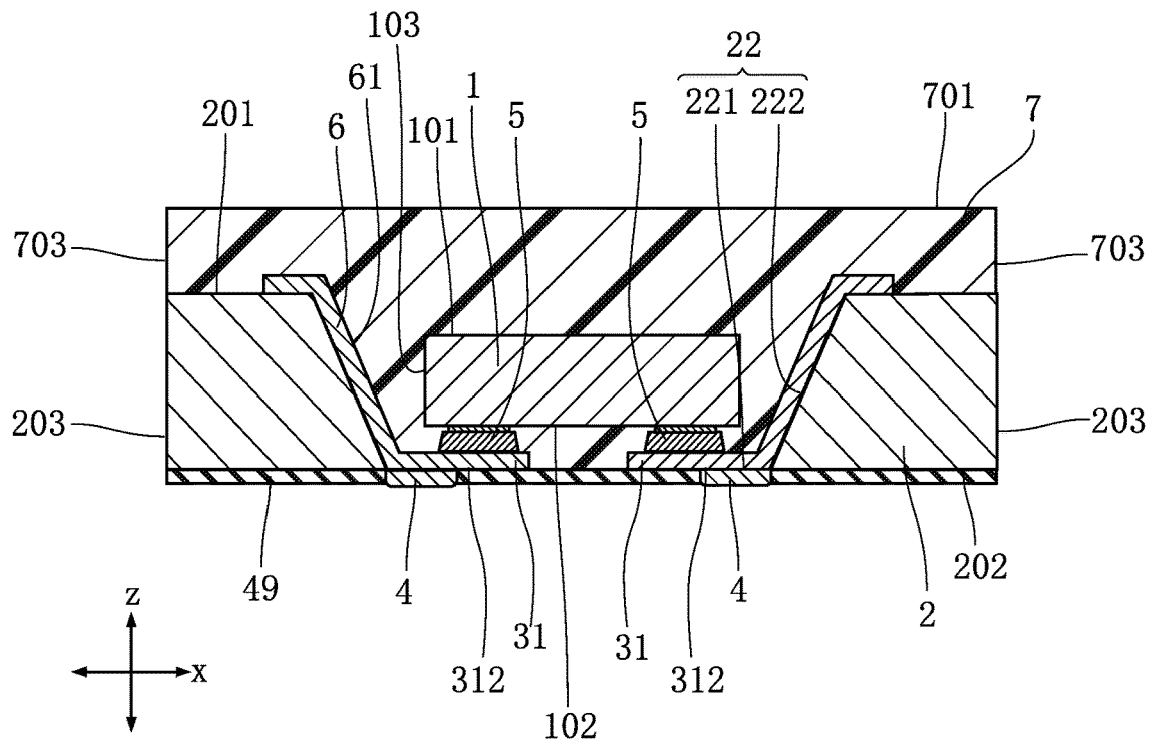
FIG. 41 is a sectional view of a terahertz device according to a variation of the second embodiment.

FIG. 41 shows a variation of the terahertz device B1 according to the second embodiment. FIG. 41 is a sectional view of a terahertz device B2 according to a variation of the second embodiment, and corresponds to the section of the terahertz device B1 shown in FIG. 40. The terahertz device B2 of this variation differs from the terahertz device B1 in that the terahertz device B2 does not include the through electrodes 32.

In the terahertz device B2, the external electrodes 4 are in contact with the wiring-layer back surfaces 312 of the wiring layers 31 and electrically connected to the wiring layers 31 directly. As shown in FIG. 41, the wiring-layer back surfaces 312 are exposed from the support board 2, so that an insulating film 49 is provided to prevent undesired short circuit between conductors or deterioration of the wiring layers 31. The insulating film 49 covers the support-board back surface 202 and the wiring-layer back surfaces 312.

The terahertz device B2 provides the same advantages as those of the terahertz device B1. Moreover, the terahertz device B2 can reduce the dimension of the support board 2 in the z direction as compared with the terahertz device B1. Thus, the terahertz device B2 can be made thinner than the terahertz device B1.

Figure 42:
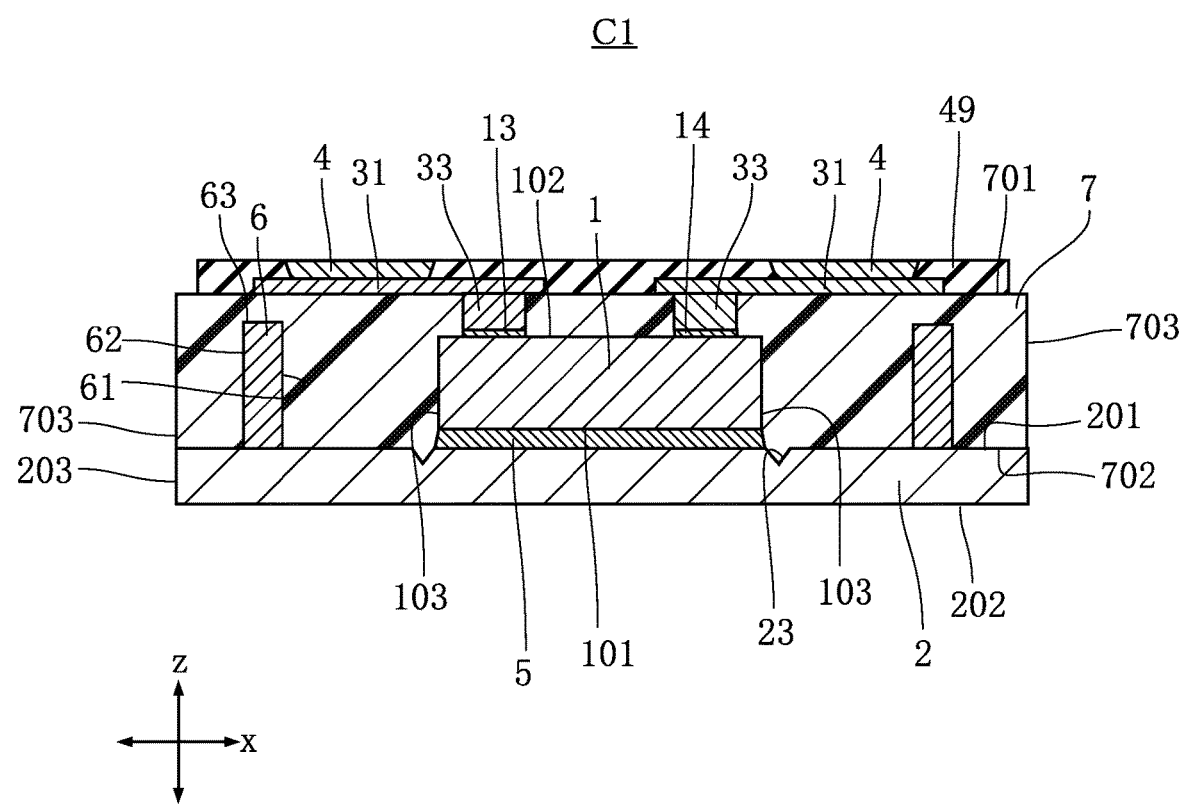
FIG. 42 is a sectional view of a terahertz device according to a third embodiment.

FIG. 42 shows a terahertz device C1 according to a third embodiment. FIG. 42 is a sectional view of the terahertz device C1 and corresponds to the section of the terahertz device A1 shown in FIG. 3. The terahertz device C1 of the third embodiment differs from the terahertz device A1 mainly in that the support board 2 is arranged in proximity to the element front surface 101 as shown in FIG. 42. When the terahertz device C1 is mounted on e.g. a circuit board, the upper side in FIG. 42 faces the circuit board.

In the terahertz device C1, the terahertz element 1 is bonded to the support board 2, with the element front surface 101 facing the support-board front surface 201 of the support board 2.

The support board 2 is formed with grooves 23. The grooves 23 may serve as a mark showing the mount position for use in mounting the terahertz element 1 or prevent the bonding layers 5 from unduly spreading. Note that the grooves 23 are not necessarily required and may be provided as appropriate.

As shown in FIG. 42, the bonding layer 5 is interposed between the element front surface 101 of the terahertz element 1 and the support-board front surface 201 of the support board 2 to bond the terahertz element 1 to the support board 2. In the present embodiment, unlike the first embodiment, the bonding layer 5 does not need to be a material capable of providing electrical connection, and may be any material capable of bonding the terahertz element 1 to the support board 2. Examples of such a material include DAF (Die Attach Film), Ag paste and solder paste. When DAF is used as the bonding layer 5, the grooves 23 may not be formed.

As shown in FIG. 42, the wiring layers 31 are formed on the resin front surface 701 rather than on the support-board front surface 201 of the support board 2. The terahertz device C1 includes an insulating film 49 covering the wiring layers 31. The insulating film 49 is formed with openings to expose parts of the wiring layers 31, and the external electrodes 4 are formed in the openings. As shown in FIG. 42, in the openings of the insulating film 49, the external electrodes 4 are in contact with the wiring layers 31 and hence electrically connected to the wiring layers 31 directly.

The terahertz device C1 includes columnar electrodes 33 electrically connecting one of the wiring layers 31 with the first conductive layer 13 of the terahertz element 1, and the other one of the wiring layers 31 with the second conductive layer 14 of the terahertz element 1, respectively. The columnar electrodes 33 are made of a conductive material such as Cu. The columnar electrodes 33 are formed on the terahertz element 1 before the terahertz element 1 is mounted on the support board 2.

In the terahertz device C1, the terahertz waves radiated from the terahertz element 1 are emitted through the support board 2. Loss of terahertz waves can be prevented by making the support board 2 from a high-resistance material with an electrical resistivity of about 5000 Ω·cm or more.

An example of a method for manufacturing the terahertz device C1 is described below with reference to FIGS. 43-51. FIGS. 43-51 are sectional views showing the steps of a method for manufacturing the terahertz device C1. These sectional views correspond to the section shown in FIG. 42.

Figure 43:
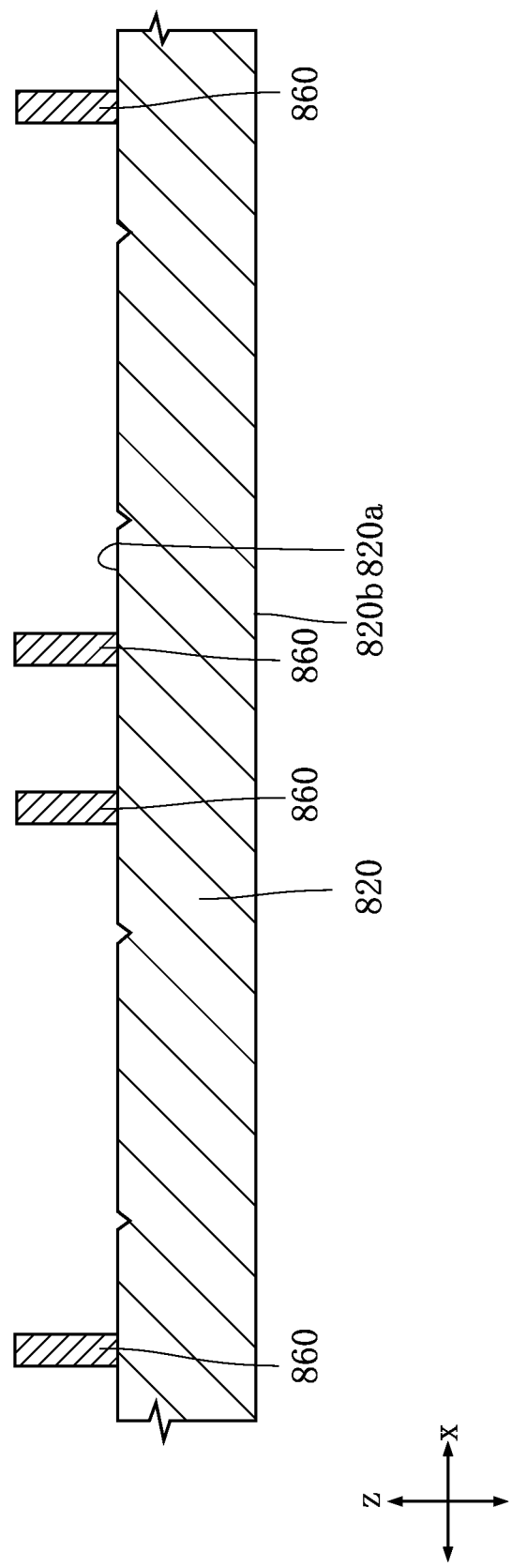
FIG. 43 is a sectional view showing a step of a method for manufacturing the terahertz device according to the third embodiment.

First, a support board 820 is prepared, and grooves 823 are formed in the prepared support board 820, as shown in FIG. 43. The grooves 823 will later become the grooves 23 of the terahertz device C1. The support board 820 prepared in this step is the same as the support board 820 prepared in the support board preparation step according to the first embodiment. In the subsequent step of forming the grooves 823 (groove forming step), after a silicon oxide film is formed on the entirety of the support-board front surface 820a, a resist is formed to have a predetermined pattern by photolithography. In this state, part of the silicon oxide film is exposed from the patterned resist. The part of the silicone oxide film exposed from the resist is removed by reactive ion etching. As a result, part of the support board 820 is exposed from the silicon oxide film. The part of the support board 820 exposed from the silicon oxide film is etched away by using KOH (potassium hydroxide) or THAM (tetramethyl ammonium hydroxide), whereby the grooves 823 are formed. Thereafter, the resist and the silicon oxide film are removed. The removal of the silicon oxide film may be performed by wet etching, for example. As the etching solution for wet etching, use may be made of a mixed solution, called BHF, of hydrofluoric acid and ammonium fluoride.

Figure 44:
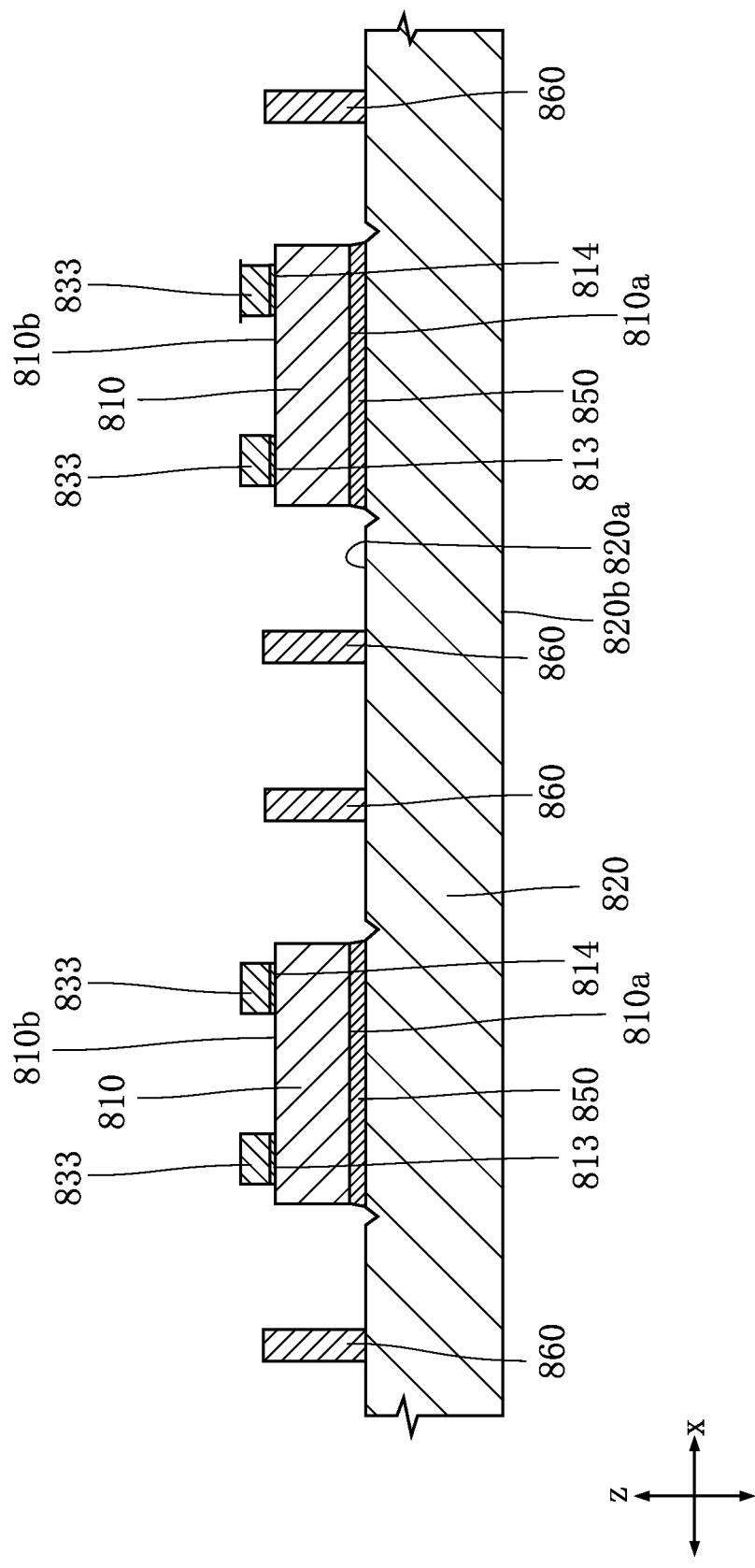
FIG. 44 is a sectional view showing a step of the method for manufacturing the terahertz device according to the third embodiment.

Next, a frame-shaped member 860 is formed, as shown in FIG. 44. In the step of forming the frame-shaped member 860 (frame-shaped member forming step) shown in FIG. 44, a base layer (not shown) is formed by sputtering on the entire surface of the support-board front surface 820a of the support board 820 and the grooves 823. The base layer is a laminate of a Ti layer and a Cu layer. Next, a resist (not shown) for forming the frame-shaped member 860 is formed to have a predetermined pattern by photolithography. When a resist having a pattern is formed in this way, part of the base layer is exposed from the resist. The part exposed from the resist is the region on which the frame-shaped member 860 is to be formed. Next, electrolytic plating is performed using the base layer as a conduction path to form a plating layer. The plating layer is deposited on the part of the base layer that is exposed from the resist. The plating layer is made of Cu, for example. Thereafter, the unnecessary resist is removed, whereby the frame-shaped member 860 made up of the base layer and the plating layer is obtained.

Figure 45:
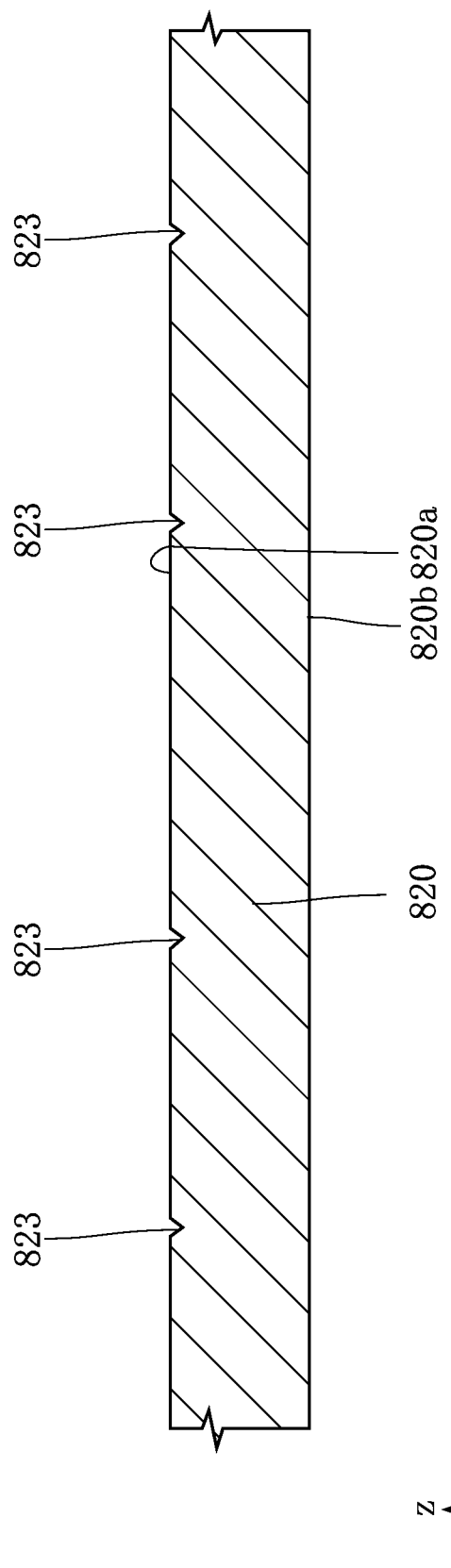
FIG. 45 is a sectional view showing a step of the method for manufacturing the terahertz device according to the third embodiment.

Next, as shown in FIG. 45, a terahertz element 810 is mounted on the support board 820 by using the bonding layer 850. In the step of mounting the terahertz element 810 (element mounting step) shown in FIG. 45, the terahertz element 810 is mounted on the support board 820, with the element front surface 810a facing the support-board front surface 820a. In this state, the bonding layers 850 are sandwiched between the element front surface 810a and the support-board front surface 820a. In this element mounting step, DAF is used as the bonding layers 850. Note that the terahertz element 810 mounted in the element mounting step has columnar electrodes 833 on the first conductive layer 813 and the second conductive layer 814. That is, as a preparation for the element mounting step, columnar electrodes 833 are formed on the first conductive layer 813 and the second conductive layer 814 of the terahertz element 810.

Figure 46:
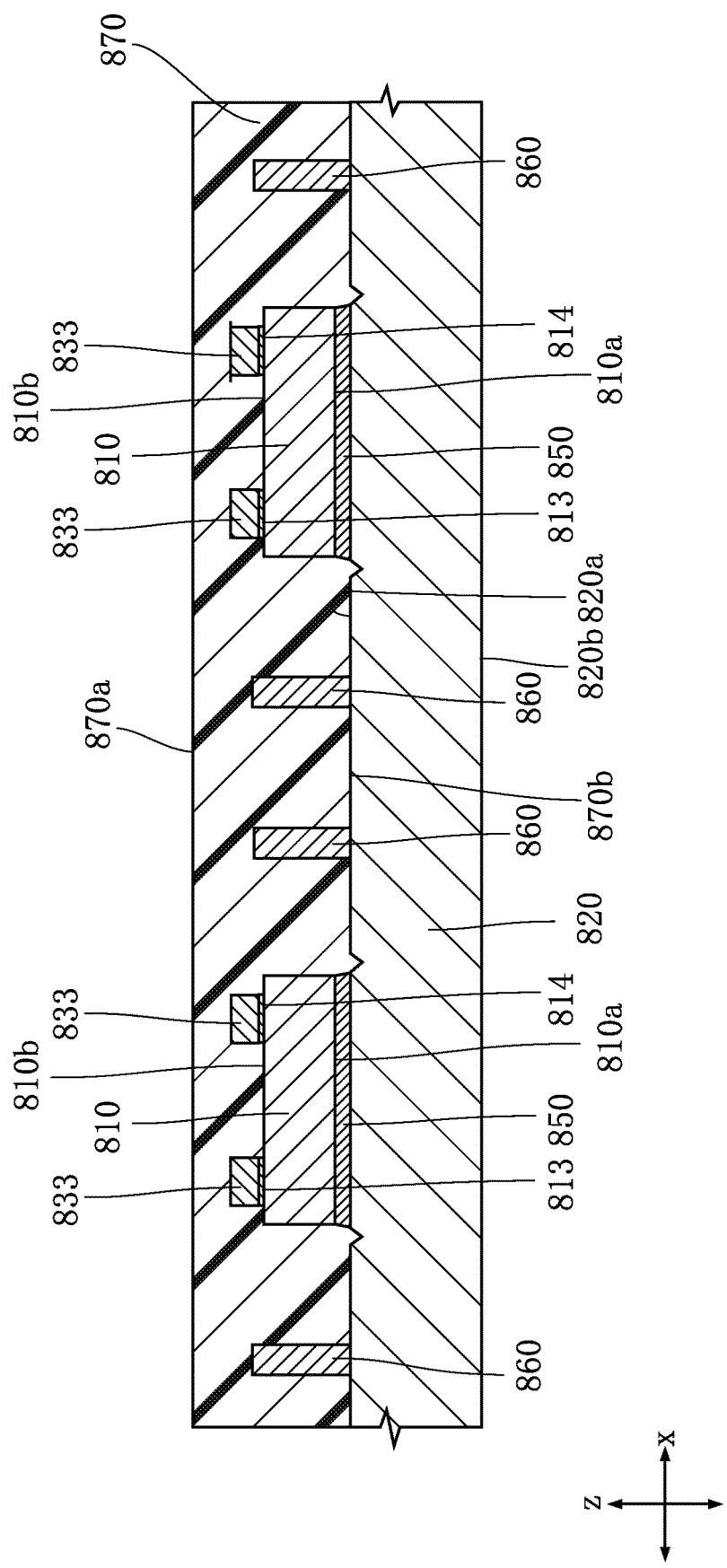
FIG. 46 is a sectional view showing a step of the method for manufacturing the terahertz device according to the third embodiment.
Figure 47:
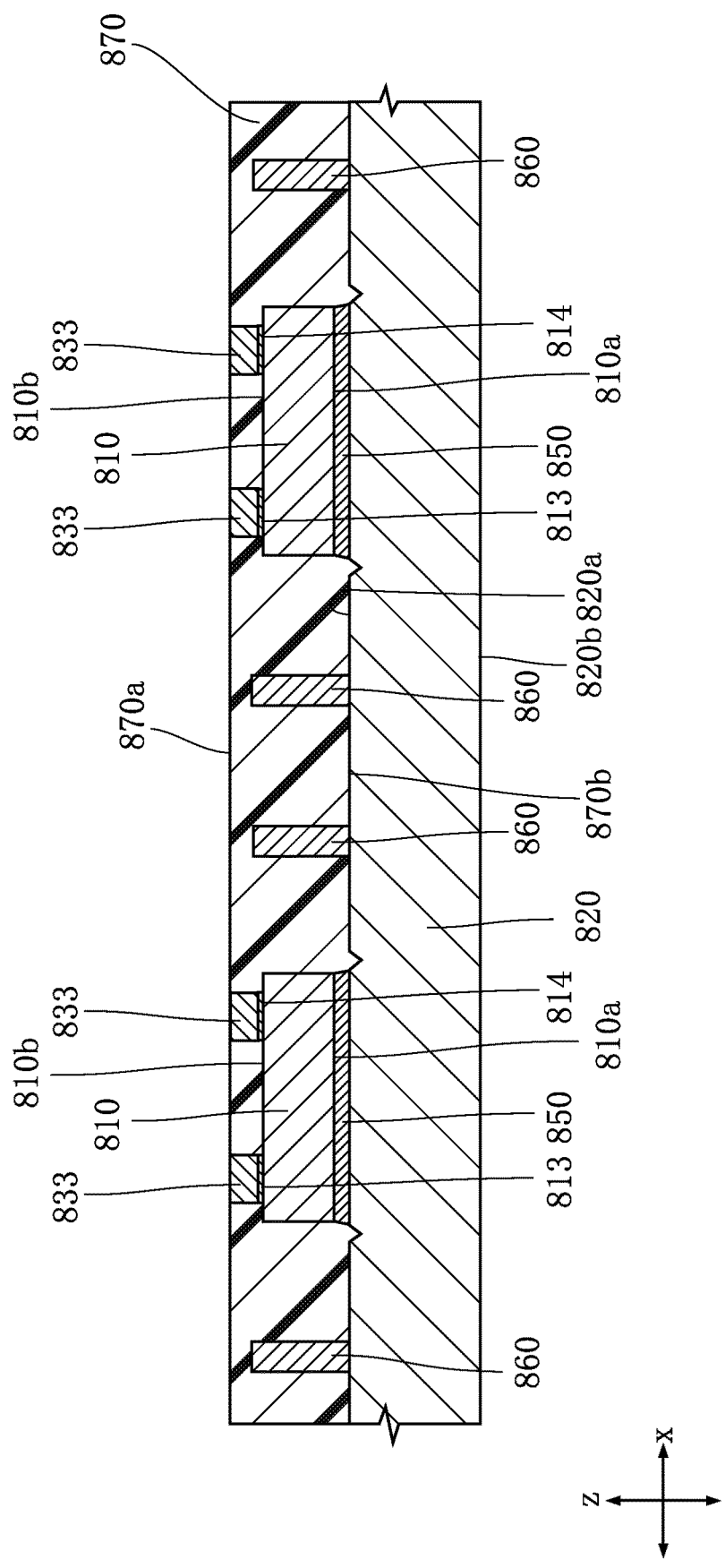
FIG. 47 is a sectional view showing a step of the method for manufacturing the terahertz device according to the third embodiment.

Next, as shown in FIGS. 46 and 47, a sealing resin 870 is formed to cover the terahertz element 810 and the frame-shaped member 860. In the present embodiment, in the step of forming the sealing resin 870 (sealing resin forming step), the sealing resin 870 is applied on the support-board front surface 820a of the support board 820 so as to cover all of the columnar electrodes 833 of the terahertz element 810 and the frame-shaped member 860, as shown in FIG. 46. Next, as shown in FIG. 47, the sealing resin 870 is ground from the resin front surface 870a toward the resin back surface 870b until the columnar electrodes 833 are exposed. The technique for grinding the sealing resin 870 is the same as the first embodiment. This grinding makes the upper surfaces of the columnar electrodes 833 and the resin front surface 870a flush with each other, while also exposing the upper surfaces of the columnar electrodes 833 from the sealing resin 870.

Figure 48:
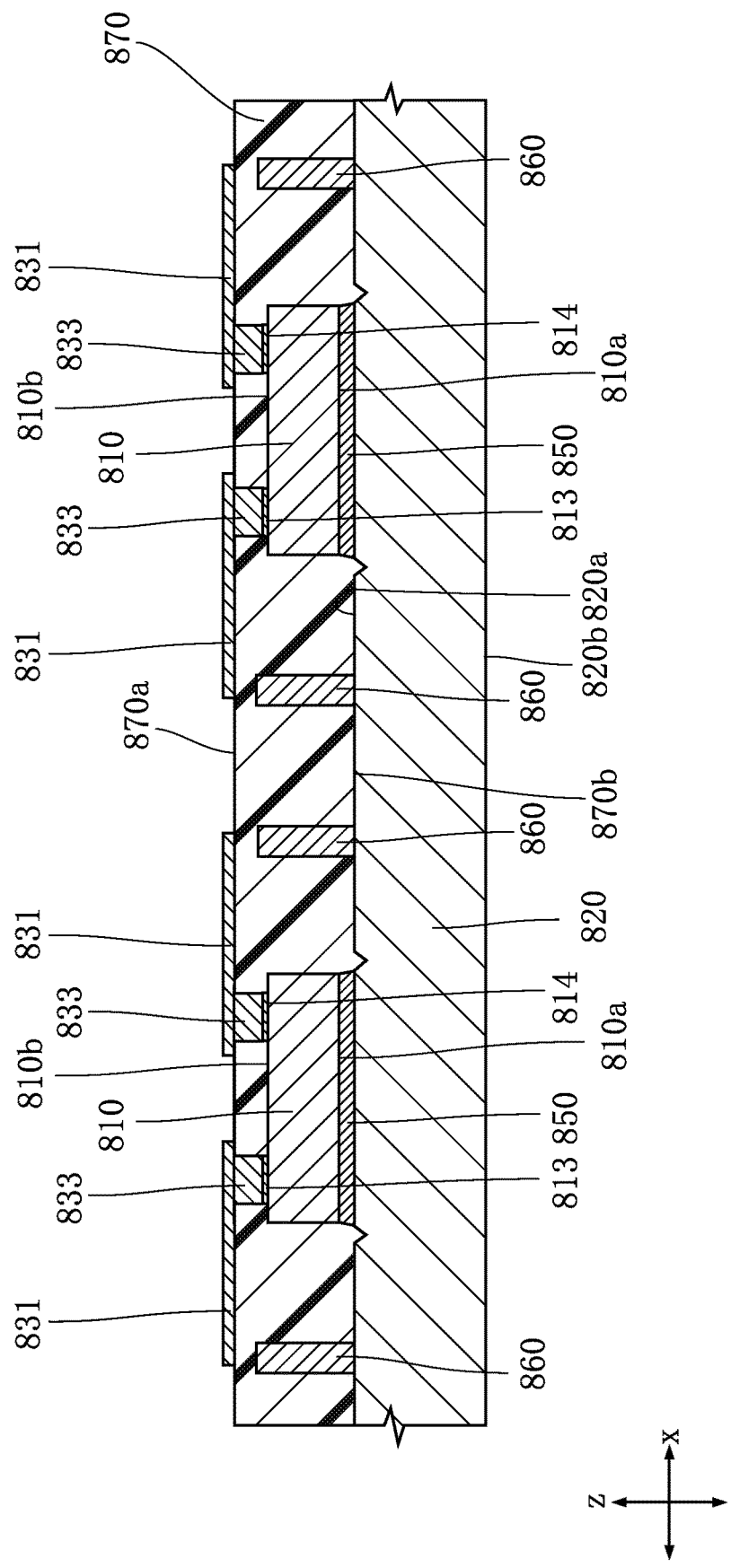
FIG. 48 is a sectional view showing a step of the method for manufacturing the terahertz device according to the third embodiment.

Next, wiring layers 831 are formed, as shown in FIG. 48. The step of forming the wiring layers 831 (wiring layer forming step) is performed generally in the same manner as the frame-shaped member forming step. Specifically, in the wiring layer forming step, a base layer is first formed so as to cover all of the resin front surface 870a and the upper surfaces of the columnar electrodes 833. Next, after a resist having a predetermined pattern is formed on the base layer, electrolytic plating by using the base layer as a conduction path is performed to deposit a plating layer on the part of the base layer that is exposed from the resist. Thereafter, the unnecessary resist is removed, whereby the wiring layers 831 made up of the base layer and the plating layer is obtained.

Figure 49:
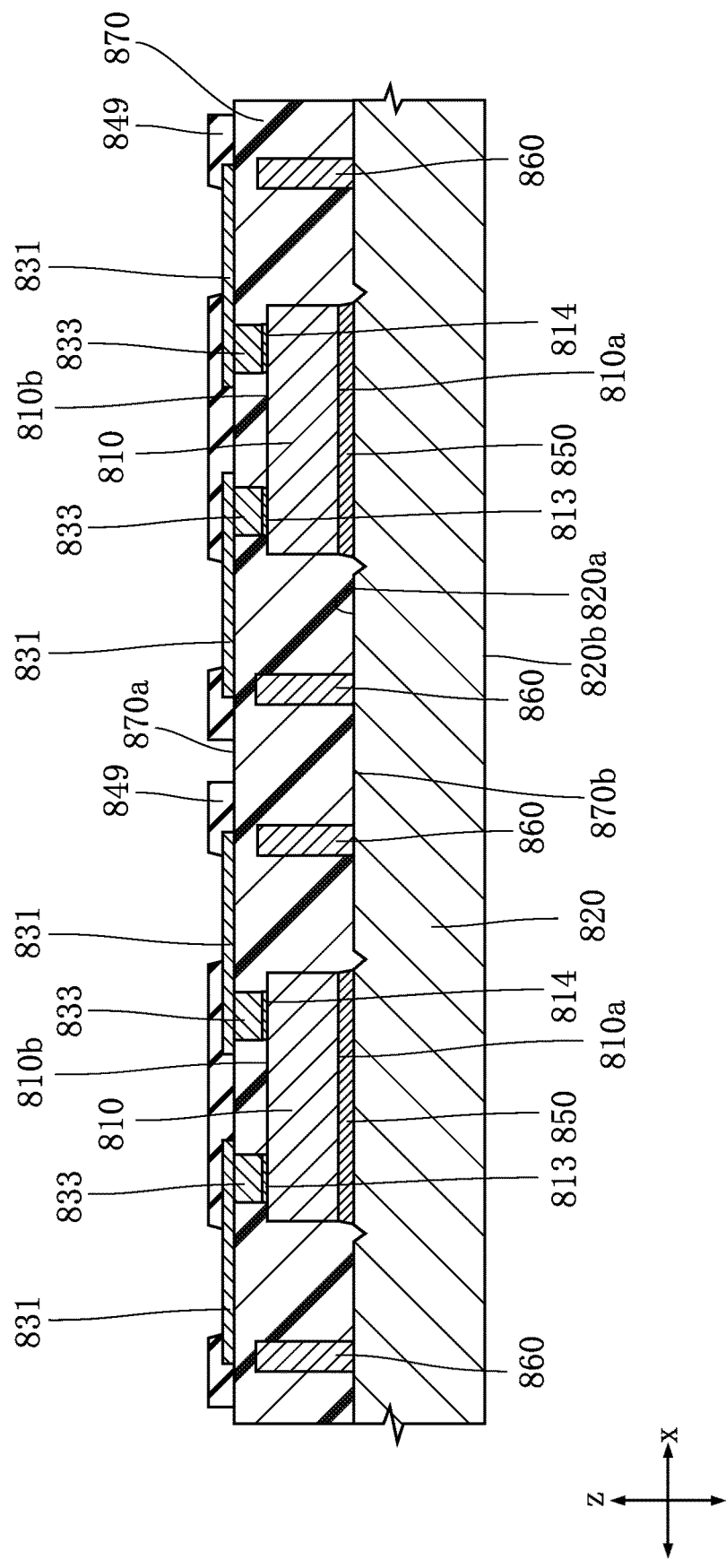
FIG. 49 is a sectional view showing a step of the method for manufacturing the terahertz device according to the third embodiment.

Next, an insulating layer 849 is formed, as shown in FIG. 49. In the step of forming the insulating layer 849 (insulating layer forming step), the insulating layer 849 is first applied so as to cover the entirety of the wiring layers 831. Next, to later form the external electrodes 840, part of the insulating layer 849 is removed to expose the wiring layers 831 from the removed part. Such removal of the insulating layer 849 may be performed by etching, for example. As the material for the insulating layer 849, polymer-based resin may be used, for example.

Figure 50:
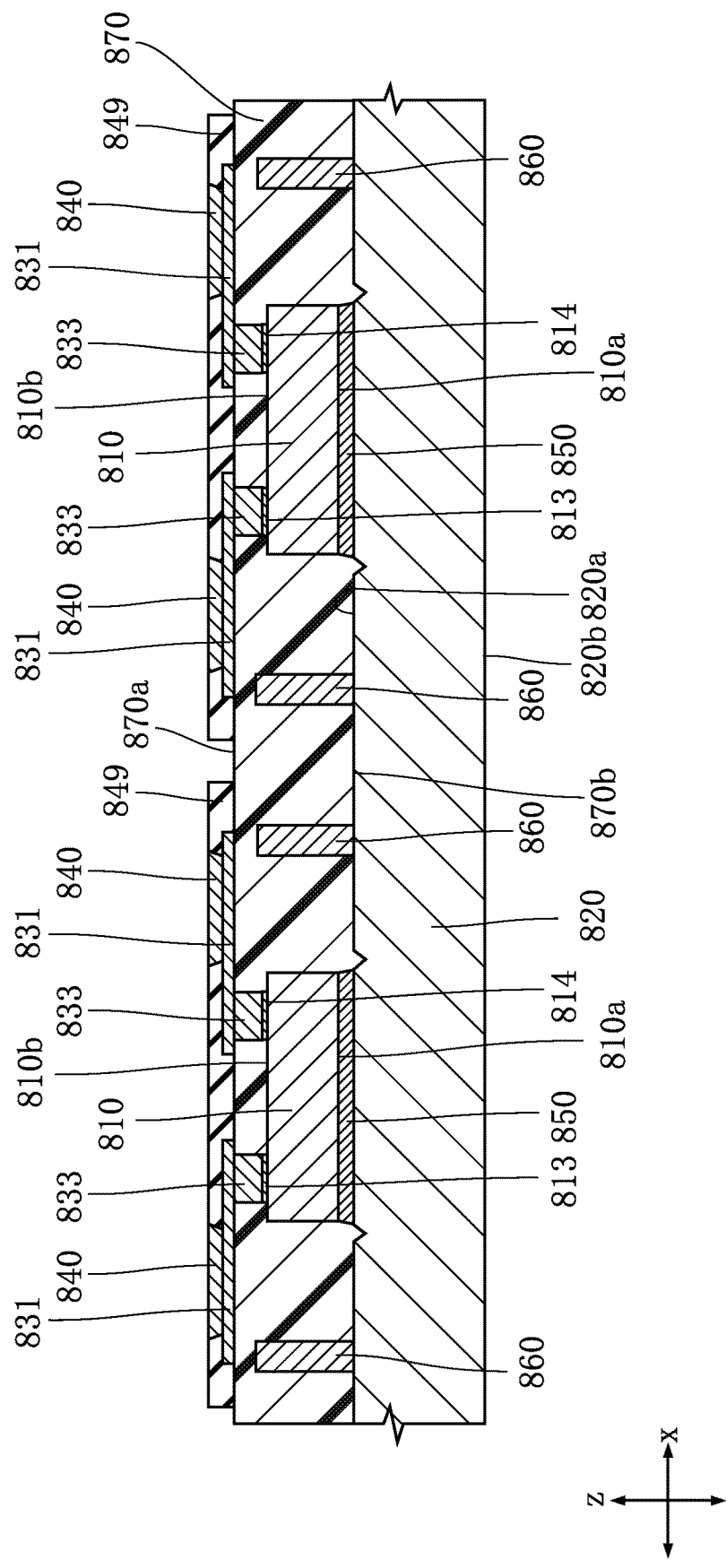
FIG. 50 is a sectional view showing a step of the method for manufacturing the terahertz device according to the third embodiment.

Next, the external electrodes 840 are formed, as shown in FIG. 50. The step of forming the external electrodes 840 (external electrode forming step) is performed by electroless plating, as with the external electrode forming step of the first embodiment. Specifically, a Ni layer, a Pd layer and a Au layer are successively deposited on the parts of the wiring layers 831 that are exposed from the insulating layer 849. The technique for forming the external electrodes 840 is not limited to this. For example, as the external electrodes 840, solder bumps may be formed on the parts of the wiring layers 831 that are exposed from the insulating layer 849.

Figure 51:
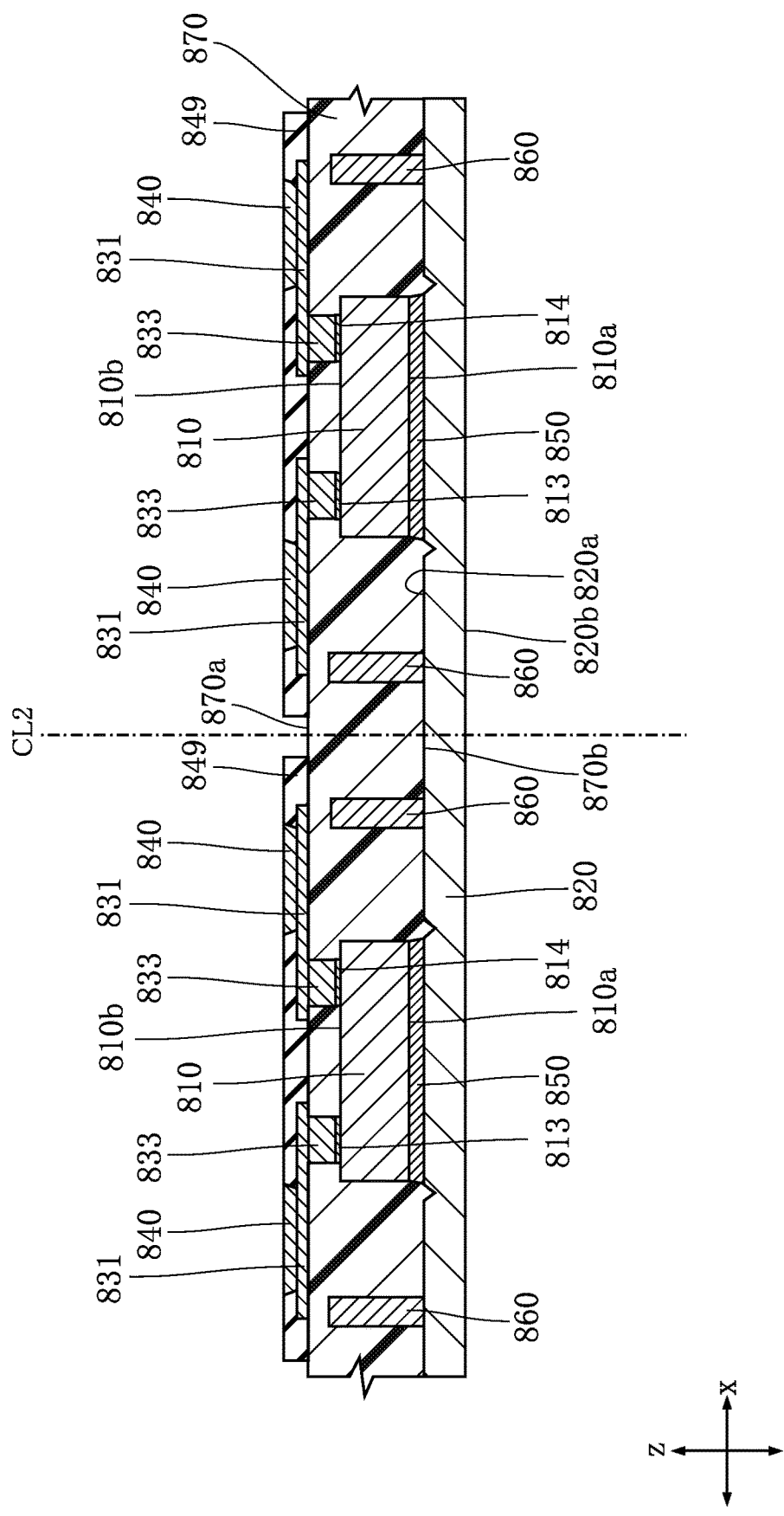
FIG. 51 is a sectional view showing a step of the method for manufacturing the terahertz device according to the third embodiment.

Next, as shown in FIG. 51, the support board 820 is ground from the support-board back surface 820b. The step of grinding the support board 820 (support board grinding step) is performed by machine grinding, as with the support board grinding step of the first embodiment.

Next, the sealing resin 870 and the support board 820 are cut into individual pieces for terahertz elements 810 similarly to the cutting step of the first embodiment. In the present embodiment, cutting may be performed along the cutting line CL2 shown in FIG. 51, for example.

By going through the above-described steps, the terahertz device C1 shown in FIG. 42 is obtained.

Since the terahertz element 1 of the terahertz device C1 is covered with the sealing resin 7 as with the first embodiment, the terahertz element 1 is protected from influences from the outside. In this way, the terahertz device C1 has a packaging structure that allows for modularization of the terahertz element 1 with improved reliability.

The terahertz device C1 includes the frame-shaped member 6, as with the first embodiment. Thus, the terahertz device C1 achieves reduction of problems such as disturbance noise or crosstalk, as well as reduction of noise components and gain improvement due to resonant reflection. In this way, the terahertz device C1 has a packaging structure that allows for modularization of the terahertz element 1 with improved emission or reception quality of terahertz waves.

Figure 52:
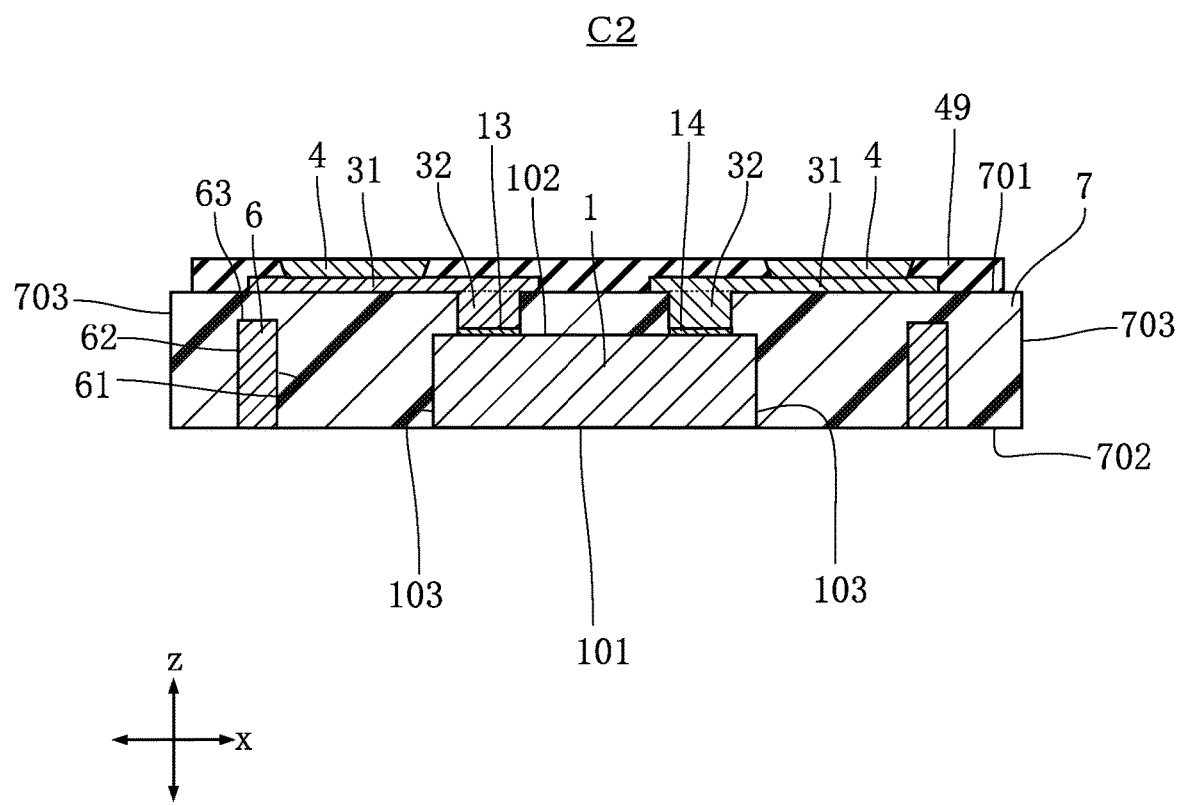
FIG. 52 is a sectional view of a terahertz device according to a variation of the third embodiment.

FIG. 52 shows a variation of the terahertz device C1 according to the third embodiment. FIG. 52 is a sectional view of a terahertz device C2 according to a variation of the third embodiment, and corresponds to the section of the terahertz device C1 shown in FIG. 42. The terahertz device C2 of this variation differs from the terahertz device C1 mainly in that the terahertz device C2 does not include the support board 2.

As mentioned above, the terahertz device C2 does not include the support board 2. Thus, the element front surface 101 of the terahertz element 1 and the resin back surface 702 of the sealing resin 7 are exposed to the outside of the terahertz device C2.

Such a terahertz device C2 may be obtained by grinding away the entirety of the support board 820 in the support board grinding step described above with reference to FIG. 51.

The terahertz device C2 provides the same advantages as those of the terahertz device C1. Moreover, since the terahertz device C2 does not include the support board 2, the terahertz device C2 can be made thinner than the terahertz device C1.

Figure 53:
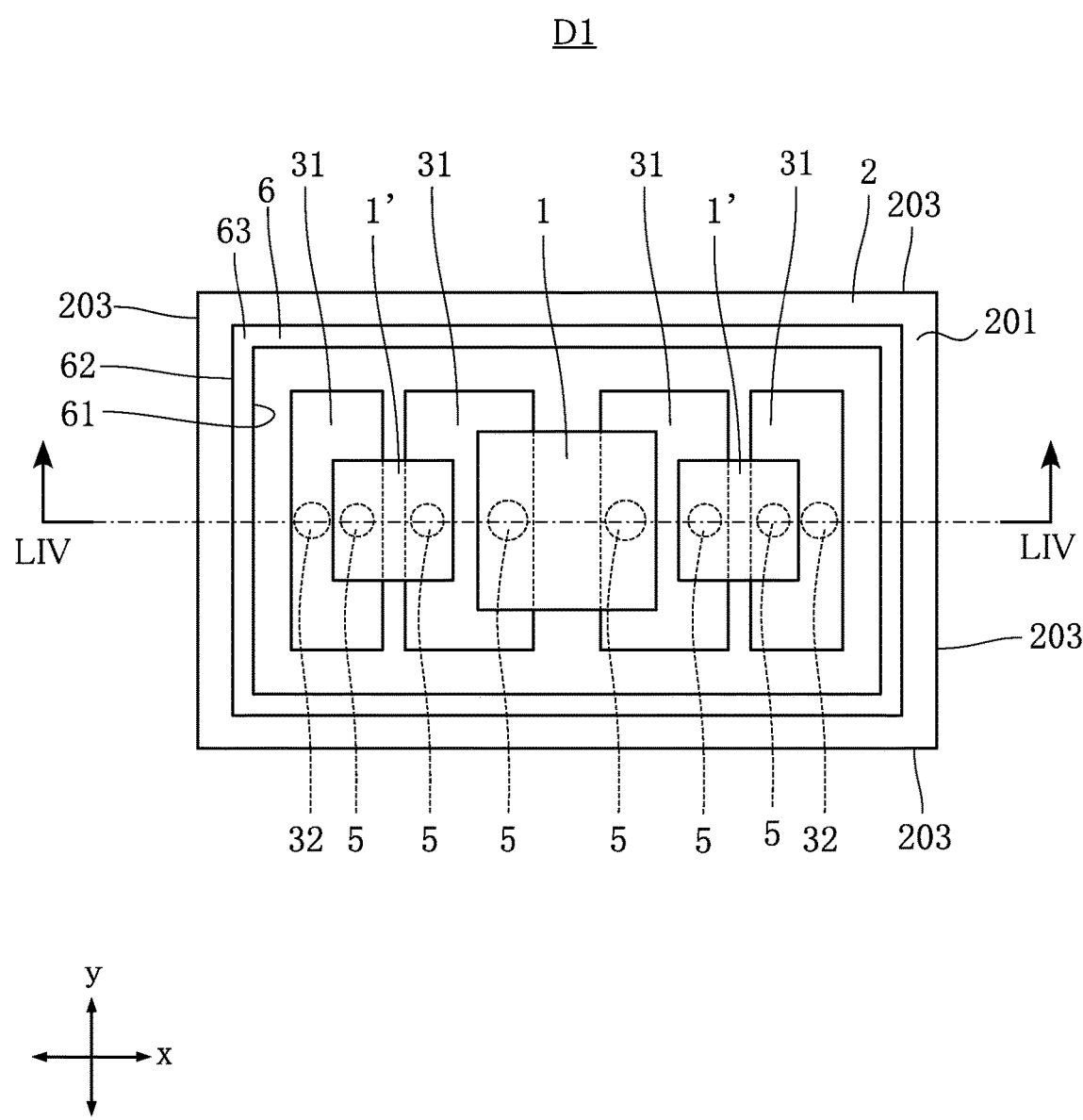
FIG. 53 is a plan view of a terahertz device according to a fourth embodiment.
Figure 54:
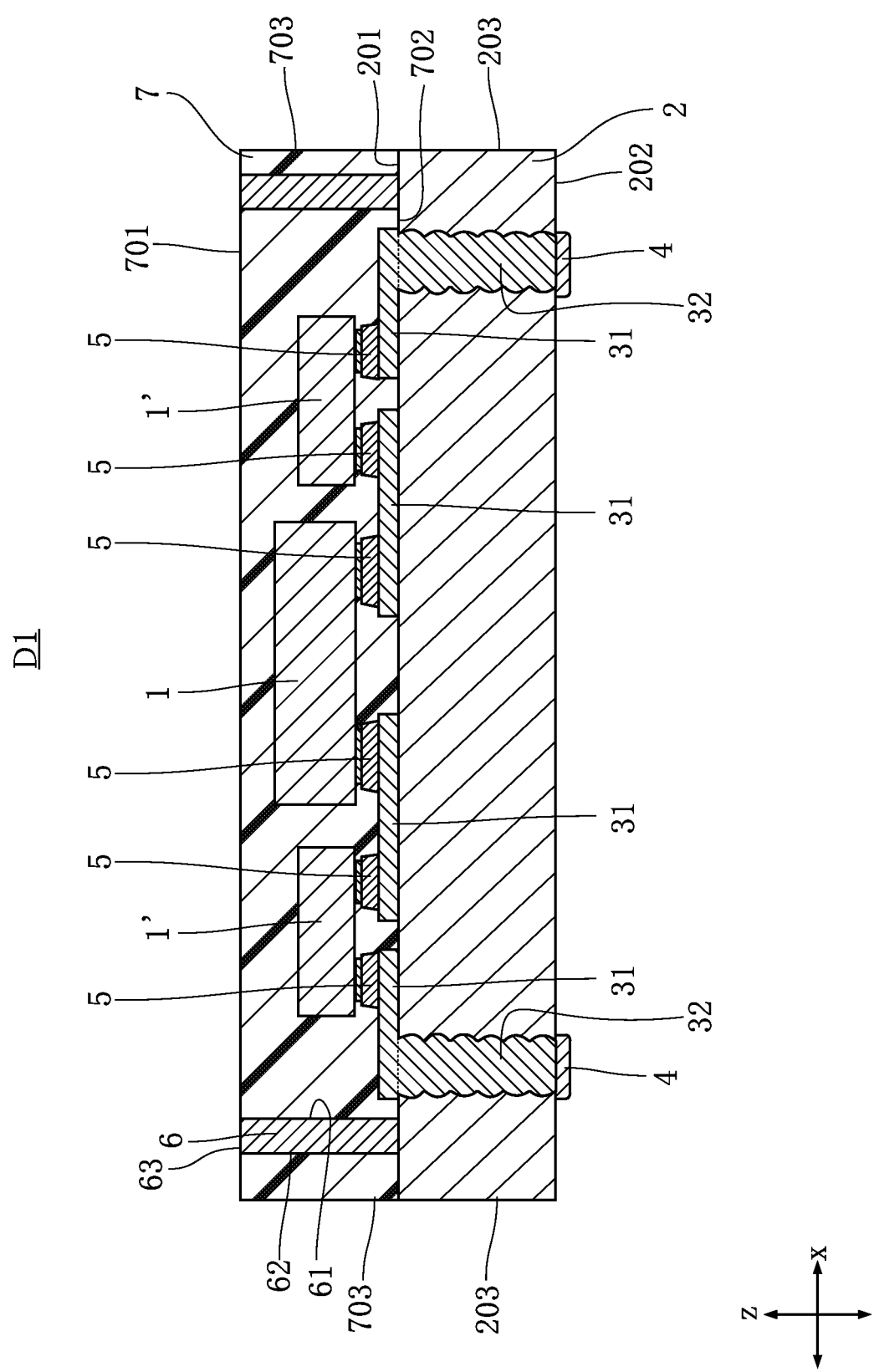
FIG. 54 is a sectional view taken along line LIV-LIV in FIG. 53.

FIGS. 53 and 54 show a terahertz device D1 according to a fourth embodiment. FIG. 53 is a plan view of the terahertz device D1. Note that the illustration of the sealing resin 7 is omitted in FIG. 53. FIG. 54 is a sectional view taken along line LIV-LIV in FIG. 53. The terahertz device D1 of the fourth embodiment differs from the terahertz device A1 of the first embodiment in that the terahertz device D1 includes semiconductor elements 1' in addition to the terahertz element 1.

As mentioned above, as compared with the terahertz device A1, the terahertz device D1 additionally includes a plurality of semiconductor elements 1'. As shown in FIGS. 53 and 54, the terahertz device D1 includes two semiconductor elements 1'. Each semiconductor element 1' is an electronic circuit element made of a semiconductor material. For example, each semiconductor element 1' may be a diode, a transistor or a resistor. Examples of the diode include a Zener diode and a TVS (transistor voltage suppressor) diode. As shown in FIG. 53, each semiconductor element 1' is disposed on the inner side of the frame-shaped member 6 as viewed in plan. That is, the frame-shaped member 6 surrounds the terahertz element 1 and the semiconductor elements 1'. The terahertz element 1 and the semiconductor elements 1' are aligned in the x direction on the inner side of the frame-shaped member 6.

Since the terahertz element 1 of the terahertz device D1 is covered with the sealing resin 7 as with the first embodiment, the terahertz element 1 is protected from influences from the outside. In this way, the terahertz device D1 has a packaging structure that allows for modularization of the terahertz element 1 with improved reliability.

The terahertz device D1 includes the frame-shaped member 6, as with the first embodiment. Thus, the terahertz device D1 achieves reduction of problems such as disturbance noise or crosstalk, as well as reduction of noise components and gain improvement due to resonant reflection. In this way, the terahertz device D1 has a packaging structure that allows for modularization of the terahertz element 1 with improved emission or reception quality of terahertz waves.

The terahertz device D1 includes semiconductor elements 1' other than the terahertz element 1. Thus, the terahertz device D1 can be configured as a multi-chip package with an additional function of the semiconductor elements 1'. For example, when a Zener diode or a TVS (transistor voltage suppressor) is used as the semiconductor elements 1', surge protection function can be added to the terahertz device D1. Moreover, since the terahertz element 1 and the semiconductor elements 1' are built in a single package, the mounting area on e.g. a circuit board can be reduced as compared with the case where they are individually packaged.

Figure 55:
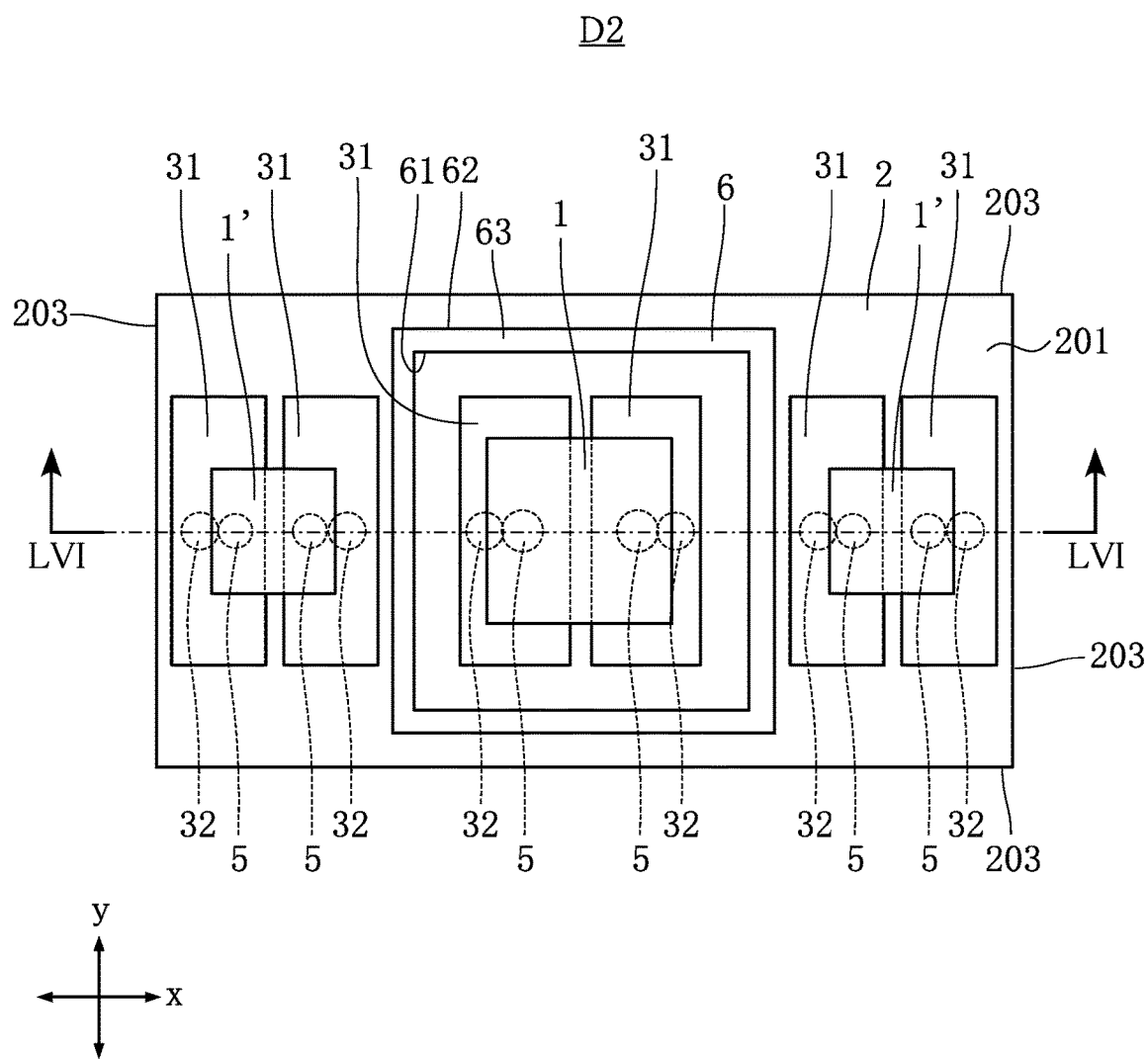
FIG. 55 is a plan view of a terahertz device according to a variation of the fourth embodiment.
Figure 56:
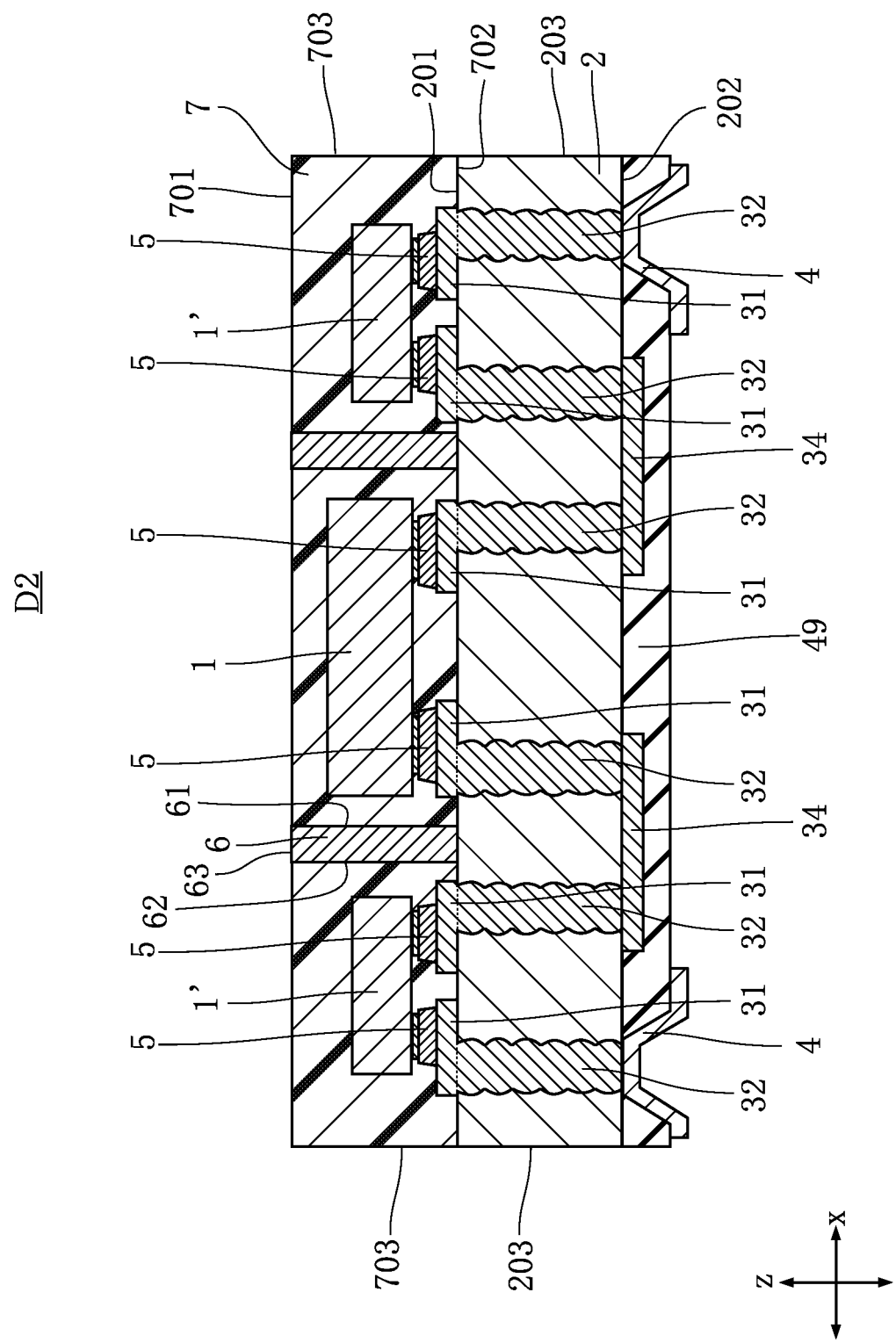
FIG. 56 is a sectional view taken along line LVI-LVI in FIG. 55.

FIGS. 55 and 56 show a variation of the terahertz device D1 according to the fourth embodiment. The terahertz device D2 of this variation differs from the terahertz device D1 in that the semiconductor elements 1' are arranged on the outer side of the frame-shaped member 6 as viewed in plan. FIG. 55 is a plan view of the terahertz device D2. Note that the illustration of the sealing resin 7 is omitted in FIG. 55. FIG. 56 is a sectional view taken along line LVI-LVI in FIG. 55.

In the terahertz device D2, the semiconductor elements 1' are arranged on the outer side of the frame-shaped member 6 unlike the terahertz device D1, as shown in FIG. 55. The terahertz element 1 and the semiconductor elements 1' are aligned in the x direction.

In the prevent embodiment, unlike the terahertz device D1, the frame-shaped member 6 is interposed between the terahertz element 1 and the semiconductor elements 1'. Thus, it is difficult to electrically connect the terahertz element 1 and the semiconductor elements 1' directly by the wiring layers 31. For this reason, the terahertz device D2 has a re-distribution layer 34 on the support-board back surface 820b. The terahertz element 1 and the semiconductor elements 1' are both electrically connected to the re-distribution layer 34 via the through electrode 32, so that the terahertz element 1 and the semiconductor elements 1' are electrically connected.

The terahertz device D2 provides the same advantages as those of the terahertz device D1 of the fourth embodiment.

Figure 57:
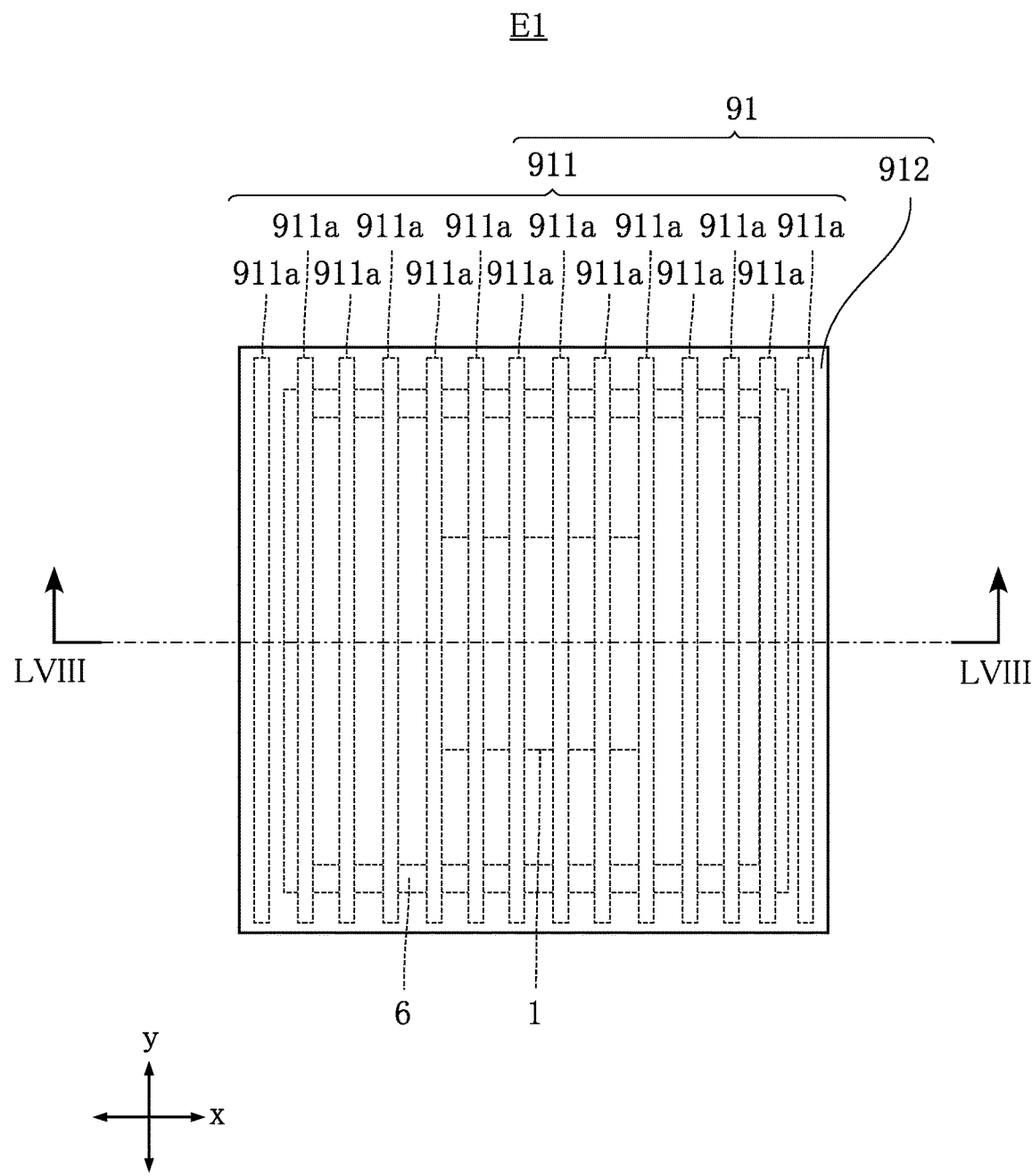
FIG. 57 is a plan view of a terahertz device according to a fifth embodiment.
Figure 58:
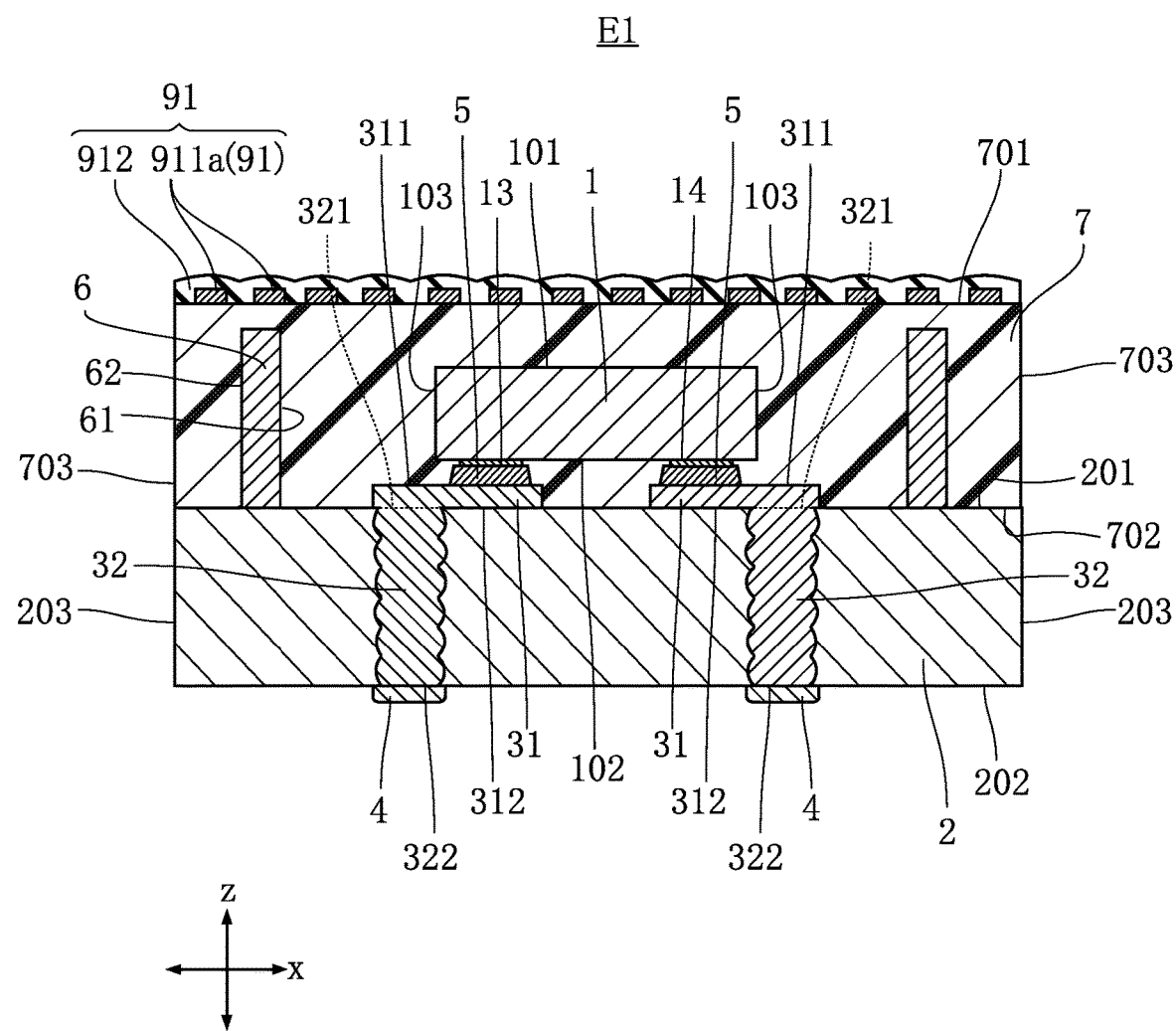
FIG. 58 is a sectional view taken along line LVIII-LVIII in FIG. 57.

FIGS. 57 and 58 show a terahertz device E1 according to a fifth embodiment. FIG. 57 is a plan view of the terahertz device E1. FIG. 58 is a sectional view taken along line LVIII-LVIII in FIG. 57. The terahertz device E1 according to the fifth embodiment differs from the terahertz device A1 according to the first embodiment in that the terahertz device E1 has, on the surface from which the terahertz waves are emitted (i.e., the resin front surface 701), an emission controlling member for controlling emission of the terahertz waves. As the emission control in the present disclosure, polarization control, frequency control, directivity control, dispersion control or resonance control may be performed to the terahertz waves radiated from the terahertz element 1. Also, the emission controlling member may be configured to perform near-field control of the terahertz waves emitted from the terahertz device E1. The fifth embodiment shows the example in which the emission controlling member is added to the terahertz device A1, but the emission controlling member may be added to other terahertz devices described above, i.e. the terahertz devices A2-A7, B1, B2, C1, C2, D1 or D2.

As mentioned above, as compared with the terahertz device A1, the terahertz device E1 additionally includes the emission controlling member 91 on the resin front surface 701. The terahertz device E1 integrates a metamaterial structure as the emission controlling member 91. The emission controlling member 91 overlaps with the element front surface 101 of the terahertz element 1, as viewed in plan. As shown in FIGS. 57 and 58, the emission controlling member 91, i.e. the metamaterial structure includes a patterned layer 911 and a protective layer 912.

The patterned layer 911 is formed on the resin front surface 701. As shown in FIG. 57, the patterned layer 911 overlaps with the terahertz element 1 as viewed in plan. As shown in FIG. 57, the patterned layer 911 overlaps with the region surrounded by the frame-shaped member 6 as viewed in plan. The patterned layer 911 includes a plurality of metal segments 911a. Each of the metal segments 911a is in the form of a strip extending in the y direction, as viewed in plan. The metal segments 911a are arranged side by side in the x direction. In this way, the patterned layer 911 is made up of a plurality of strip-shaped metal segments 911a arranged in the shape of a louver. The protective layer 912 is formed so as to cover the patterned layer 911. The protective layer 912 is made of an insulating material such as an epoxy resin, a polymer-based resin, a silicon oxide film (e.g., $SiO_2$) or a silicon nitride film (e.g., SiN). The front surface of the protective layer 912 (the upper surface in FIG. 58) has irregularities in the example shown in FIG. 58, but may be a flat surface. In the protective layer 912, protruding parts (projections) of the front surface overlap with the metal segment 911a as viewed in plan, whereas dented parts (recesses) of the front surface do not overlap with the metal segment 911a a as viewed in plan.

Since the terahertz element 1 of the terahertz device E1 is covered with the sealing resin 7 as with the first embodiment, the terahertz element 1 is protected from influences from the outside. In this way, the terahertz device E1 has a packaging structure that allows for modularization of the terahertz element 1 with improved reliability.

The terahertz device E1 includes the frame-shaped member 6, as with the first embodiment. Thus, the terahertz device E1 achieves reduction of problems such as disturbance noise or crosstalk, as well as reduction of noise components and gain improvement due to resonant reflection. In this way, the terahertz device A1 has a packaging structure that allows for modularization of the terahertz element 1 with improved emission or reception quality of terahertz waves.

In the terahertz device E1, the emission controlling member 91 is formed on the resin front surface 701 of the sealing resin 7. Thus, terahertz waves from the terahertz element 1 are emitted to the outside through the emission controlling member 91. Alternatively, terahertz waves from the outside may become incident on the terahertz element 1 through the emission controlling member 91. Thus, in the terahertz device E1, emission or reception of terahertz waves can be controlled by the emission controlling member 91.

In the terahertz device E1, the emission controlling member 91 includes the patterned layer 911, and the patterned layer 911 includes a plurality of metal segments 911a arranged in the shape of a louver (see FIGS. 57 and 58). With such an arrangement, the emission controlling member 91 functions as a polarization filter, so that the terahertz waves radiated from the terahertz element 1 is polarized by the emission controlling member 91 before emission.

Although the fifth embodiment shows the example in which a single layer is arranged in the z direction as the patterned layer 911, the present disclosure is not limited to this, and a plurality of patterned layers may be laminated. Also, the fifth embodiment shows the example in which the metal segments 911a forming the patterned layer 911 are arranged in the shape of a louver, but the present disclosure is not limited to this. For example, a plurality of metal segments 911a each having the shape of a circular ring may be arranged concentrically. In such a case, the metal segments 911a differ from each other in inner diameter, and the outer diameter of each metal segment 911a is smaller than the inner diameters of the metal segments 911a arranged on the outer side of that metal segment 911a. As another example, a plurality of metal segments 911a each having the shape of a small circle as viewed in plan may be arranged regularly (e.g., in a manner similar to the photonic crystal structure described below).

Figure 59:
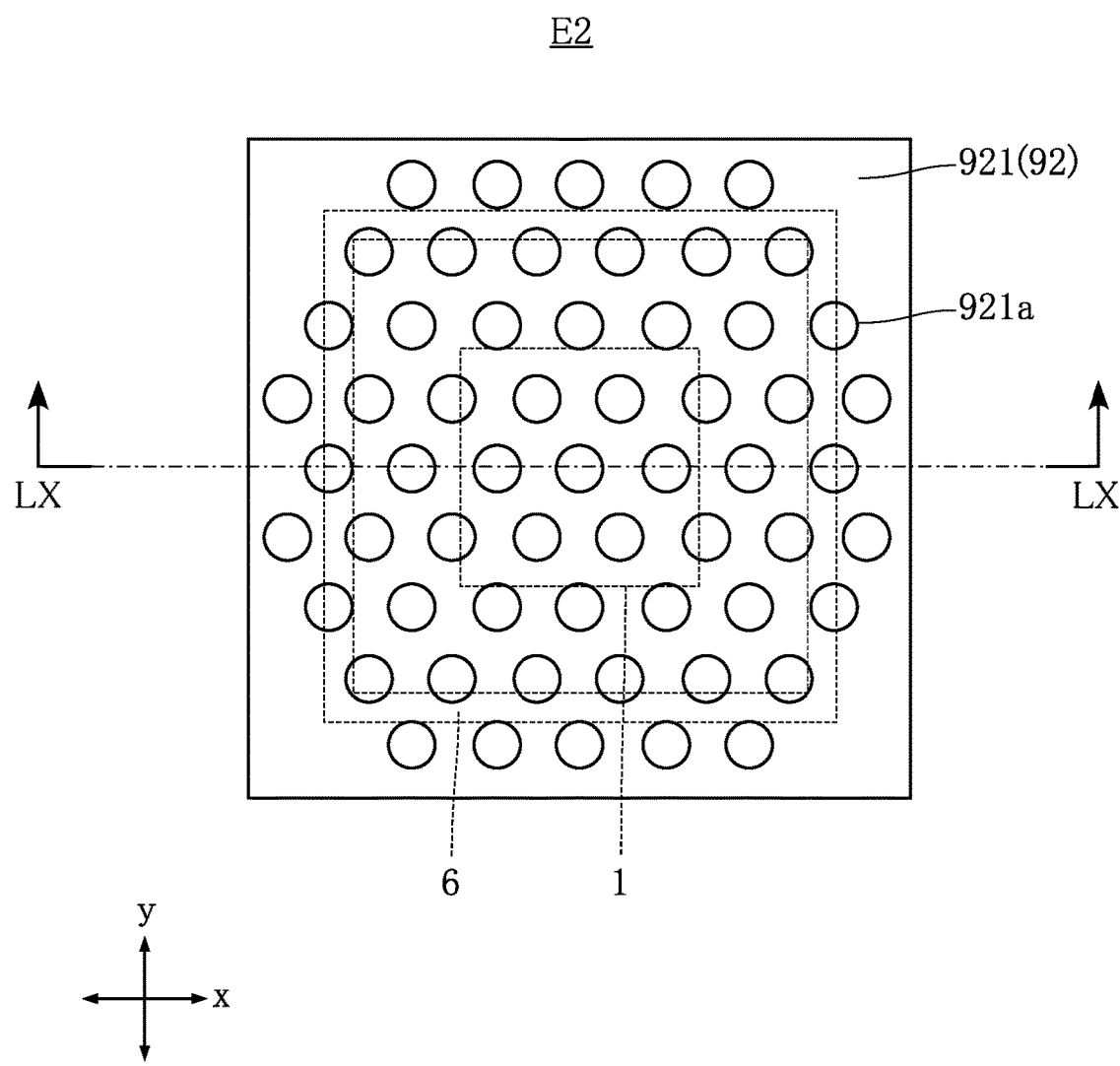
FIG. 59 is a plan view of a terahertz device according to a first variation of the fifth embodiment.
Figure 60:
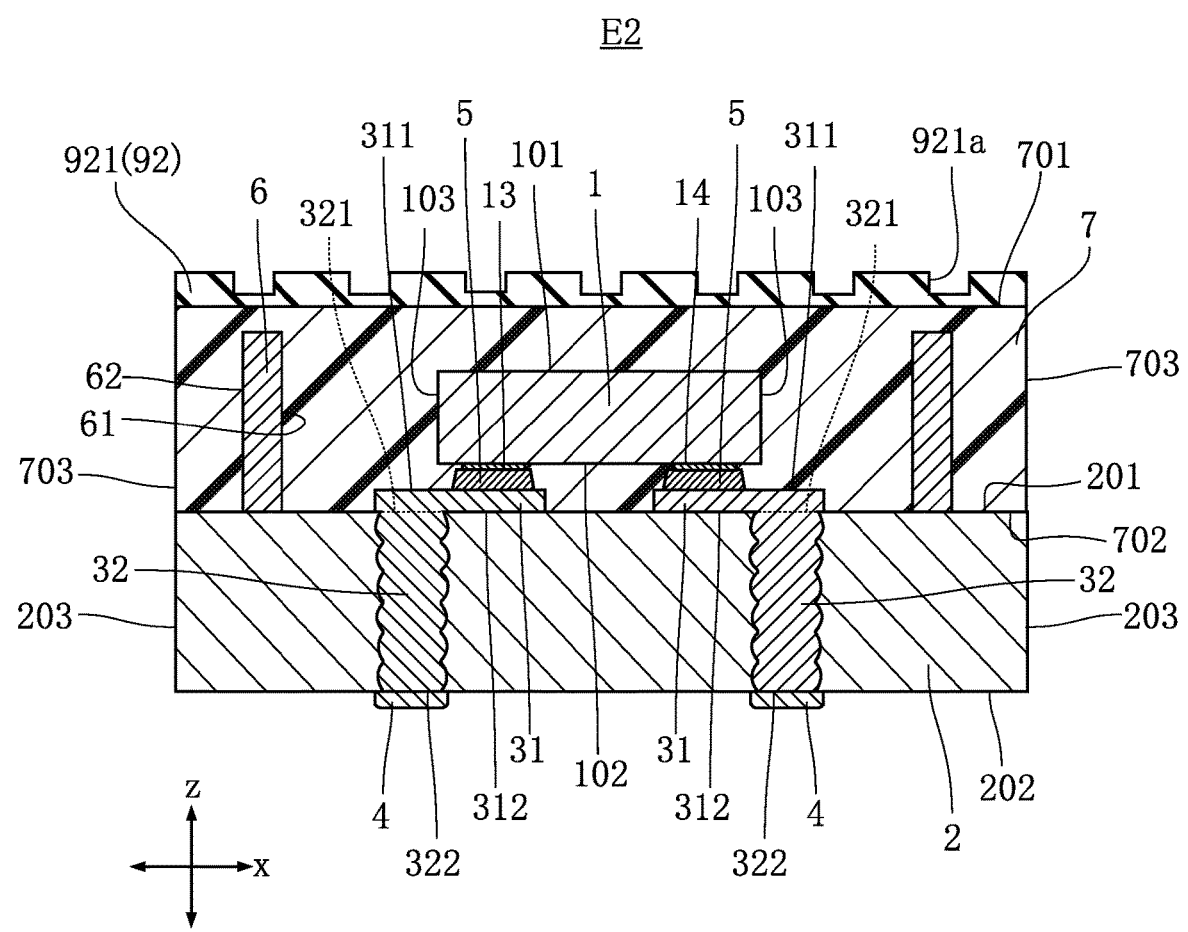
FIG. 60 is a sectional view taken along line LX-LX in FIG. 59.
Figure 61:
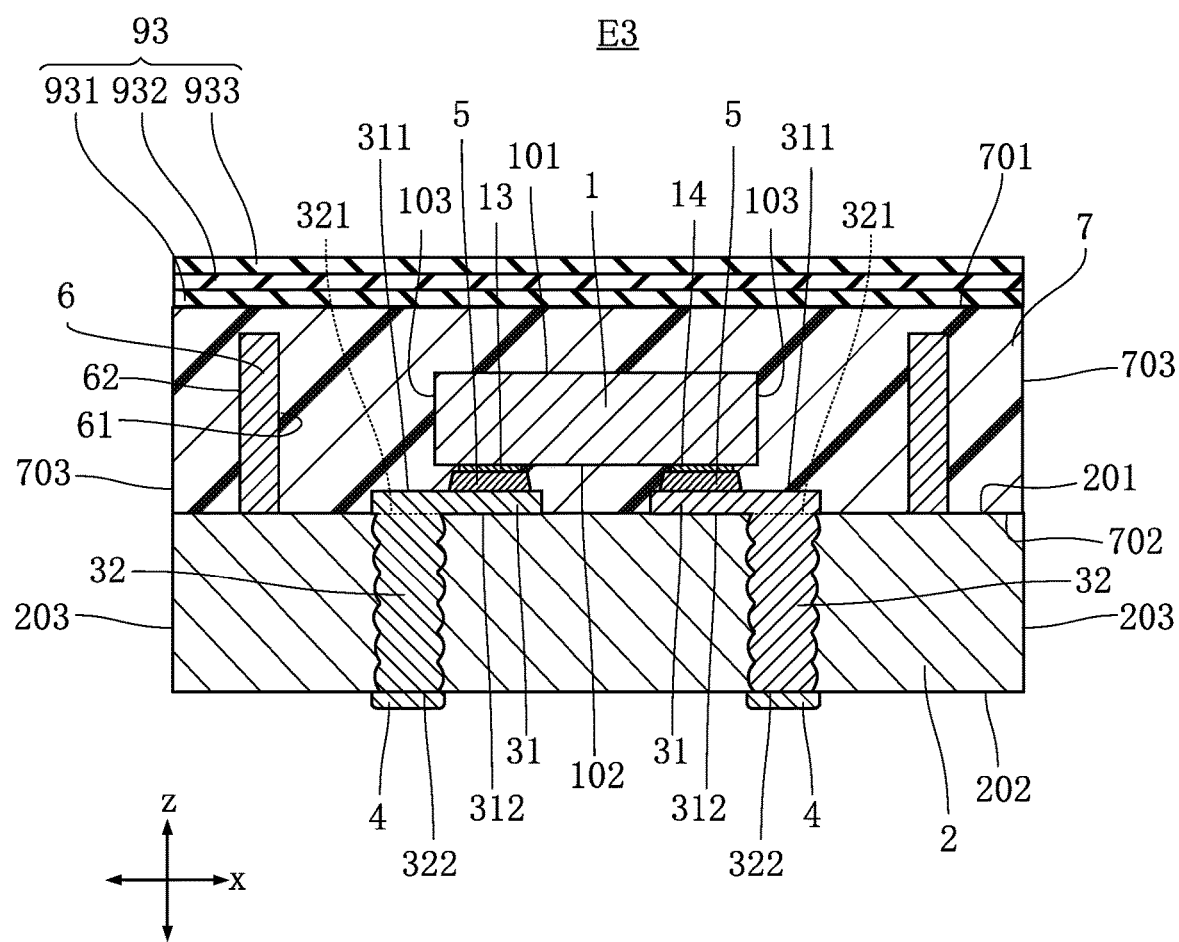
FIG. 61 is a sectional view of a terahertz device according to a second variation of the fifth embodiment.

FIGS. 59-61 show variations of the terahertz device E1 according to the fifth embodiment.

FIGS. 59 and 60 show a terahertz device E2 according to a first variation of the fifth embodiment. FIG. 59 is a plan view of the terahertz device E2. FIG. 60 is a sectional view taken along line LX-LX in FIG. 59. The terahertz device E2 according to the first variation differs from the terahertz device E1 in that the terahertz device E2 includes an emission controlling member 92 instead of the emission controlling member 91.

Specifically, the terahertz device E2 includes an integrated photonic crystal structure as the emission controlling member 92. A photonic crystal refers to a structure made up of at least two types of optical materials (or one type of material and air) arranged periodically.

The terahertz device E2 is formed with a dielectric member 921 on the resin front surface 701 of the sealing resin 7. The dielectric member 921 may be e.g. a silicon oxide film, but is not limited to this. The dielectric member 921 has a plurality of depressions 921a arranged in e.g. a dot pattern on its front surface (i.e., the upper surface in the z direction that faces in the direction in which the resin front surface 701 faces). The arrangement of the depressions 921a is not limited to a dot pattern. It is only required that the depressions 921a are arranged such that the emission controlling member 92 is configured as a photonic crystal structure. As shown in FIG. 59, some of the depressions 921a arranged in a dot pattern overlap with the terahertz element 1 as viewed in plan. Also, as shown in FIG. 59, some of the depressions 921a arranged in a dot pattern overlap with the region surrounded by the frame-shaped member 6 as viewed in plan.

In the terahertz device E2, the depressions 921a are arranged such that the emission controlling member 92 functions as a frequency filter. The depressions 921a are not limited to such an arrangement and may be arranged such that the emission controlling member 92 functions as a resonator with a high quality factor or a component that performs distributed control. For example, in the arrangement shown in FIG. 59, the emission controlling member can function as a resonator with a high quality factor when 1 to 3 depressions 921a near the center are eliminated and function as a distributed control component when the cycle is gradually changed (the distance between adjacent depressions 921a is gradually changed).

The terahertz device E2 provides the same advantages as those of the terahertz device E1. As described above, the emission controlling member 92 includes the dielectric member 921 having a plurality of depressions 921a arranged in a predetermined pattern (see FIGS. 59 and 60). With such an arrangement, the emission controlling member 92 functions as a frequency filter, so that the frequency of the terahertz waves from the terahertz element 1 is controlled before emission.

This variation shows the example in which the emission controlling member 92 has the depressions as the photonic crystal structure formed in the dielectric member 921. However, the depressions as the photonic crystal structure may be directly formed on the resin front surface 701. In such a case again, the same advantages as those of the terahertz device E2 are obtained.

FIG. 61 shows a terahertz device E3 according to a second variation of the fifth embodiment. FIG. 61 is a sectional view of the terahertz device E3 and corresponds to the section of the terahertz device E1 shown in FIG. 58. The terahertz device E3 according to the second variation differs from the terahertz device E1 in that the terahertz device E3 includes an emission controlling member 93 instead of the emission controlling member 91.

The terahertz device E3 includes, as the emission controlling member 93, an integrated laminate of a plurality of thin films that differ from each other in index of refraction. As shown in FIG. 61, the emission controlling member 93 has a first thin film 931, a second thin film 932 laminated on the first thin film, and a third thin film 933 laminated on the second thin film 932. The first thin film 931, the second thin film 932 and the third thin film 933 overlap with the terahertz element 1 as viewed in plan. The first thin film 931, the second thin film 932 and the third thin film 933 overlap with the region surrounded by the frame-shaped member 6 as viewed in plan. FIG. 61 shows the example in which three thin films are formed, but the number of the thin films is not limited to three and may be smaller or larger than three. Provided that the index of refraction of the sealing resin 7 is $n_7$, the indexes of refraction of the first thin film 931, the second thin film 932 and the third thin film 933 are $n_{931}$, $n_{932}$ and $n_{933}$, respectively. By making the indexes of refraction of the thin films different from each other in this way, the emission controlling member 93 can control the terahertz waves radiated from the terahertz element 1 and emitted from the terahertz device E3. The index of refraction of each thin film may be varied as appropriate such that desired terahertz waves are emitted.

The terahertz device E3 provides the same advantages as those of the terahertz device E1.

Figure 62:
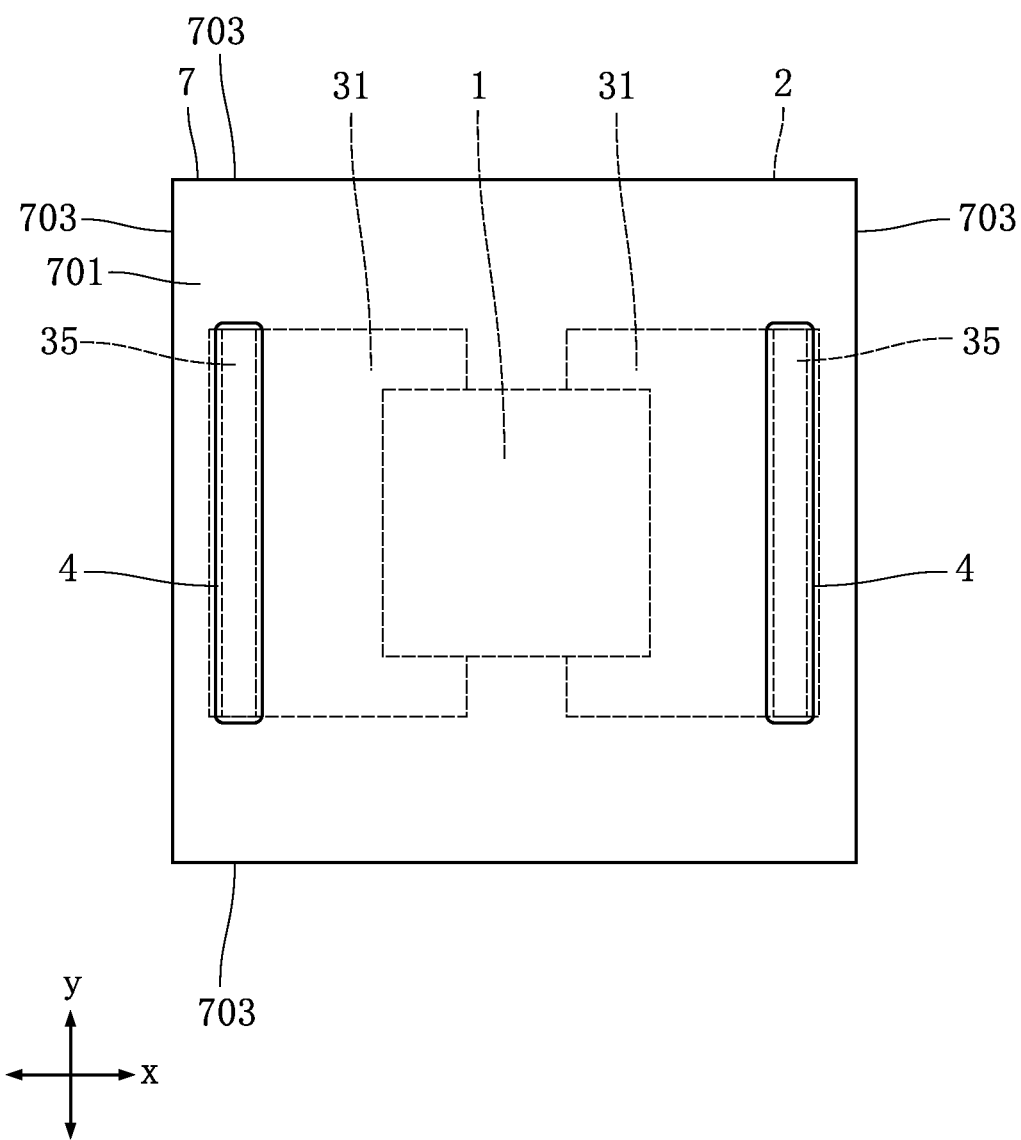
FIG. 62 is a plan view of a terahertz device according to a sixth embodiment.
Figure 63:
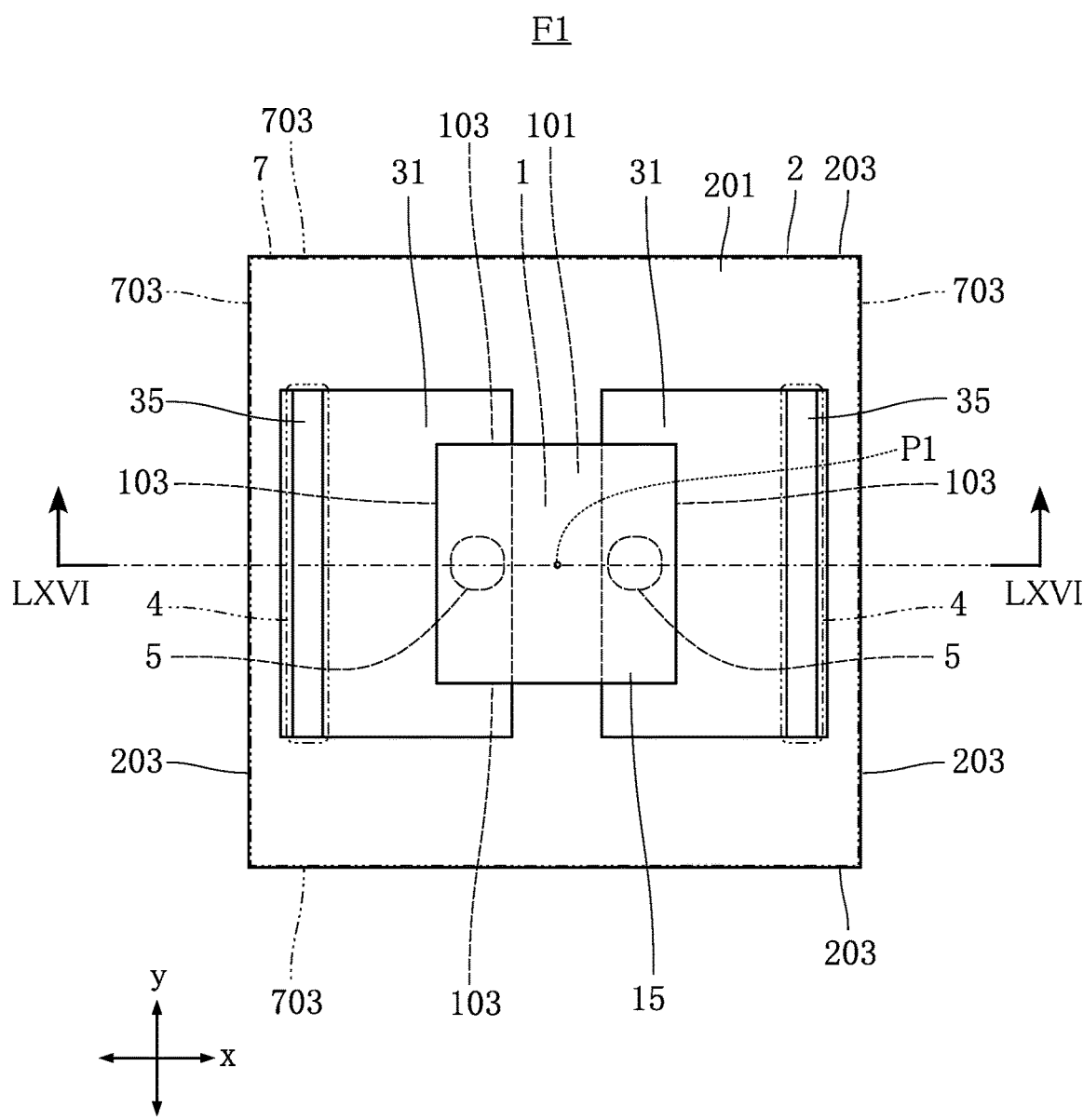
FIG. 63 is a plan view of the terahertz device according to the sixth embodiment.
Figure 64:
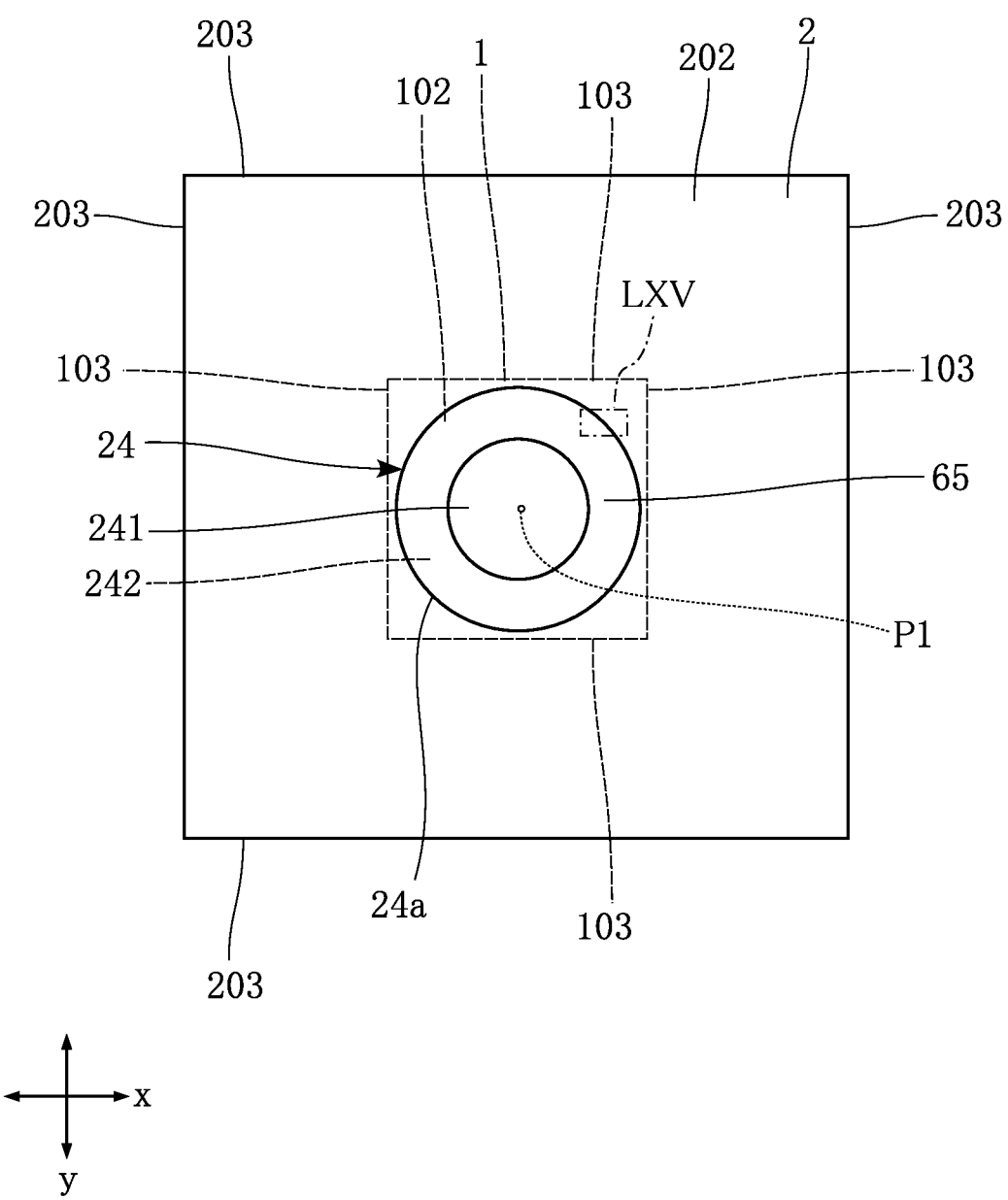
FIG. 64 is a bottom view of the terahertz device according to the sixth embodiment.
Figure 65:
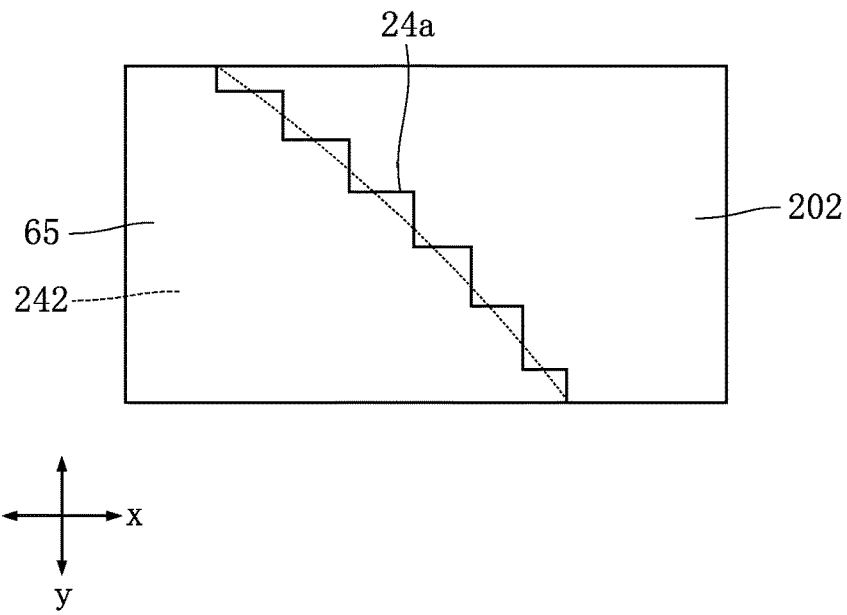
FIG. 65 is an enlarged sectional view showing a part of FIG. 64.
Figure 66:
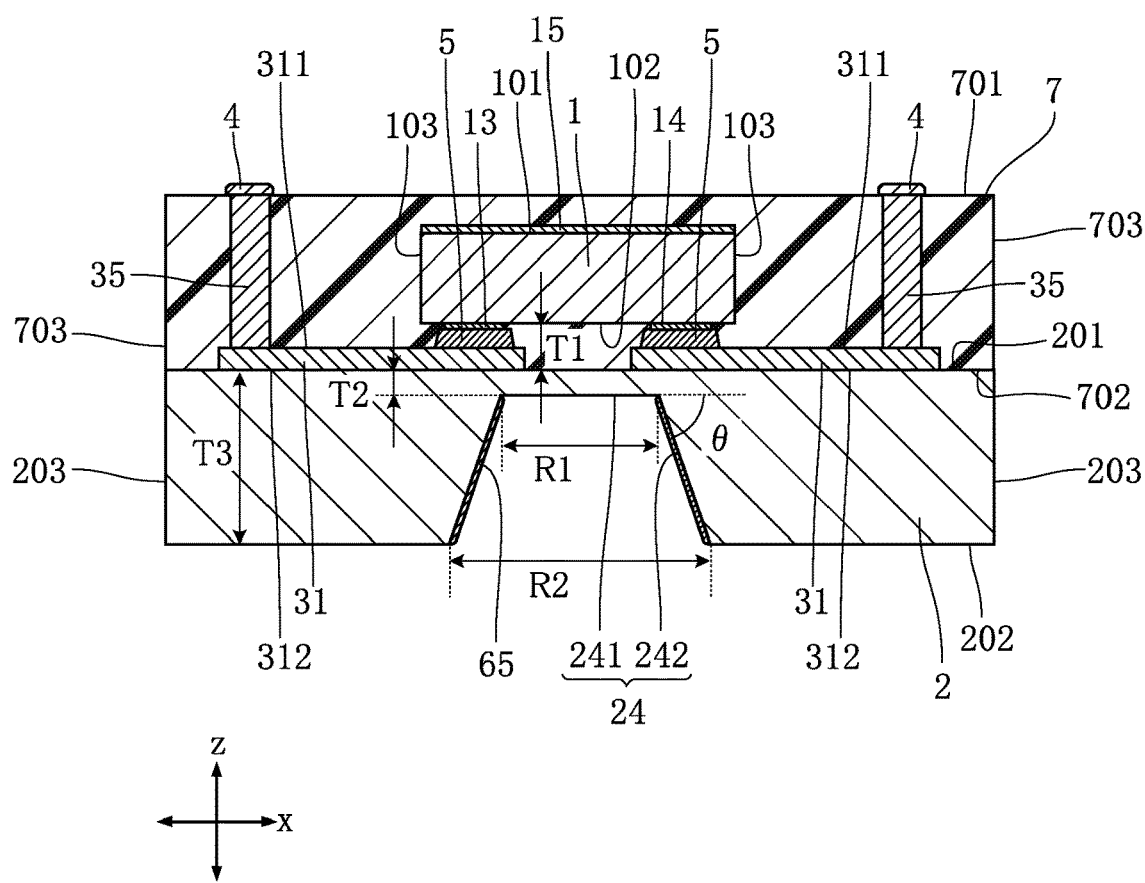
FIG. 66 is a sectional view taken along line LXVI-LXVI in FIG. 63.
Figure 67:
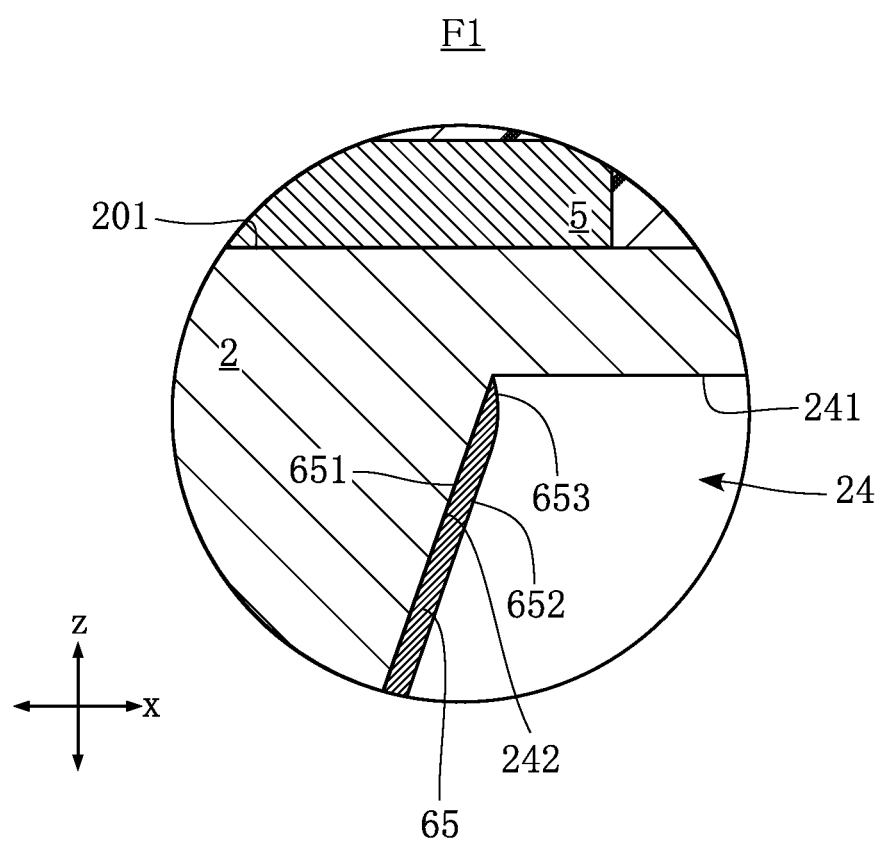
FIG. 67 is an enlarged sectional view showing a part of FIG. 66.

FIGS. 62-67 show a terahertz device F1 according to a sixth embodiment. FIG. 62 is a plan view of the terahertz device F1. FIG. 63 is a plan view corresponding to FIG. 62, with the sealing resin 7 and the external electrodes 4 indicated by imaginary lines. FIG. 64 is a bottom view of the terahertz device F1. FIG. 65 is an enlarged view showing a part (region LXV) of FIG. 64. FIG. 66 is a sectional view taken along line LXVI-LXVI in FIG. 63. FIG. 67 is an enlarged sectional view of a part of FIG. 66. The terahertz device F1 of the sixth embodiment differs from the terahertz device A1 mainly in that the support board 2 has a depression and the external electrodes 4 are formed on the resin front surface 701.

In the terahertz element 1 of the present embodiment, the active element 12 is arranged in proximity to the element back surface 102 in the z direction. Thus, the element back surface 102 is the active surface. In the present embodiment again, as viewed in plan, the functional part (radiation point) overlaps with the center position P1 of the terahertz element 1.

The terahertz element 1 further includes a reflective metal 15. As shown in FIG. 66, the reflective metal 15 covers the element front surface 101. The material for the reflective metal 15 may be Cu, for example. Other materials may be used as long as they are capable of reflecting terahertz waves. The terahertz waves radiated from the active element 12 is reflected by the reflective metal 15 and directed downward in the z direction.

As shown in FIGS. 64 and 66, the support board 2 has a recess 24. The recess 24 is formed so as to dent from the support-board back surface 202 toward the support-board front surface 201. The recess 24 does not penetrate the support board 2 in the z direction. The recess 24 has the shape of a truncated cone. The recess 24 is generally circular in cross section orthogonal to the z direction. The recess 24 is tapered. Because of such tapering, the cross section orthogonal to the z direction becomes smaller as progressing from the lower side toward the upper side in the z direction. The recess 24 may be formed by e.g. anisotropic etching. The anisotropic etching is performed using an alkaline solution such as KOH or TMAH described above. The support-board back surface 202 of the support board 2 has an opening due to the presence of the recess 24. As shown in FIGS. 64 and 66, the recess 24 has a bottom surface 241 and a connecting surface 242.

The bottom surface 241 is orthogonal to the z direction. The bottom surface 241 is flat. The bottom surface 241 faces in the z direction and faces in the direction in which the element back surface 102 faces. The bottom surface 241 is generally circular as viewed in plan.

The connecting surface 242 is connected to the support-board front surface 201 and the bottom surface 241. The connecting surface 242 is connected to the support-board front surface 201 at one edge in the z direction (lower edge in FIG. 66) and connected to the bottom surface 241 at the other edge in the z direction (upper edge in FIG. 66). The connecting surface 242 is flat. The connecting surface 242 is inclined with respect to the bottom surface 241. The support-board back surface 202 is a (100) surface in accordance with Miller index, so that the connecting surface 242 is a (111) surface in accordance with Miller index. The connecting surface 242 has an inclination angle θ (see FIG. 66) of about 54.7°±0.5° with respect to the bottom surface 241.

As shown in FIG. 65, in the recess 24, the boundary 24a between the connecting surface 242 and the support-board back surface 202 is made up of edges extending in the x direction and edges extending in the y direction that are alternately arranged and connected to each other. Macroscopically, the boundary 24a looks like a circle in plan view, as shown in FIG. 64, since the length of each of the edges forming the boundary 24a is small.

Each internal electrode 3 includes a wiring layer 31 and a through electrode 35. That is, as compared with the internal electrodes 3 of the first embodiment, each internal electrode 3 of this embodiment includes a through electrode 35 instead of the through electrode 32.

The through electrodes 35 are formed so as to penetrate the sealing resin 7. The through electrodes 35 electrically connect the wiring layers 31 and the external electrodes 4. The through electrodes 35 are formed on the wiring-layer front surface 311 of the wiring layers 31. The through electrodes 35 extend in the z direction from the wiring-layer front surfaces 311 to be exposed from the resin front surface 701 of the sealing resin 7. Each of the through electrodes 35 is in the form of a strip extending in the y direction, as viewed in plan. The through electrodes 35 are arranged on each side of the terahertz element 1 in the x direction. As viewed in the x direction, the terahertz element 1 completely overlaps with the through electrodes 35. As viewed in plan, each through electrode 35 has opposite edges in the y direction, and these ends do not overlap with the terahertz element 1 as viewed in the x direction.

Each through electrode 35 has a first end surface 351 and a second end surface 352. The first end surface 351 and the second end surface 352 are spaced apart and face away from each other in the z direction. The first end surface 351 is in contact with the wiring layer 31. Thus, the through electrode 35 and the wiring layer 31 are electrically connected to each other. The second end surface 352 is exposed from the resin front surface 701 of the sealing resin 7. The second end surface 352 is covered with an external electrode 4 and in contact with the external electrode 4. Thus, the through electrode 35 and the external electrode 4 are electrically connected to each other.

The external electrodes 4 are formed above the resin front surface 701 in the z direction and exposed from the sealing resin 7. The external electrodes 4 cover the second end surfaces 352.

The connecting surface 242 is covered with a metal film 65. The metal film 65 is not in contact with the bottom surface 241. The material for the metal film 65 may be Cu, for example. The material for the metal film 65 is not limited to Cu, and other materials may be used as long as they are capable of reflecting terahertz waves. The metal film 65 may be formed by sputtering or vacuum deposition, for example. The technique for forming the metal film 65 is not limited to this and may be electroplating.

The metal film 65 is arranged around the center position P1 of the terahertz element 1 as viewed in plan. Since the center position P1 generally corresponds to the functional part (radiation point) of the terahertz waves, the metal film 65 is positioned around the functional part (radiation point) of the terahertz waves.

As shown in FIG. 67, the metal film 65 has a first surface 651, a second surface 652 and a third surface 653. The first surface 651 is in contact with the connecting surface 242 of the recess 24, covering the connecting surface. The second surface 652 is generally parallel to the first surface 651. The second surface 652 may be curved. The area of the second surface 652 is smaller than that of the first surface 651. The third surface 653 is connected to the first surface 651 and the second surface 652. The third surface 653 is curved. The boundary between the first surface 651 and the third surface 653 generally corresponds to the boundary between the bottom surface 241 and the connecting surface 242. The boundary between the first surface 651 and the third surface 653 may be on the connecting surface 242.

In the terahertz device F1, the distance T1 between the element back surface 102 of the terahertz element 1 and the support-board front surface 201 of the support board 2 in the z direction and the distance T2 between the bottom surface 241 of the recess 24 and the support-board front surface 201 of the support board 2 in the z direction are designed to satisfy the following conditions: The distance T1 and the distance T2 are both smaller than the half-wavelength of the terahertz waves, or the distance T1 and the distance T2 each are a positive integer multiple of the half-wavelength of the terahertz waves. Herein, the "half-wavelength" refers to one half the wavelength λ of the terahertz waves (i.e., λ/2).

In the terahertz device F1, the thickness T3 of the support board 2 (i.e., the distance between the support-board front surface 201 and the support-board back surface 202 in the z direction) is about 725 μm. The thickness T3 of the support board 2 is not limited to such a value, and a larger thickness T3 of the support board 2 provides a larger gain of emitted terahertz waves. However, increasing the thickness T3 of the support board 2 results in an increased dimension of the terahertz device F1 in the z direction. Thus, the thickness T3 of the support board 2 may be determined as appropriate in accordance with the required product specifications (e.g., the gain of terahertz waves and the dimension of the terahertz device F1 in the z direction).

In the terahertz device F1, the diameter R1 of the bottom surface 241 is set to not less than λ/2 and not more than λ. Such an arrangement allows for single-mode excitation of the radiated terahertz waves. Note that the diameter R2 of the lower edge of the recess 24 in the z direction (the diameter of the opening of the recess 24 in the support-board back surface 202) is calculated by R2=R1+2×((T3−T2)×tan (90−θ)).

Since the terahertz element 1 of the terahertz device F1 is covered with the sealing resin 7 as with the first embodiment, the terahertz element 1 is protected from influences from the outside. In this way, the terahertz device F1 has a packaging structure that allows for modularization of the terahertz element 1 with improved reliability.

In the terahertz device F1, the support board 2 is formed with the recess 24. The recess 24 includes a connecting surface 242 covered with the metal film 65. As viewed in plan, the metal film 65 has the shape of a circular ring and surrounds the functional part (radiation point) of the terahertz element. With such an arrangement, the terahertz waves radiated from the terahertz element 1 are reflected by the metal film 65 before emission. At this time, the recess 24 functions as a horn antenna, so that the gain, directivity and polarization, for example, of emitting or receiving terahertz waves can be controlled in accordance with the shape and size of the recess 24. Thus, the terahertz device F1 can be described as having an integrated horn antenna. Note that since the recess 24 in the terahertz device F1 generally has the shape of a truncated cone, vibration in normal mode $TE_{11}$ occurs.

In the terahertz device F1, as viewed in the x direction, each through electrode 35 overlaps with the terahertz element 1 and projects relative to the terahertz element 1 in each side in the y direction. With such an arrangement, the through electrodes 35 reflect the terahertz waves radiated in the x direction from the terahertz element 1 to produce resonance. Thus, the terahertz device F1 can radiate terahertz waves with reduced noise components. Also, the terahertz device F1 can radiate terahertz waves with an increased gain due to resonant reflection. Moreover, the through electrodes 35 block other electromagnetic waves from the x direction. That is, the through electrodes 35 function as an electromagnetic shield that blocks interfering electromagnetic waves from the x direction. Thus, the terahertz device F1 reduces problems such as disturbance noise or crosstalk. In this way, the terahertz device A1 has a packaging structure that allows for modularization of the terahertz element 1 with improved emission or reception quality of terahertz waves.

In the terahertz device F1, the terahertz element 1 includes a reflective metal 15 covering the element front surface 101. With such an arrangement, in the terahertz element 1, the terahertz waves radiated from the active element 12 and propagating upward in the z direction is reflected by the reflective metal 15 downward in the z direction. As a result, the terahertz waves travel downward in the z direction, so that the gain of the terahertz waves emitted downward in the z direction is improved. Moreover, since emission of terahertz waves upward in the z direction is prevented, adverse effects (such as noise) on a circuit board on which the terahertz device F1 is mounted are prevented.

Figure 68:
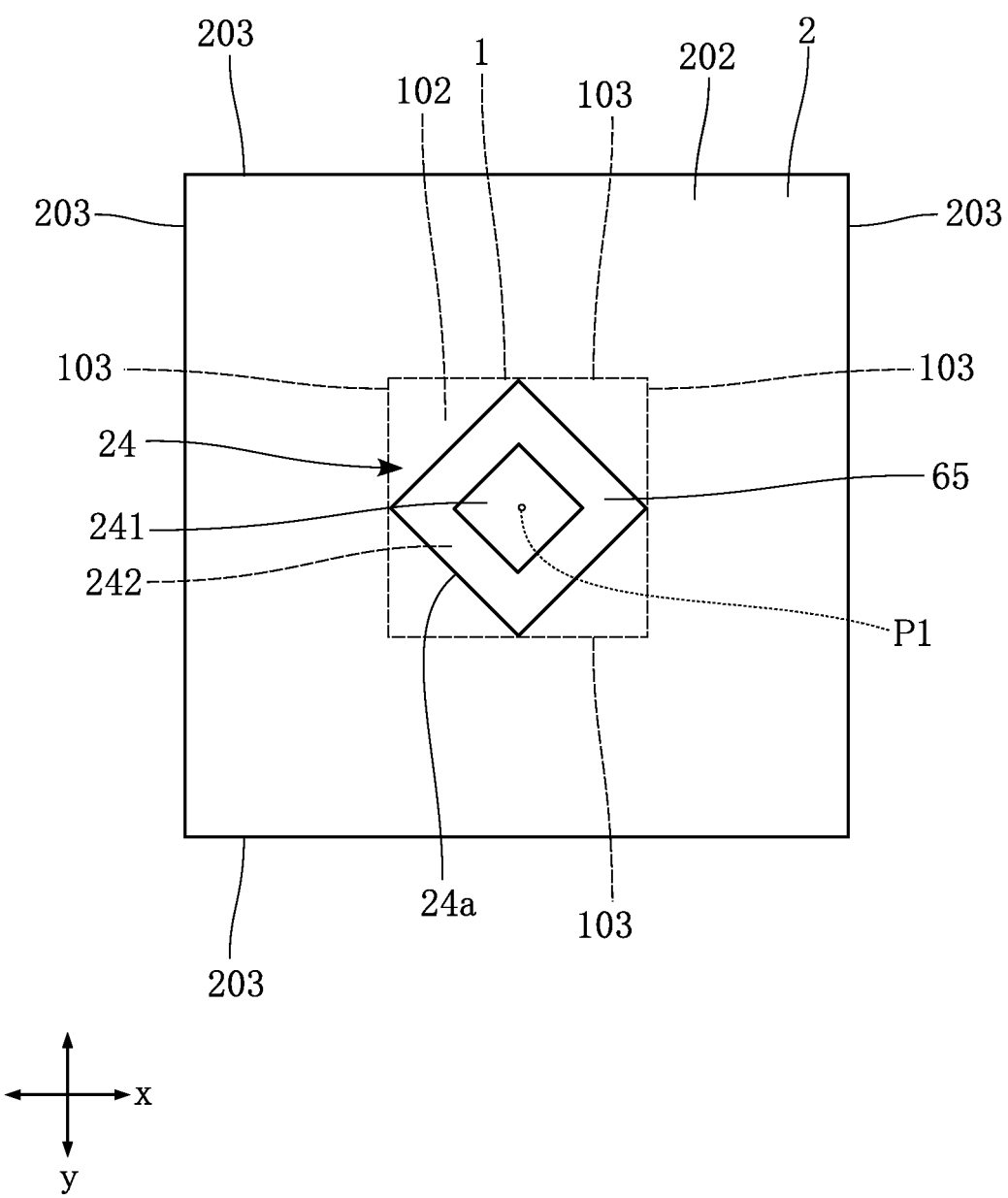
FIG. 68 is a bottom view showing a different embodiment of a recess in a support board according to the sixth embodiment.
Figure 69:
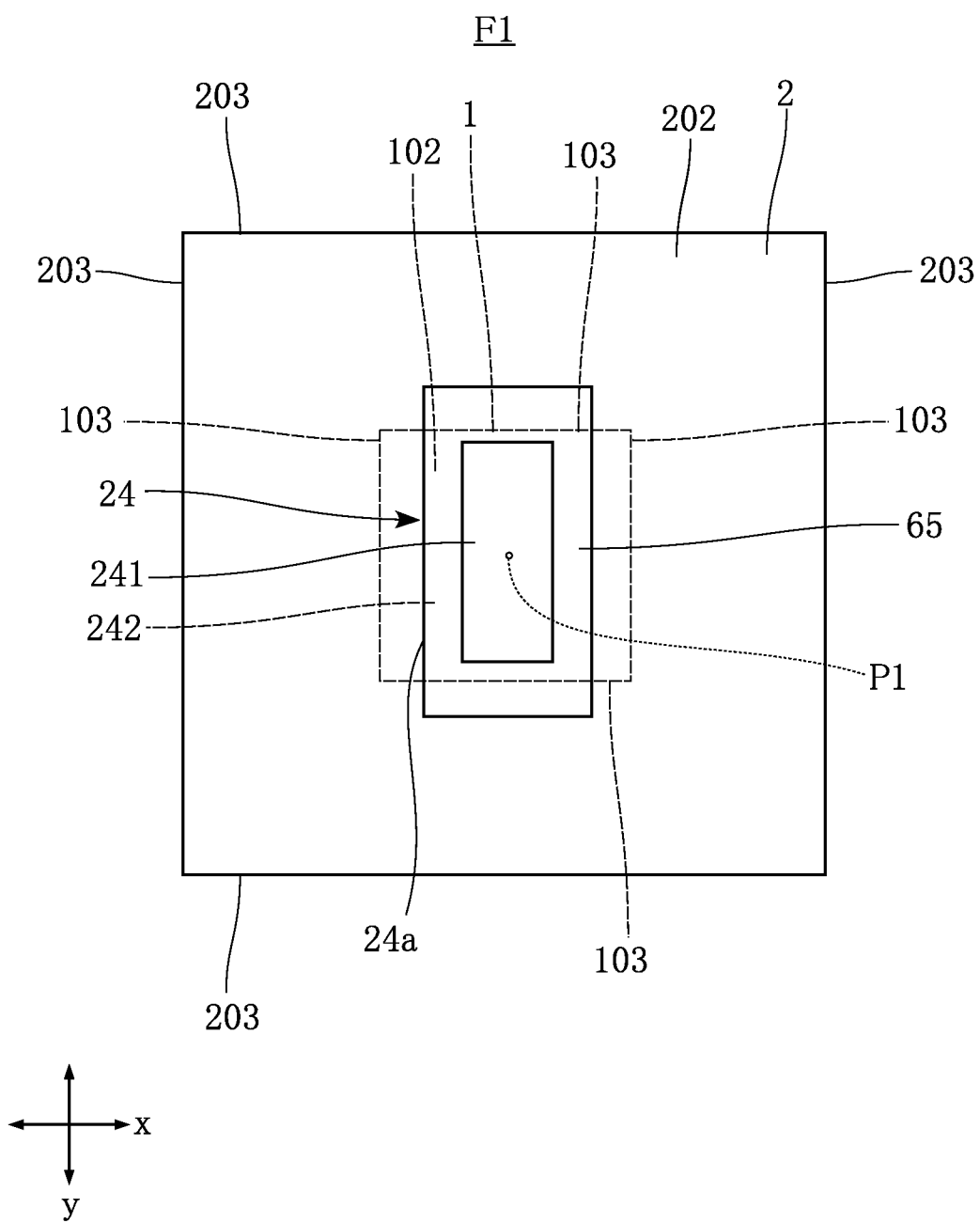
FIG. 69 is a bottom view showing a different embodiment of the recess in the support board according to the sixth embodiment.

The sixth embodiment shows the example in which the recess 24 has the shape of a truncated cone, but the present disclosure is not limited to this. FIGS. 68 and 69 show other embodiments of the recess 24 that can be incorporated in the terahertz device F1 according to the sixth embodiment. Note that the shapes of the recess 24 shown in these figures are merely examples and the present disclosure is not limited to these.

FIGS. 68 and 69 each are a bottom view of a terahertz device F1 in which the recess 24 has the shape of a truncated pyramid. FIG. 68 shows an example in which the recess 24 has the shape of a truncated rectangular pyramid and is generally square in cross section in the z direction. In the embodiment shown in FIG. 68, the two diagonal lines of the generally square cross section of the recess 24 described above extend along the x direction and the y direction, respectively. Note however that the recess 24 may be formed such that the sides of the generally square cross section described above extend in parallel to the sides of the terahertz element 1, respectively. FIG. 69 shows an example in which the recess 24 has the shape of a truncated rectangular pyramid and is generally in the form of an elongated rectangle in cross section in the z direction. In the embodiment shown in FIG. 69, the longer sides of the elongated rectangle of the cross section of the recess 24 extend along the y direction. Note however that the recess 24 may be formed such that the longer sides of the elongated rectangle of the cross section extend along the x direction.

In each terahertz device F1 shown in FIGS. 68 and 69 again, the recess 24 and the metal film 65 function as a horn antenna, as with the terahertz device F1. In this way, the terahertz device A1 has a packaging structure that allows for modularization of the terahertz element 1 while integrating a horn antenna. Note that the embodiment shown in FIG. 68, in which the recess 24 functions as a horn antenna called diagonal horn, is applicable to a multi-mode. On the other hand, in the embodiment shown in FIG. 69, the recess 24 has the shape of an elongated rectangle, so that vibration in normal mode $TE_{01}$ occurs.

Figure 70:
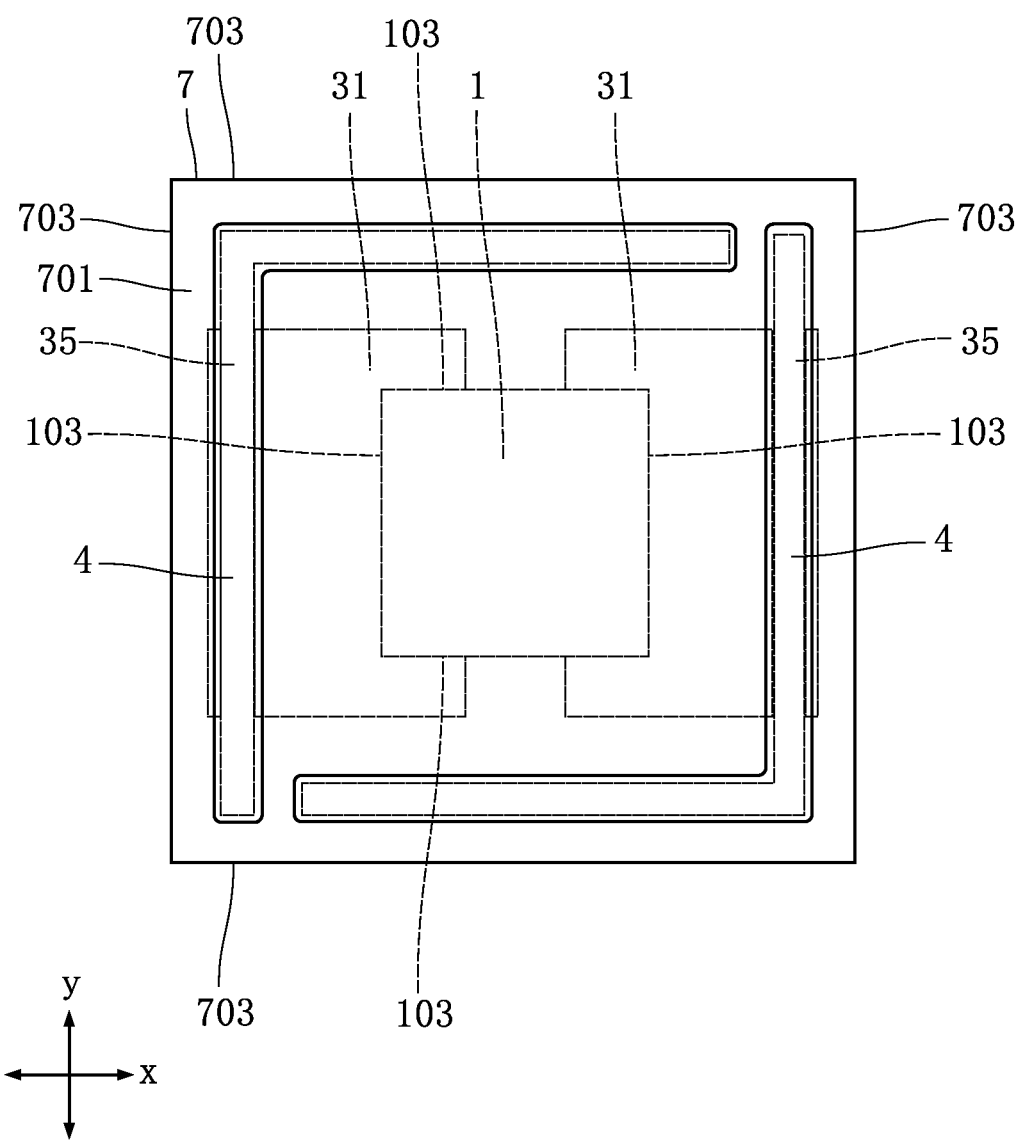
FIG. 70 is a plan view showing a different embodiment of through electrodes according to the sixth embodiment.
Figure 71:
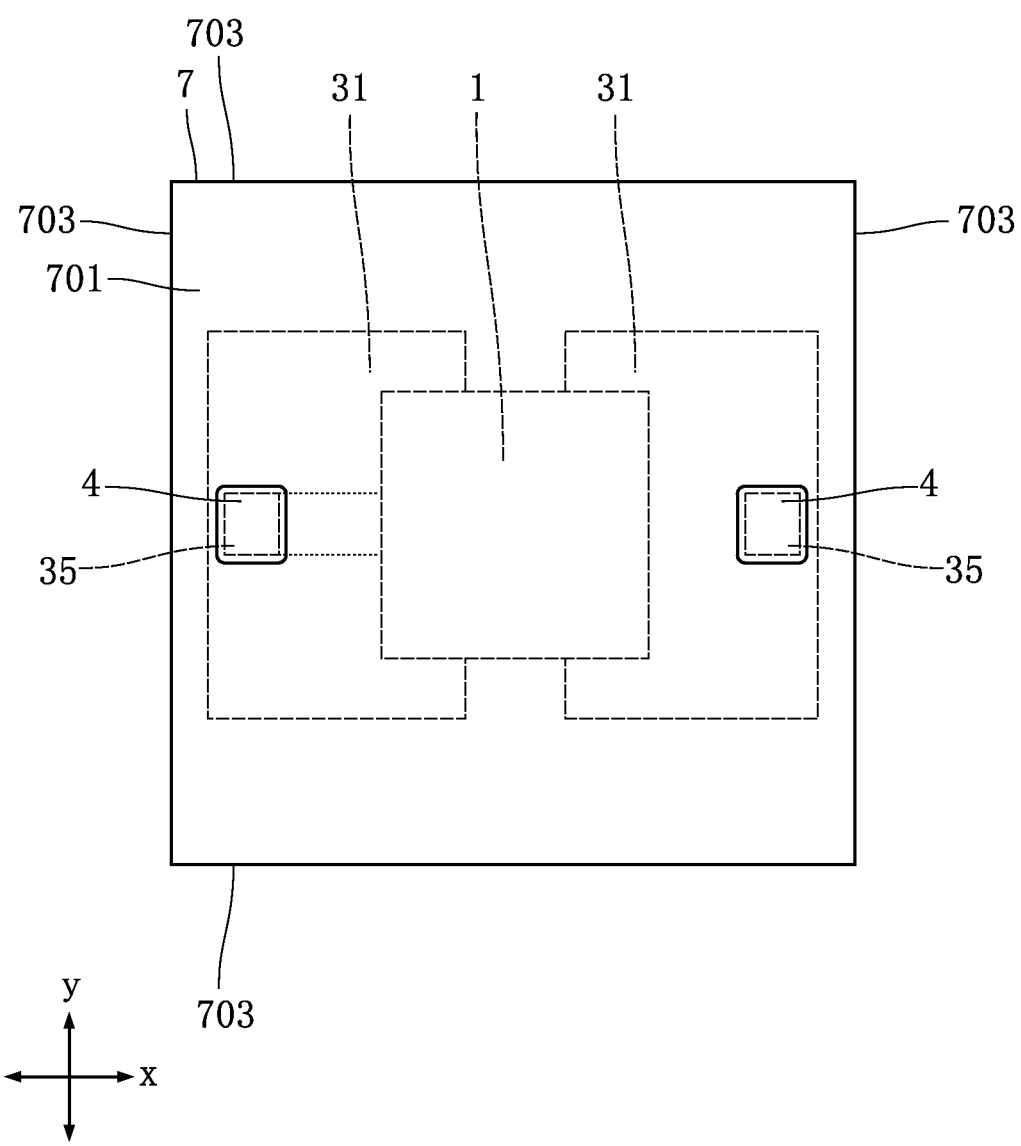
FIG. 71 is a plan view showing a different embodiment of the through electrodes according to the sixth embodiment.

The shape of the through electrodes 35 as viewed in plan in the sixth embodiment is not limited to that shown in FIG. 62. FIGS. 70 and 71 show other embodiments of the through electrodes 35 that can be incorporated in the terahertz device F1 according to the sixth embodiment. FIGS. 70 and 71 are both plan views showing the terahertz device F1 according to such variations. Note that the shapes of the through electrodes 35 shown in these figures are merely examples.

In the terahertz device F1 shown in FIG. 70, the through electrodes 35 are formed so as to surround the terahertz element 1. More specifically, two L-shaped through electrodes 35 are arranged with a space therebetween so that the terahertz element 1 is not completely surrounded. In the terahertz device F1 shown in FIG. 70, the through electrodes 35 are configured similarly to a frame-shaped member 6 with slits 69. Accordingly, the through electrodes 35 function as an electromagnetic shield, so that problems such as disturbance noise or crosstalk are reduced. Also, terahertz waves are reflected by the through electrodes 35 to produce resonance, so that noise reduction and gain improvement of the terahertz waves from the terahertz device F1 is achieved.

In the terahertz device F1 shown in FIG. 71, each through electrode 35 is columnar. Each through electrode 35 is smaller than the terahertz element 1 as viewed in the x direction, and opposite edges in the y direction overlap with the terahertz element 1 as viewed in the x direction.

In each terahertz device F1 shown in FIGS. 70 and 71, the external electrodes 4 have a shape adapted for the shape in plan view of the second end surfaces 352 of the through electrodes 35.

Figure 72:
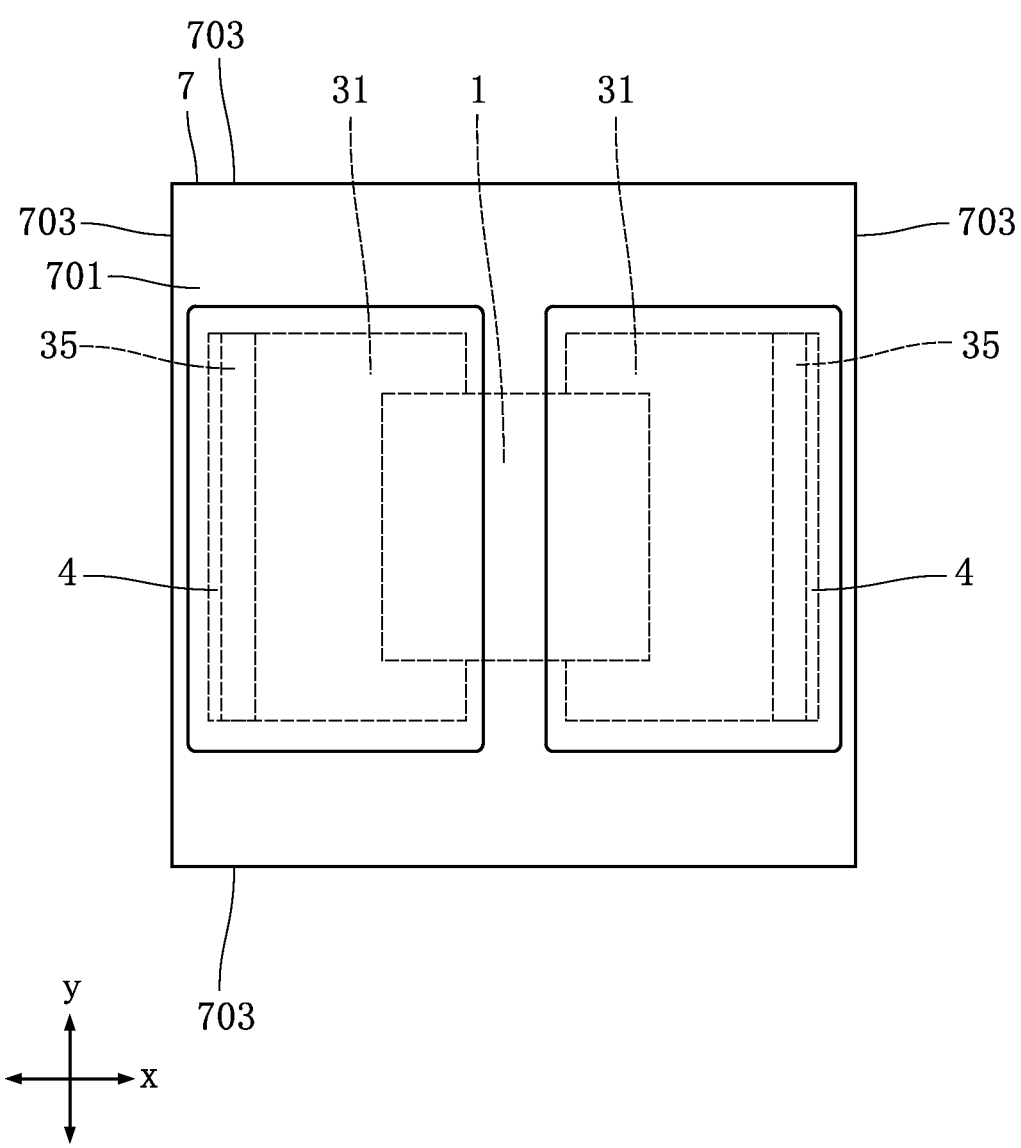
FIG. 72 is a plan view showing a different embodiment of external electrodes according to the sixth embodiment.
Figure 73:
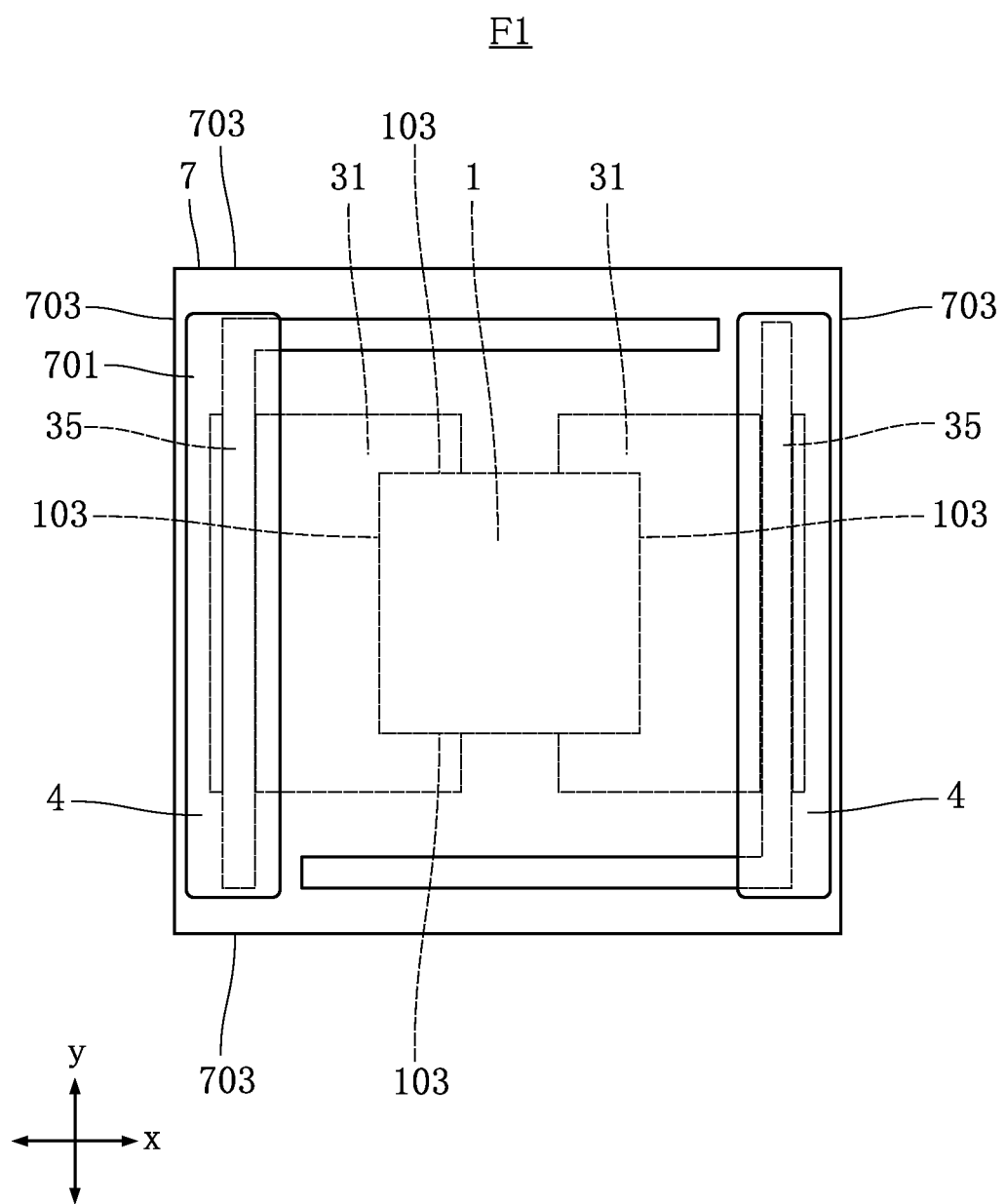
FIG. 73 is a plan view showing a different embodiment of the external electrodes according to the sixth embodiment.
Figure 74:
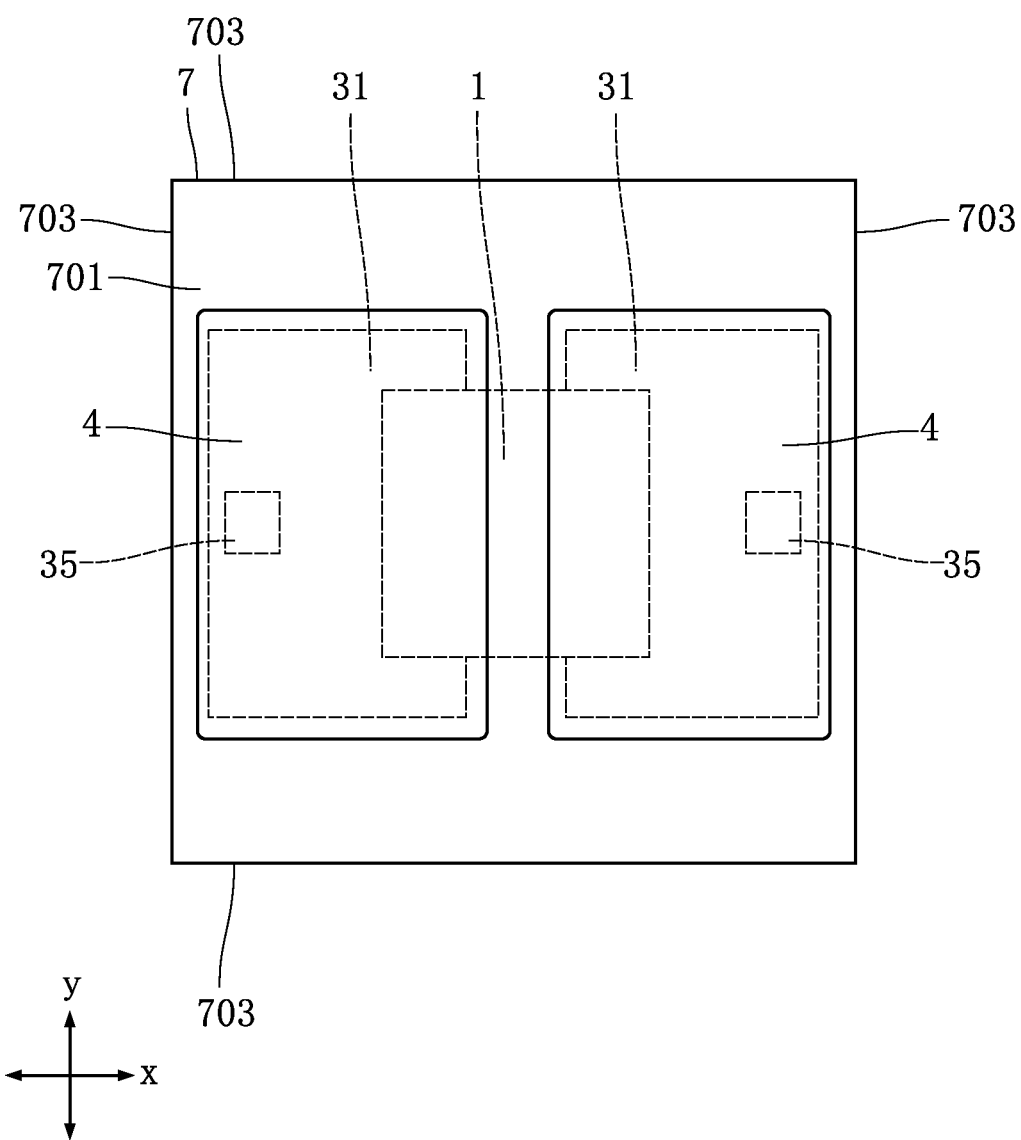
FIG. 74 is a plan view showing a different embodiment of the through electrodes according to the sixth embodiment.

In the sixth embodiment, the formation area of the external electrodes 4 is not limited to the area shown in FIG. 62. FIGS. 72-74 show other embodiments of the external electrodes 4 that can be incorporated in the terahertz device F1 according to the sixth embodiment. Note that the formation areas of the external electrodes 4 shown in these figures are merely examples.

FIG. 72 is a plan view of the terahertz device F1 in an example in which the formation area of the external electrodes 4 is changed from that in the terahertz device F1 shown in FIG. 62. FIG. 73 is a plan view of the terahertz device F1 in an example in which the formation area of the external electrodes 4 is changed from that in the terahertz device F1 shown in FIG. 70. FIG. 74 is a plan view of the terahertz device F1 in an example in which the formation area of the external electrodes 4 is changed from that in the terahertz device F1 shown in FIG. 71.

In each of the embodiments shown in FIGS. 72-74, each external electrode 4 is formed to continuously extend over the second end surface 352 of a through electrode 35 and the resin front surface 701 of the sealing resin 7. Note that, in the terahertz device F1 shown in FIG. 73, part of the second end surface 352 of each through electrode 35 is exposed from the sealing resin 7. Thus, an insulating protective film may be formed at least on the part of the second end surface 352 that is exposed from the sealing resin 7 to prevent undesired short circuit.

The arrangement of the terahertz device F1 shown in FIG. 72 can make the area of the external electrodes 4 as viewed in plan larger than that in the terahertz device F1 shown in FIG. 62. Similarly, the arrangement of the terahertz device F1 shown in FIG. 73 can make the area of the external electrodes 4 as viewed in plan larger than that in the terahertz device F1 shown in FIG. 70, and the arrangement of the terahertz device F1 shown in FIG. 74 can make the area of the external electrodes 4 as viewed in plan larger than that in the terahertz device F1 shown in FIG. 71. Thus, the terahertz devices F1 shown in FIGS. 72-74, in which the area of the external electrodes 4 that can be used for mounting on e.g. a circuit board is increased, can provide improved bonding strength or conduction efficiency with the circuit board.

In each terahertz device F1 shown in FIGS. 72 and 74, the external electrodes 4 overlap with part of the terahertz element 1 as viewed in plan. With such an arrangement, the external electrodes 4 function as an electromagnetic shield that reflect the electromagnetic waves from the upper side in the z direction. Thus, the terahertz devices F1 shown in FIGS. 72 and 74 reduce problems such as disturbance noise or crosstalk.

Figure 75:
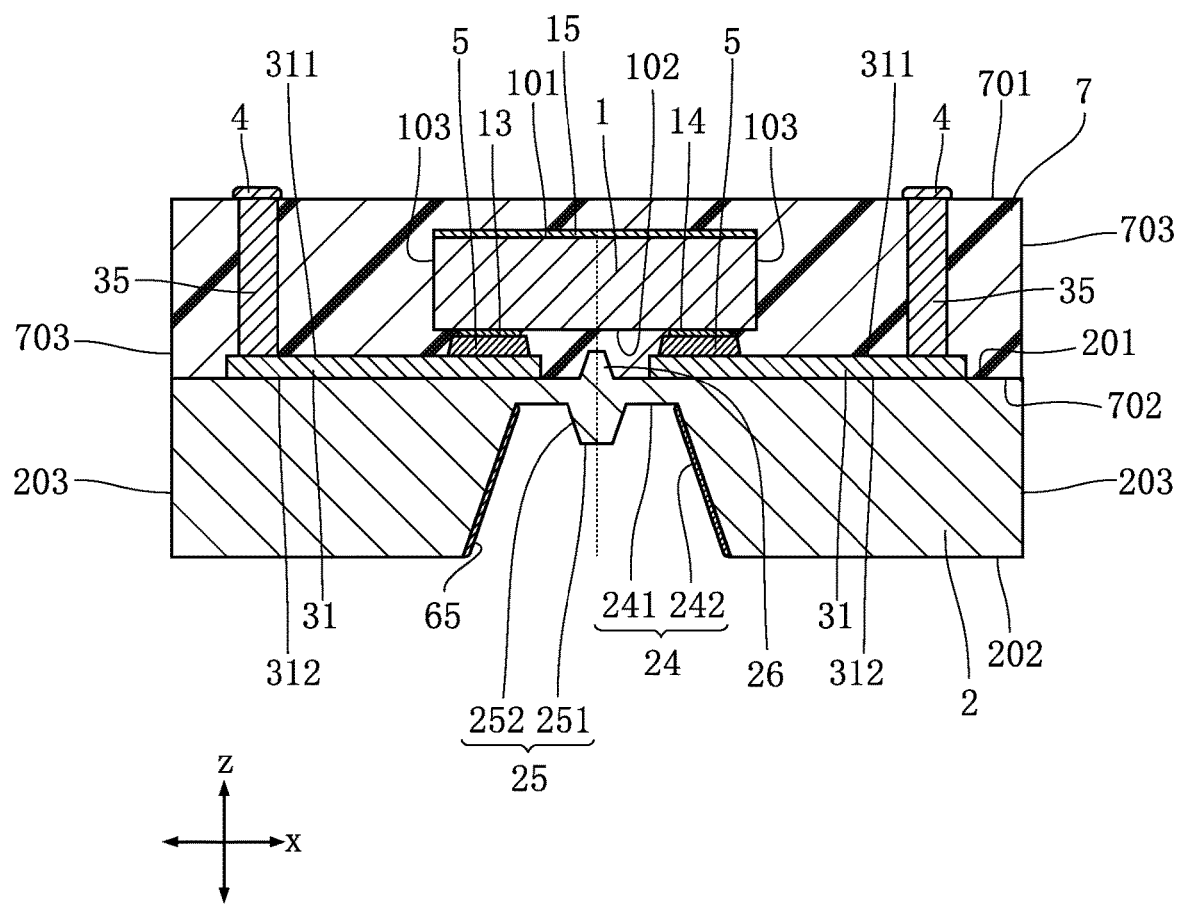
FIG. 75 is a sectional view of a terahertz device according to a first variation of the sixth embodiment.

FIG. 75 shows a terahertz device F2 according to a first variation of the sixth embodiment. FIG. 75 is a sectional view of the terahertz device F2. The sectional view shown in FIG. 75 corresponds to the section shown in FIG. 66. The terahertz device F2 differs from the terahertz device F1 in shape of the support board 2.

As compared with the support board 2 of the terahertz device F1, the support board 2 of the terahertz device F2 additionally includes two raised parts 25 and 26.

The raised part 25 rises from the bottom surface 241 of the recess 24 in the z direction. The raised part 25 has the shape of a truncated cone. The shape of the raised part 25 is not limited to a truncated cone and may be a truncated pyramid, a cone or a pyramid, for example. Also, the raised part 25 may have the shape of a column or a prism. As viewed in plan, the center of the raised part 25 overlaps with the center of the bottom surface 241. Also, as viewed in plan, the functional part of the terahertz element 1 (radiation point of terahertz waves) overlaps with the center of the raised part 25. Note however that the functional part of the terahertz element 1 may not overlap with the raised part 25 at its center, but overlap with the raised part 25 at any other location. Because of the presence of the raised part 25, the bottom surface 241 has the shape of a circular ring as viewed in plan. The raised part 25 has a top surface 251 and a connecting surface 252.

The top surface 251 is orthogonal to the z direction. The top surface 251 is flat. The top surface 251 faces downward in the z direction. The top surface 251 is generally circular as viewed in plan. When the raised part 25 has the shape of a truncated pyramid, the top surface 251 is polygonal as viewed in plan. As viewed in plan, the area of the top surface 251 is smaller than that of the bottom surface 241.

The connecting surface 252 is connected to the bottom surface 241 and the top surface 251. The connecting surface 252 is connected to the bottom surface 241 at one edge in the z direction (upper edge in FIG. 75) and connected to the top surface 251 at the other edge in the z direction (lower edge in FIG. 75). The connecting surface 252 is inclined with respect to the bottom surface 241. The inclination angle is 54.7±0.5°. With such a connecting surface 252, the raised part 25 is tapered. Because of such tapering, the cross section orthogonal to the z direction of the raised part 25 becomes smaller as progressing from the upper side toward the lower side in the z direction.

The raised part 26 rises from the support-board front surface 201 in the z direction. The shape of the raised part 26 may be any of a truncated cone, a truncated pyramid, a cone and a pyramid. Thus, the raised part 26 is tapered. Because of such tapering, the cross section orthogonal to the z direction of the raised part 26 becomes smaller as progressing from the lower side toward the upper side in the z direction. The raised part 26 overlaps with the terahertz element 1 as viewed in plan. The raised part 26 is formed below the terahertz element 1 in the z direction. The raised part 26 is covered with the sealing resin 7. As viewed in plan, the center of the raised part 26 overlaps with both the center of the raised part 25 and the center of the bottom surface 241. Also, as viewed in plan, the functional part of the terahertz element 1 (radiation point of terahertz waves) overlaps with the center of the raised part 26.

The terahertz device F2 provides the same advantages as those of the terahertz device F1.

In the terahertz device F2, the support board 2 has the raised part 25 rising from the bottom surface 241 of the recess 24. The raised part 25 includes the top surface 251 and the connecting surface 252. The connecting surface 252 is inclined with respect to the bottom surface 241. Thus, the raised part 26 is tapered. With such an arrangement, the area of the surfaces in the recess 24 that are orthogonal to the z direction (hereinafter referred to as "first orthogonal surfaces") is smaller, as compared with the terahertz device F1. In the terahertz device F2, the first orthogonal surfaces are the bottom surface 241 and the top surface 251. Phenomenon such as refraction or reflection occurs when terahertz waves become incident on the interface between two substances with different dielectric constants. Thus, the terahertz waves traveling downward in the z direction are reflected vertically at the first orthogonal surfaces described above. Since the area of the first orthogonal surfaces is made smaller, the vertical reflection by the first orthogonal surface is reduced. Thus, the terahertz device F2 improves the gain of the terahertz waves emitted downward in the z direction.

In the terahertz device F2, the support board 2 has the raised part 26. The raised part 26 rises from the support-board front surface 201 of the support board 2. The raised part 26 is tapered, as with the raised part 25. With such an arrangement, the area of the surface of the support board 2 that is orthogonal to the z direction (hereinafter referred to as "second orthogonal surface") is smaller, as compared with the terahertz device F1. In the terahertz device F2, the second orthogonal surface is the support-board front surface 201. Since the area of the second orthogonal surface is made smaller, the vertical reflection by the second orthogonal surface is reduced. Thus, the terahertz device F2 improves the gain of the terahertz waves emitted downward in the z direction.

Figure 76:
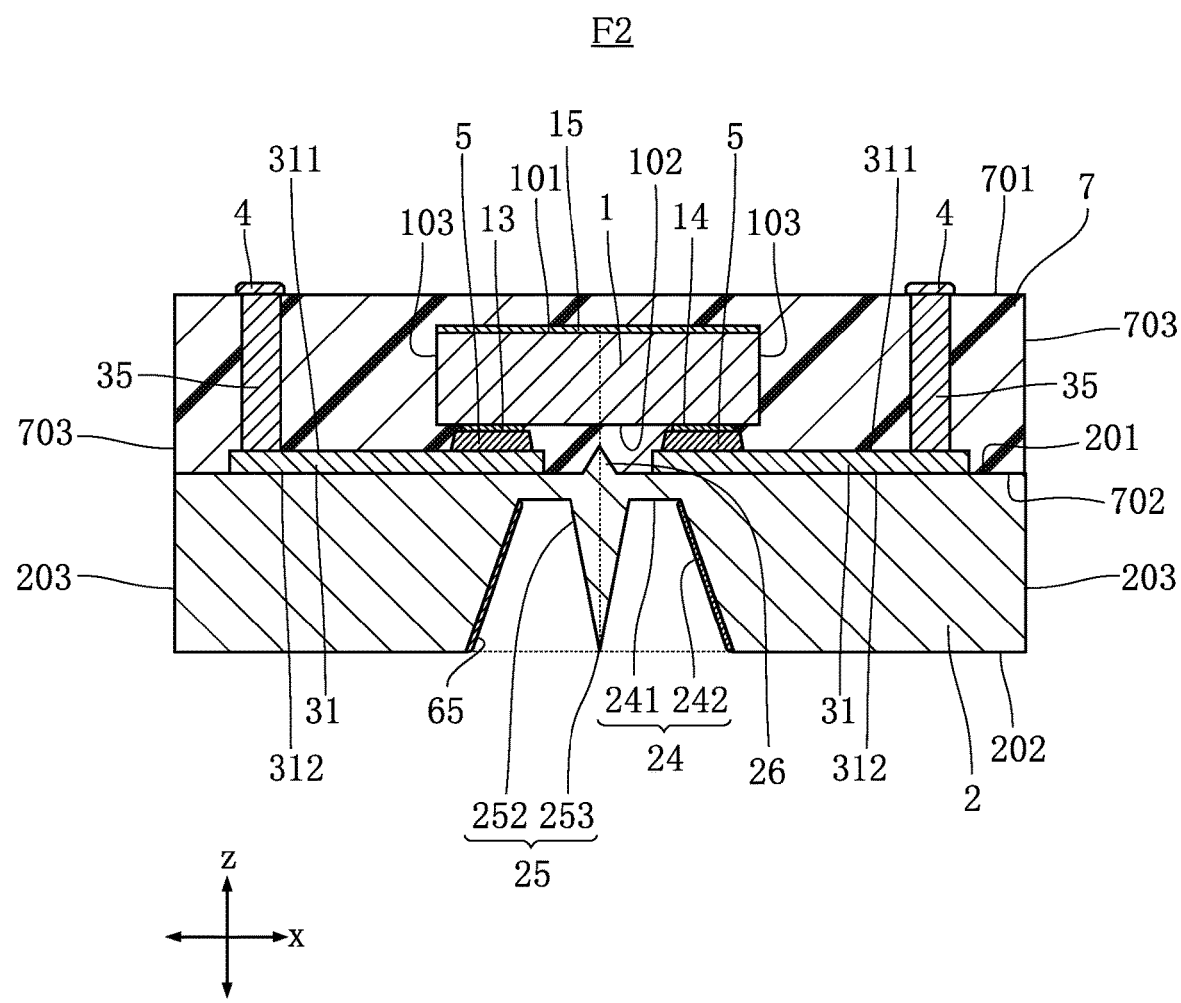
FIG. 76 is a sectional view showing another example of the terahertz device according to the first variation of the sixth embodiment.

In the terahertz device F2, the shape of the raised part 25 and the raised part 26 is not limited to that shown in FIG. 75. FIG. 76 shows another embodiment of the raised parts 25, 26 that can be incorporated in the terahertz device F2. Note that the shape of the raised parts 25 and 26 shown in FIG. 76 is merely an example.

FIG. 76 is a sectional view of the terahertz device F2 in which the raised parts 25 and 26 are both conical (or generally pyramidal). The sectional view shown in FIG. 76 corresponds to the section shown in FIG. 75.

In the terahertz device F2 shown in FIG. 76, the raised part 25 is conical. Thus, the raised part does not have the top surface 251 but has an apex 253. The apex 253 is the lower end of the raised part 25 in the z direction. The apex 253 is at the same position as the support-board back surface 202 in the z direction. Note however that the apex 253 may be at an upper position in the z direction than the support-board back surface 202. The inclination angle of the connecting surface 252 in FIG. 76 is larger than that of the connecting surface 252 in FIG. 75.

In the terahertz device F2 shown in FIG. 76, the raised part 26 has the shape of a cone. The raised part 26 has an apex 261.

In the terahertz device F2 shown in FIG. 76, the support board 2 has the raised part 25 and the raised part 26. Thus, the terahertz device improves the gain of the terahertz waves emitted downward in the z direction, as with the terahertz device F2 shown in FIG. 75.

In the terahertz device F2 shown in FIG. 76, the raised parts 25 and 26 are both conical. This makes the first and the second orthogonal surfaces described above further smaller as compared with those in the terahertz device F2 shown in FIG. 75. Thus, the gain of the terahertz waves emitted downward in the z direction is improved.

In the terahertz devices F2 shown in FIGS. 75 and 76, the support board 2 has both the raised part 25 and the raised part 26, but the present disclosure is not limited to such an arrangement. In the terahertz devices F2 shown in FIGS. 75 and 76, the support board 2 may include only one of the raised part 25 and the raised part 26.

In the terahertz devices F2 shown in FIGS. 75 and 76, the raised part 25 and the raised part 26 are formed on the support board 2, but the present disclosure is not limited to such an arrangement. For example, either one or both of the raised part 25 and the raised part 26 may be made as a separate part from the support board 2 and bonded to the support board 2.

Figure 77:
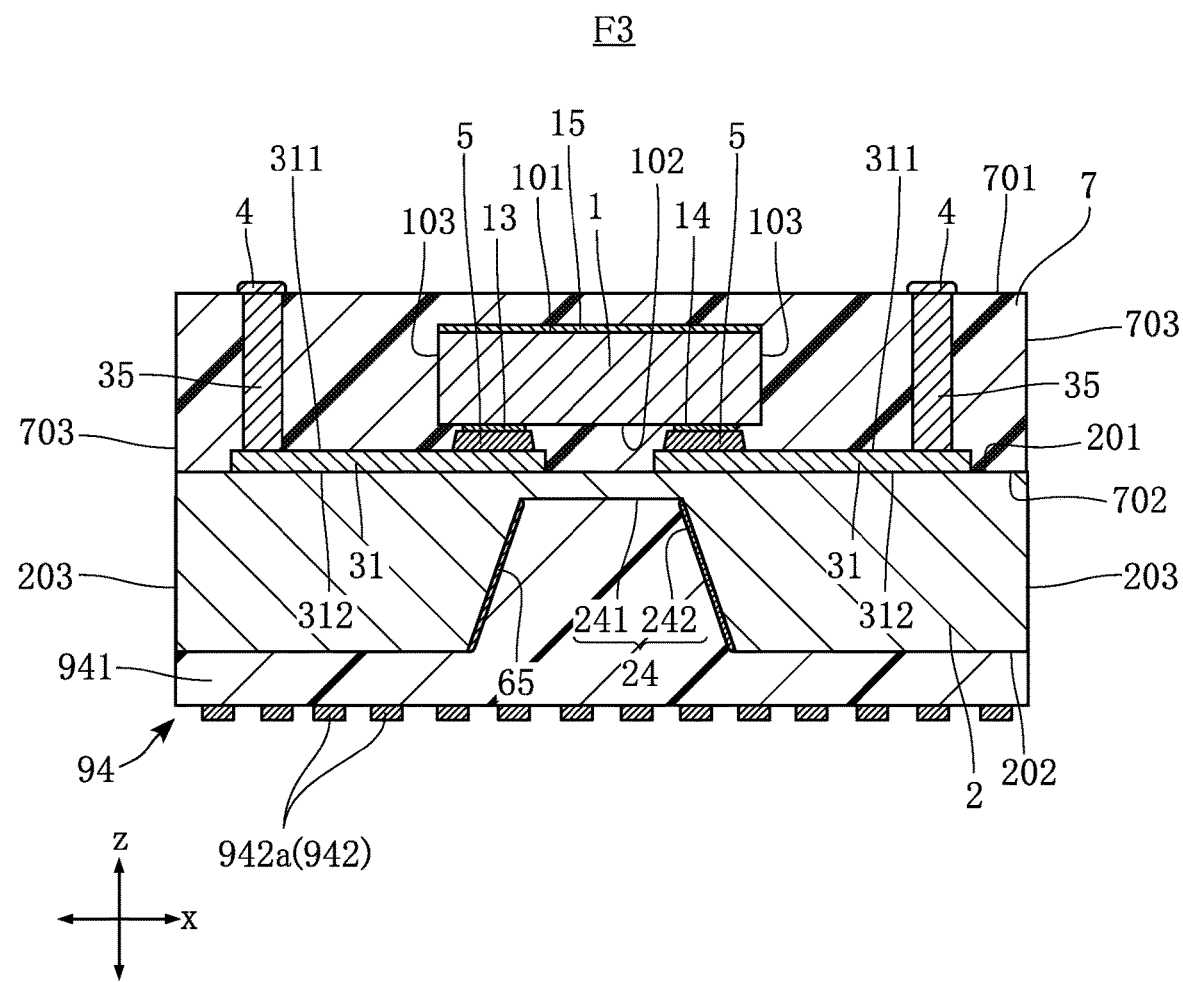
FIG. 77 is a sectional view of a terahertz device according to a second variation of the sixth embodiment.

FIG. 77 shows a terahertz device F3 according to a second variation of the sixth embodiment. FIG. 77 is a sectional view of the terahertz device F3. The sectional view shown in FIG. 77 corresponds to the section shown in FIG. 66. As compared with the terahertz device F1, the terahertz device F3 is additionally provided with an emission controlling member 94.

As with the emission controlling members 91-93 described above, the emission controlling member 94 performs polarization control, frequency control, directivity control, dispersion control or resonance control of the terahertz waves radiated from the terahertz element 1. As with the emission controlling member 91, the emission controlling member 94 is a metamaterial structure. The emission controlling member 94 includes a resin layer 941 and a patterned layer 942.

The resin layer 941 is formed so as to cover the support-board back surface 202 while filling the recess 24 of the support board 2. The resin layer 941 has an exposed surface 941a facing downward in the z direction. The exposed surfaces 941a is exposed to the outside of the terahertz device F3.

The patterned layer 942 is formed on the exposed surfaces 941a of the resin layer 941. The patterned layer 942 is configured similarly to the patterned layer 911 described above. The patterned layer 942 includes a plurality of metal segments 942a. As viewed in plan, the metal segments 942a, each of which is in the form of a strip extending in the y direction, are arranged side by side in the x direction. Thus, the patterned layer 942 is made up of a plurality of strip-shaped metal segments 942a arranged in the shape of a louver. The patterned layer 942 may be covered with a protective layer, as with the emission controlling member 91 described above. That is, the terahertz device F3 may be provided with the emission controlling member 91 instead of the emission controlling member 94.

The terahertz device F3 provides the same advantages as those of the terahertz device F1. Moreover, the terahertz device F3 is provided with the emission controlling member 94. Thus, the terahertz device F3 can control emission or reception of terahertz waves with the emission controlling member 94.

Figure 78:
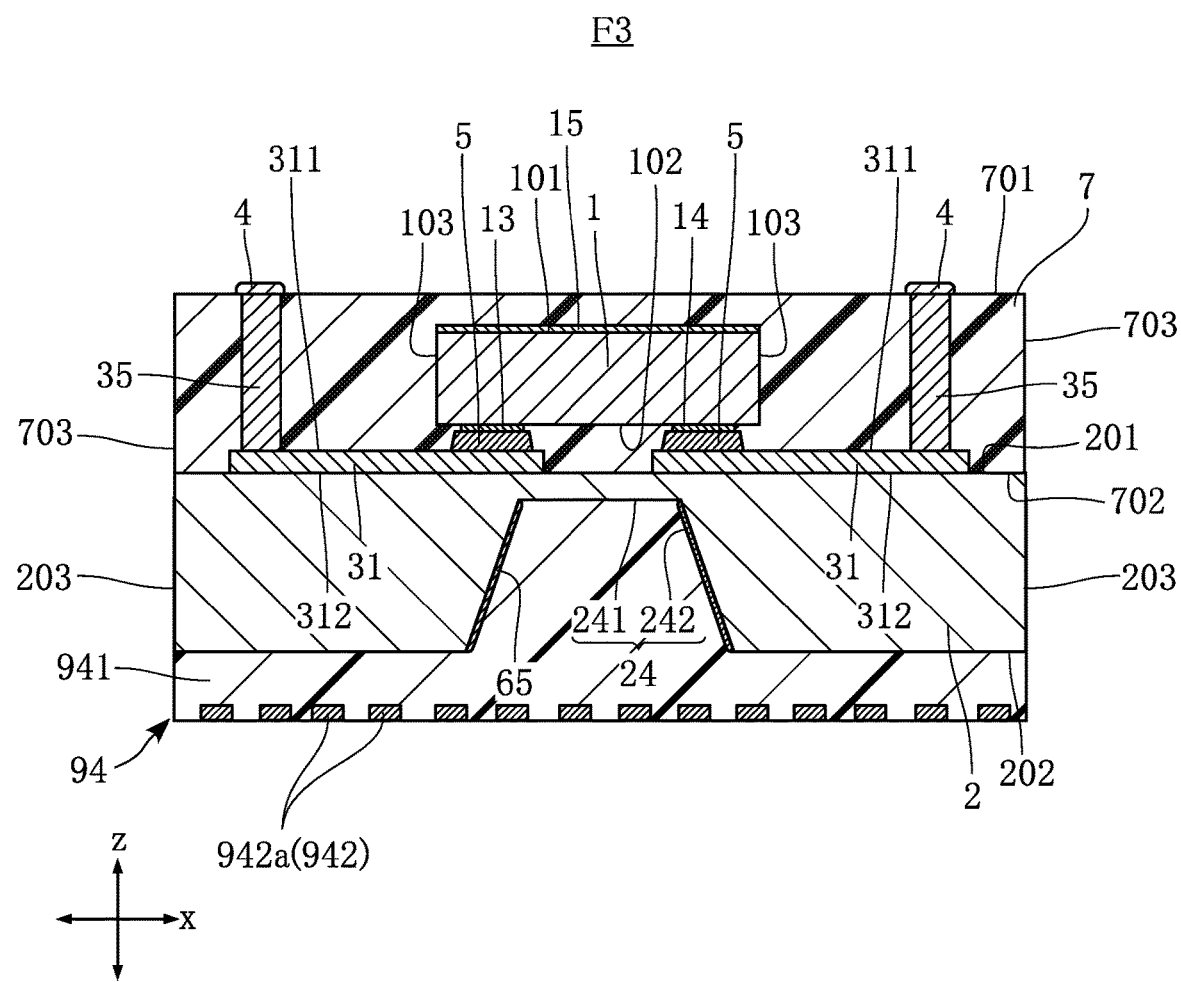
FIG. 78 is a sectional view showing another example of the terahertz device according to the second variation of the sixth embodiment.
Figure 79:
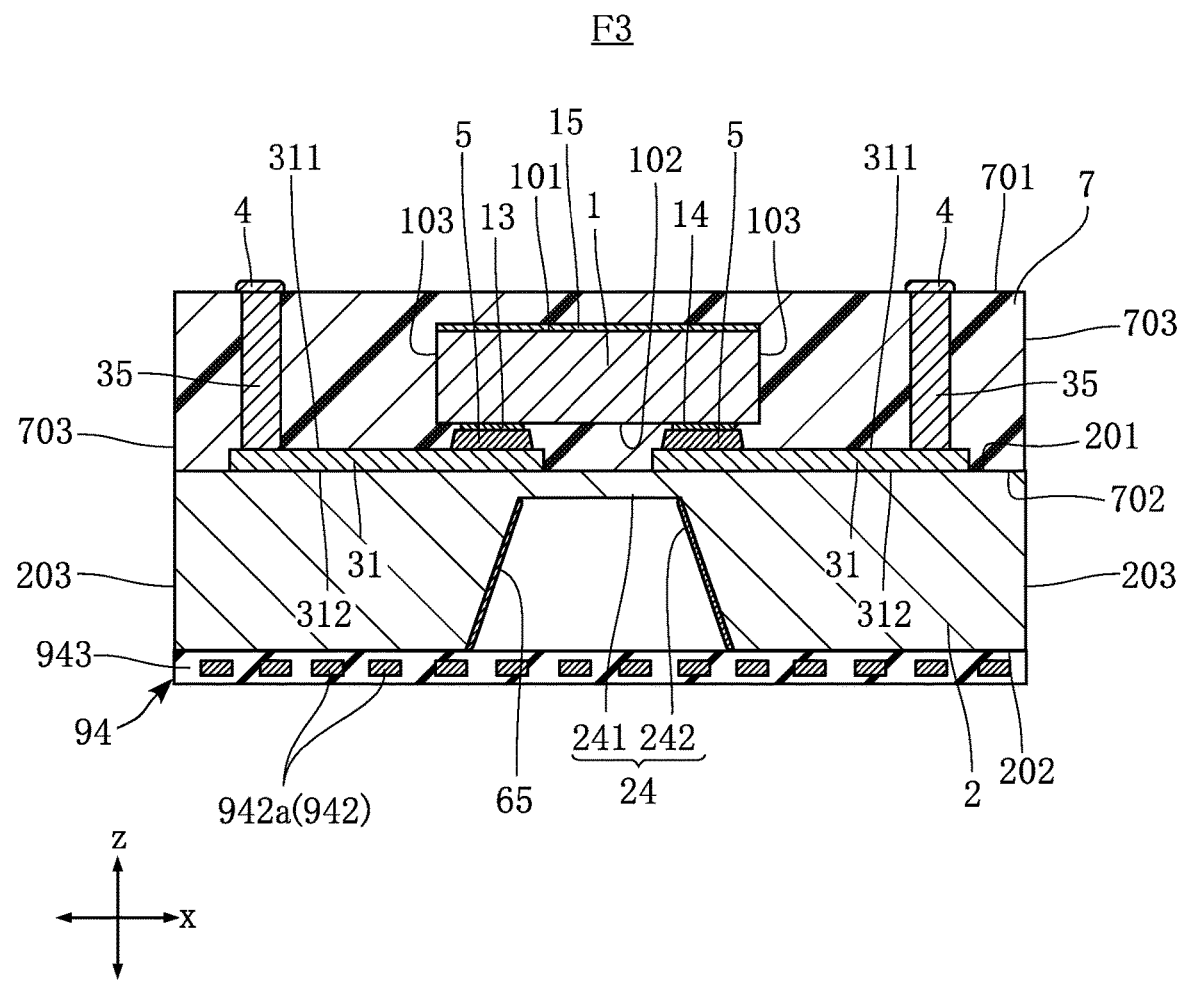
FIG. 79 is a sectional view showing another example of the terahertz device according to the second variation of the sixth embodiment.

In the second variation of the sixth embodiment, the configuration of the emission controlling member 94 is not limited to that shown in FIG. 77. FIGS. 78 and 79 show other embodiments of the emission controlling member 94 that can be incorporated in the terahertz device F3 according to the second variation of the sixth embodiment. FIGS. 78 and 79 are both sectional views showing the terahertz device F3 according to such variations. The sectional views shown in FIGS. 78 and 79 each correspond to the section shown in FIG. 66. Note that the configurations of the emission controlling member 94 shown in these figures are merely examples.

In the terahertz device F3 shown in FIG. 78, the patterned layer 942 is embedded in the resin layer 941. The patterned layer 942 is arranged in proximity to the exposed surfaces 941a of the resin layer 941 in the x direction. In FIG. 78, the surfaces facing downward in the z direction of the metal segments 942a of the patterned layer 942 are exposed from the exposed surfaces 941a of the resin layer 941, but these surfaces may be covered with the resin layer 941. That is, the patterned layer 942 may be completely embedded in the resin layer 941. FIG. 78 shows an example in which the emission controlling member 9 includes a single patterned layer 942. However, a plurality of patterned layers 942 may be laminated. In such a case, the plurality of patterned layers 942 are laminated in the z direction, with a resin layer 941 interposed between adjacent ones of the patterned layers 942. When the emission controlling member 9 includes a plurality of patterned layers 942, the patterned layer 942 at the lowest position in the z direction may be formed on the exposed surface 941a of the resin layer 941 or partially or entirely covered with the resin layer 941.

In the terahertz device F3 shown in FIG. 79, the emission controlling member 94 includes a dielectric layer 943 instead of the resin layer 941. The dielectric layer 943 covers the patterned layer 942. The dielectric layer 943 may be a dielectric sheet or a dielectric substrate. The material for the dielectric layer 943 is the same as that for the dielectric member 921 described before. The dielectric layer 943 is formed so as to cover the support-board back surface 202 while closing the opening of the recess 24. Thus, the recess 24 is hollow. FIG. 79 shows an example in which the emission controlling member 9 includes a single patterned layer 942. However, a plurality of patterned layers 942 may be laminated. In such a case, the plurality of patterned layers 942 are laminated in the z direction, with a dielectric layer 943 interposed between adjacent ones of the patterned layers 942.

The terahertz devices F3 shown in FIGS. 78 and 79 also provide the same advantages as those of the terahertz device F3 shown in FIG. 77.

FIGS. 77-79 show examples in which the emission controlling member 94 is the metamaterial structure similar to the emission controlling member 91 (see FIGS. 57 and 58), the present disclosure is not limited to this. Instead of the emission controlling members 94 shown in FIGS. 77 and 79, the terahertz device F3 may be provided with a photonic crystal structure similar to the emission controlling member 92 (see FIGS. 59 and 60) or a laminate of a plurality of thin films with different index of refraction similar to the emission controlling member 93 (see FIG. 61).

The terahertz device and the manufacturing method according to the present disclosure are not limited to the foregoing embodiments. The specific configuration of each part of the terahertz device and the specific process in each step of the method for manufacturing the terahertz device according to the present disclosure may be varied in design in many ways.

The terahertz device and the method for manufacturing the terahertz device according to the present disclosure include the embodiments related to the following clauses.

[Clause 1]

A terahertz device comprising:

a terahertz element configured to perform conversion between terahertz waves and electric energy and having an element front surface and an element back surface spaced apart from each other in a first direction;

a sealing resin covering the terahertz element;

a wiring layer electrically connected to the terahertz element; and a frame-shaped member made of a conductive material and arranged around the terahertz element as viewed in the first direction, wherein the frame-shaped member has a reflective surface capable of reflecting the terahertz waves.

[Clause 2]

The terahertz device according to clause 1, wherein the terahertz element further includes an element side surface located between and connected to the element front surface and the element back surface, and part of the sealing resin is interposed between the element side surface and the frame-shaped member.

[Clause 3]

The terahertz device according to clause 2, wherein the frame-shaped member is spaced apart from the wiring layer.

[Clause 4]
The terahertz device according to clause 3, wherein the frame-shaped member has a shape of a ring surrounding the terahertz element as viewed in the first direction.

[Clause 5]
The terahertz device according to clause 4, wherein the frame-shaped member has an inner peripheral surface functioning as the reflective surface and an outer peripheral surface, and
the frame-shaped member is formed with a slit extending from the inner peripheral surface to the outer peripheral surface as viewed in the first direction.

[Clause 6]
The terahertz device according to clause 5, wherein the frame-shaped member includes a plurality of metal pieces separated from each other by the slit as viewed in the first direction, and
a sum of lengths of the metal pieces in respective longitudinal directions is smaller than a sum of respective distances between two adjacent ones of the metal pieces flanking the slit.

[Clause 7]
The terahertz device according to any of clauses 1-6, further comprising a support board supporting the terahertz element, the support board having a support-board front surface facing the element back surface and a support-board back surface facing away from the support-board front surface.

[Clause 8]
The terahertz device according to clause 7, further comprising an external electrode electrically connected to the wiring layer and exposed from the sealing resin.

[Clause 9]
The terahertz device according to clause 8, further comprising a through electrode penetrating the support board and electrically connecting the wiring layer and the external electrode.

[Clause 10]
The terahertz device according to clause 9, wherein the support board is formed with a through-hole extending from the support-board front surface to the support-board back surface, and
the through electrode fills the through-hole.

[Clause 11]
The terahertz device according to any of clauses 7-10, wherein the wiring layer is formed on the support board, and
the terahertz device further comprises a bonding layer interposed between the terahertz element and the wiring layer, the bonding layer electrically connecting and bonding the terahertz element and the wiring layer.

[Clause 12]
The terahertz device according to any of clauses 7-11, wherein the frame-shaped member stands on the support-board front surface.

[Clause 13]
The terahertz device according to clause 12, wherein the element front surface overlaps with the frame-shaped member as viewed in a second direction orthogonal to the first direction.

[Clause 14]
The terahertz device according to any of clauses 1-13, further comprising a semiconductor element different from the terahertz element,
wherein the frame-shaped member surrounds the terahertz element and the semiconductor element as viewed in the first direction.

[Clause 15]
The terahertz device according to any of clauses 1-13, further comprising a semiconductor element different from the terahertz element,
wherein the semiconductor element is arranged outside the frame-shaped member as viewed in the first direction.

[Clause 16]
The terahertz device according to any of clauses 1-15, further comprising an emission controlling member that controls emission of the terahertz waves, the emission controlling member overlapping the element front surface as viewed in the first direction.

[Clause 17]
The terahertz device according to any of clauses 1-16, wherein the sealing resin has a resin front surface facing in a direction in which the element front surface faces and a resin back surface facing away from the resin front surface in the first direction,
the resin front surface is rougher than the resin back surface.

[Clause 18]
The terahertz device according to any of clauses 1-17, wherein the element front surface is exposed from the sealing resin.

[Clause 19]
A method for manufacturing a terahertz device comprising a terahertz element configured to perform conversion between terahertz waves and electric energy and having an element front surface and an element back surface spaced apart from each other in a first direction, the method comprising:
  a support board preparation step for preparing a support board having a support-board front surface and a support-board back surface facing away from each other in the first direction;
  a frame-shaped member forming step for forming a frame-shaped member from a conductive material on the support board;
  a wiring layer forming step for forming a wiring layer electrically connected to the terahertz element;
  an element mounting step for mounting the terahertz element on the support board such that the frame-shaped member is positioned around the terahertz element as viewed in the first direction;
  a sealing resin forming step for forming a sealing resin covering the terahertz element; and
  a grinding step for grinding the support board,
  wherein the frame-shaped member has a reflective surface capable of reflecting the terahertz waves.

[Clause 20]
The method for manufacturing a terahertz device according to clause 19, further comprising:
  an external electrode forming step for forming an external electrode electrically connected to the wiring layer; and
  a through electrode forming step for forming a through electrode extending through the support board and electrically connecting the wiring layer and the external electrode,
  wherein the wiring layer forming step comprises forming the wiring layer on the support-board front surface,
  the grinding step comprises grinding the support board from the support-board back surface until the through electrode is exposed from the support-board back surface, and
  the external electrode forming step comprises forming the external electrode on a surface of the through electrode that is exposed from the support-board back surface.

The invention claimed is:

1. A terahertz device comprising:
a terahertz element configured to perform conversion between terahertz waves and electric energy and having an element front surface and an element back surface spaced apart from each other in a first direction;
a sealing resin covering the terahertz element;
a wiring layer electrically connected to the terahertz element; and
a frame-shaped member made of a conductive material and arranged around the terahertz element as viewed in the first direction,
wherein the frame-shaped member has a reflective surface capable of reflecting the terahertz waves.

2. The terahertz device according to claim 1, wherein the terahertz element further includes an element side surface located between and connected to the element front surface and the element back surface, and
part of the sealing resin is interposed between the element side surface and the frame-shaped member.

3. The terahertz device according to claim 2, wherein the frame-shaped member is spaced apart from the wiring layer.

4. The terahertz device according to claim 3, wherein the frame-shaped member has a shape of a ring surrounding the terahertz element as viewed in the first direction.

5. The terahertz device according to claim 4, wherein the frame-shaped member has an inner peripheral surface functioning as the reflective surface and an outer peripheral surface, and
the frame-shaped member is formed with a slit extending from the inner peripheral surface to the outer peripheral surface as viewed in the first direction.

6. The terahertz device according to claim 5, wherein the frame-shaped member includes a plurality of metal pieces separated from each other by the slit as viewed in the first direction, and
a sum of lengths of the metal pieces in respective longitudinal directions is smaller than a sum of respective distances between two adjacent ones of the metal pieces flanking the slit.

7. The terahertz device according to claim 1, further comprising a support board supporting the terahertz element, the support board having a support-board front surface facing the element back surface and a support-board back surface facing away from the support-board front surface.

8. The terahertz device according to claim 7, further comprising an external electrode electrically connected to the wiring layer and exposed from the sealing resin.

9. The terahertz device according to claim 8, further comprising a through electrode penetrating the support board and electrically connecting the wiring layer and the external electrode.

10. The terahertz device according to claim 9, wherein the support board is formed with a through-hole extending from the support-board front surface to the support-board back surface, and
the through electrode fills the through-hole.

11. The terahertz device according to claim 7, wherein the wiring layer is formed on the support board, and
the terahertz device further comprises a bonding layer interposed between the terahertz element and the wiring layer, the bonding layer electrically connecting and bonding the terahertz element and the wiring layer.

12. The terahertz device according to claim 7, wherein the frame-shaped member stands on the support-board front surface.

13. The terahertz device according to claim 12, wherein the element front surface overlaps with the frame-shaped member as viewed in a second direction orthogonal to the first direction.

14. The terahertz device according to claim 1, further comprising a semiconductor element different from the terahertz element,
wherein the frame-shaped member surrounds the terahertz element and the semiconductor element as viewed in the first direction.

15. The terahertz device according to claim 1, further comprising a semiconductor element different from the terahertz element,
wherein the semiconductor element is arranged outside the frame-shaped member as viewed in the first direction.

16. The terahertz device according to claim 1, further comprising an emission controlling member that controls emission of the terahertz waves, the emission controlling member overlapping the element front surface as viewed in the first direction.

17. The terahertz device according to claim 1, wherein the sealing resin has a resin front surface facing in a direction in which the element front surface faces and a resin back surface facing away from the resin front surface in the first direction,
the resin front surface is rougher than the resin back surface.

18. The terahertz device according to claim 1, wherein the element front surface is exposed from the sealing resin.

19. A method for manufacturing a terahertz device comprising a terahertz element configured to perform conversion between terahertz waves and electric energy and having an element front surface and an element back surface spaced apart from each other in a first direction, the method comprising:
a support board preparation step for preparing a support board having a support-board front surface and a support-board back surface facing away from each other in the first direction;
a frame-shaped member forming step for forming a frame-shaped member from a conductive material on the support board;
a wiring layer forming step for forming a wiring layer electrically connected to the terahertz element;
an element mounting step for mounting the terahertz element on the support board such that the frame-shaped member is positioned around the terahertz element as viewed in the first direction;
a sealing resin forming step for forming a sealing resin covering the terahertz element; and
a grinding step for grinding the support board,
wherein the frame-shaped member has a reflective surface capable of reflecting the terahertz waves.

20. The method for manufacturing a terahertz device according to claim 19, further comprising:
an external electrode forming step for forming an external electrode electrically connected to the wiring layer; and
a through electrode forming step for forming a through electrode extending through the support board and electrically connecting the wiring layer and the external electrode,
wherein the wiring layer forming step comprises forming the wiring layer on the support-board front surface, the grinding step comprises grinding the support board from the support-board back surface until the through electrode is exposed from the support-board back surface, and the external electrode forming step comprises forming the external electrode on a surface of the through electrode that is exposed from the support-board back surface.

\* \* \* \* \*